(12) United States Patent
Yamanaka et al.

(10) Patent No.: US 10,705,428 B2
(45) Date of Patent: Jul. 7, 2020

(54) ORGANIC PROCESSING LIQUID FOR PATTERNING CHEMICAL AMPLIFICATION RESIST FILM, CONTAINER FOR ORGANIC PROCESSING LIQUID FOR PATTERNING CHEMICAL AMPLIFICATION RESIST FILM, AND PATTERN FORMING METHOD, METHOD OF MANUFACTURING ELECTRONIC DEVICE, AND ELECTRONIC DEVICE USING THE SAME

(71) Applicant: FUJIFILM Corporation, Tokyo (JP)

(72) Inventors: Tsukasa Yamanaka, Shizuoka (JP); Takashi Kawamoto, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 14 days.

(21) Appl. No.: 14/697,942

(22) Filed: Apr. 28, 2015

(65) Prior Publication Data

US 2015/0227049 A1 Aug. 13, 2015

Related U.S. Application Data

(63) Continuation of application No. PCT/JP2013/078211, filed on Oct. 17, 2013.

(30) Foreign Application Priority Data

Oct. 31, 2012 (JP) .................................. 2012-240752
Feb. 20, 2013 (JP) .................................. 2013-031277

(51) Int. Cl.
| | | |
|---|---|---|
| *G03F 7/32* | (2006.01) | |
| *B65D 25/14* | (2006.01) | |
| *B65D 85/00* | (2006.01) | |
| *G03F 7/20* | (2006.01) | |
| *G03F 7/039* | (2006.01) | |
| *G03F 7/038* | (2006.01) | |

(52) U.S. Cl.
CPC .............. *G03F 7/32* (2013.01); *B65D 25/14* (2013.01); *B65D 85/70* (2013.01); *G03F 7/325* (2013.01); *G03F 7/70* (2013.01); *G03F 7/038* (2013.01); *G03F 7/039* (2013.01)

(58) Field of Classification Search
CPC ......... G03F 7/32; G03F 7/325; C07C 45/786; B01D 61/14; B01D 71/32
See application file for complete search history.

(56) References Cited

U.S. PATENT DOCUMENTS

| 4,491,628 A | 1/1985 | Ito et al. |
|---|---|---|
| 4,741,989 A | 5/1988 | Niwa et al. |
| 5,102,010 A | 4/1992 | Osgar et al. |
| 5,625,433 A | 4/1997 | Inada et al. |
| 5,707,784 A | 1/1998 | Oikawa et al. |
| 6,237,809 B1 | 5/2001 | Kawai et al. |
| 6,610,638 B1 | 8/2003 | Tanigawa et al. |
| 8,371,469 B2 | 2/2013 | Takedutsumi et al. |
| 2002/0189756 A1* | 12/2002 | Boehme ................. B29C 33/40 156/345.11 |
| 2005/0223980 A1 | 10/2005 | Awamura et al. |
| 2006/0014098 A1* | 1/2006 | Hada ...................... B01D 61/58 430/270.1 |
| 2006/0040203 A1 | 2/2006 | Kodama et al. |
| 2006/0123798 A1* | 6/2006 | Yamamoto ............. F25B 21/02 62/3.3 |
| 2006/0124586 A1 | 6/2006 | Kobayashi et al. |
| 2006/0194982 A1 | 8/2006 | Harada et al. |
| 2007/0265590 A1 | 11/2007 | Sakaguchi |
| 2008/0187860 A1 | 8/2008 | Tsubaki et al. |
| 2008/0261150 A1 | 10/2008 | Tsubaki et al. |
| 2009/0075202 A1 | 3/2009 | Kodama et al. |
| 2009/0230132 A1 | 9/2009 | Takedutsumi et al. |
| 2009/0317752 A1 | 12/2009 | Kobayashi et al. |
| 2010/0190106 A1 | 7/2010 | Tsubaki et al. |
| 2010/0233629 A1 | 9/2010 | Wada |
| 2010/0323305 A1 | 12/2010 | Tsubaki et al. |
| 2011/0204344 A1 | 8/2011 | Kakimoto et al. |
| 2012/0003591 A1 | 1/2012 | Enomoto et al. |
| 2012/0028196 A1 | 2/2012 | Kamimura et al. |
| 2012/0052449 A1 | 3/2012 | Kato et al. |
| 2012/0058436 A1 | 3/2012 | Tsubaki et al. |
| 2012/0315449 A1 | 12/2012 | Tsubaki et al. |
| 2014/0127629 A1 | 5/2014 | Kato et al. |
| 2015/0079522 A1 | 3/2015 | Tsubaki et al. |

(Continued)

FOREIGN PATENT DOCUMENTS

| EP | 0124297 A2 | 11/1984 |
|---|---|---|
| EP | 1063245 A1 | 12/2000 |

(Continued)

OTHER PUBLICATIONS

Office Action dated Jun. 23, 2015 by the Japanese Patent Office, in counterpart Application No. 2014-187686.
Communication dated Jul. 7, 2016, issued by the Korean Intellectual Property Office in counterpart Korean application No. 10-2015-7010918.
ISR (PCT/ISA/210) issued Nov. 26, 2013, in related International Application No. PCT/JP2013/078211.
Written Opinion (PCT/ISA/237) dated Nov. 26, 2013, in related International Application No. PCT/JP2013/078211.

(Continued)

*Primary Examiner* — Daborah Chacko-Davis

(74) *Attorney, Agent, or Firm* — Sughrue Mion, PLLC

(57) ABSTRACT

According to an exemplary embodiment of the present invention, there are provided an organic treatment solution for patterning chemically amplified resist films, an organic treatment solution containing 1 ppm or less of an alkyl olefin having a carbon number of 22 or less and having a metal element concentration of 5 ppm or less for each of Na, K, Ca, Fe, Cu, Mg, Mn, Li, Al, Cr, Ni and Zn, a pattern formation method, an electronic device manufacturing method, and an electronic device use the same.

12 Claims, No Drawings

(56) References Cited

U.S. PATENT DOCUMENTS

| | | | |
|---|---|---|---|
| 2015/0227049 | A1 | 8/2015 | Yamanaka et al. |
| 2016/0103395 | A1 | 4/2016 | Tsubaki et al. |
| 2016/0349619 | A1 | 12/2016 | Tsubaki et al. |

FOREIGN PATENT DOCUMENTS

| | | | |
|---|---|---|---|
| JP | 59-021021 A | 2/1984 | |
| JP | 59-045439 A | 3/1984 | |
| JP | 59-182444 A | 10/1984 | |
| JP | 3-502677 A | 6/1991 | |
| JP | 06-099000 B2 | 12/1994 | |
| JP | 8-236435 A | 9/1996 | |
| JP | 11-090198 A | 4/1999 | |
| JP | 11-181584 A | 7/1999 | |
| JP | 2001-130632 A | 5/2001 | |
| JP | 2004-014844 A | 1/2004 | |
| JP | 2004-184648 A | 7/2004 | |
| JP | 2005-266766 A | 9/2005 | |
| JP | 2006-257078 A | 9/2006 | |
| JP | 2006-330098 A | 12/2006 | |
| JP | 3929000 B2 | 3/2007 | |
| JP | 2007-325915 A | 12/2007 | |
| JP | 2008-292975 A | 12/2008 | |
| JP | 2009-025708 A | 2/2009 | |
| JP | 2010-039146 A | 2/2010 | |
| JP | 2010-103105 A | 5/2010 | |
| JP | 2010-164958 A | 7/2010 | |
| JP | 2011-227463 A | 11/2011 | |
| JP | 2012-032788 A | 2/2012 | |
| JP | 2012-47896 A | 3/2012 | |
| JP | 2013-218308 A | 10/2013 | |
| KR | 10-0126246 B1 | 12/1997 | |
| TW | 200824987 A | 6/2008 | |
| TW | 201017722 A | 5/2010 | |
| WO | 89-07575 A1 | 8/1989 | |
| WO | 1999-046309 A1 | 9/1999 | |
| WO | 2000-017057 A1 | 3/2000 | |
| WO | 2000-58252 A1 | 10/2000 | |
| WO | 2004-016526 A1 | 2/2004 | |
| WO | 2008-153110 A1 | 12/2008 | |
| WO | 2014/069245 A1 | 5/2014 | |

OTHER PUBLICATIONS

Office Action dated Feb. 24, 2015, by the Japanese Patent Office, in related Application No. 2013/031277.
Office Action dated Oct. 7, 2014, by the Japanese Patent Office, in related Application No. 2013/031277.
Office Action dated Jul. 22, 2014, by the Japanese Patent Office, in related Application No. 2013/031277.
Sakurauchi, Yujiro; "Chapter 5: Plastic Chemicals"; Textbook of Plastic Materials; Kogyo Chosakai Publishing Co., Ltd., Tokyo; 1987; 6 pages total.
Communication dated May 25, 2016, from the European Patent Office in counterpart European Application No. 13851077.1.
Communication dated Nov. 17, 2015, issued by the Japanese Patent Office in counterpart Japanese Application No. 2014-187686.
Communication dated Feb. 7, 2017, issued by the Korean Intellectual Property Office in corresponding Korean Application No. 10-2017-7002798.
Communication dated Jan. 9, 2017, from the Intellectual Property Office of Taiwan in counterpart application No. 105139159.
Communication dated Jan. 26, 2017, issued by the State Intellectual Property Office of the People's Republic of China in counterpart Chinese Patent Application No. 201510490049.4.
Translation of Written Opinion dated Nov. 26, 2013 issued by the International Searching Authority in counterpart International Patent Application No. PCT/JP2013/078211 (PCT/ISA/237).
Office Action dated Sep. 5, 2016, by the State Intellectual Property Office of P.R. China in counterpart Chinese Application No. 201510490049.4.
Communication dated Jul. 22, 2016, issued by the Federal Service for Intellectual Property in counterpart Russian Patent Application No. 2015116536.
Communication dated May 16, 2016, issued by the State Intellectual Property Office of the People's Republic of China in counterpart Chinese Patent Application No. 201510490049.4.
Communication dated Dec. 5, 2016, issued by Intellectual Property Office of Singapore in counterpart Singaporean Patent Application No. 11201503388R.
Office Action dated Jun. 26, 2017, by the Korean Intellectual Property Office in counterpart Korean Application No. 10-2017-7002798.
Communication dated Oct. 19, 2017, issued by the Korean Intellectual Property Office in corresponding Korean Application No. 10-2017-7002798.
Office Action dated May 23, 2017, issued by the Japanese Patent Office in counterpart Japanese Application No. 2016-148305.
Office Action dated Dec. 26, 2017, by the Intellectual Property Office of Singapore in counterpart Singaporean Patent Application No. 11201503388R.
Office Action dated Oct. 17, 2017, from the State Intellectual Property Office of People's Republic of China in counterpart Chinese Application No. 201510490049.4.
Office Action dated Dec. 26, 2018, from the Intellectual Property Office of Singapore in corresponding Application No. 11201503388R.
Decision on Request for Reexamination dated Sep. 12, 2018, from the State Intellectual Property Office of People's Republic of China in counterpart Chinese Application No. 201510490049.4.
Office Action dated May 23, 2018, from the State Intellectual Property Office of People's Republic of China in counterpart Chinese Application No. 201380056879.5.
Communication dated May 30, 2018, issued by the State Intellectual Property Office of the People's Republic of China in counterpart Chinese Application No. 201510490049.4.
Kotoh, K., "Quality and Production of Ultrapure Chemicals for the Semiconductor Process", 1994, Special Feature Articles on Chemistry supporting the Semiconductor Industry, vol. 47, No. 5, pp. 642-644.
Yamamoto, A. et al., "Development of Polyethylene for Containers for Highly Pure Chemicals," 2001, Tosoh Research & Technology Review, vol. 45, pp. 49-53.
Israeli Office Action dated Feb. 28, 2019 issued by the Israeli Patent Office in counterpart Israeli Application No. 238445.
Office Action dated Dec. 28, 2018, issued by the State Intellectual Property Office of the People's Republic of China in counterpart Chinese Patent Application No. 201380056879.5.
Office Action dated Jul. 1, 2019, issued by the Israeli Patent Office in counterpart Israeli Application No. 238445.
Office Action dated Jul. 2, 2019, issued by the Chinese Patent Office in counterpart Chinese Application No. 201380056879.5.
Office Action dated Jul. 23, 2019, issued by the Singapore Patent Office in counterpart Singapore Patent Application No. 11201503388R.

* cited by examiner

ORGANIC PROCESSING LIQUID FOR PATTERNING CHEMICAL AMPLIFICATION RESIST FILM, CONTAINER FOR ORGANIC PROCESSING LIQUID FOR PATTERNING CHEMICAL AMPLIFICATION RESIST FILM, AND PATTERN FORMING METHOD, METHOD OF MANUFACTURING ELECTRONIC DEVICE, AND ELECTRONIC DEVICE USING THE SAME

CROSS REFERENCE TO RELATED APPLICATION

This is a continuation of International Application No. PCT/JP2013/078211 filed on Oct. 17, 2013, and claims priority from Japanese Patent Application Nos. 2012-240752 filed on Oct. 31, 2012, and 2013-031277 filed on Feb. 20, 2013, the entire disclosures of which are incorporated herein by reference.

BACKGROUND

1. Technical Field

The present invention relates to an organic processing liquid for patterning a chemical amplification resist film, a container for the organic processing liquid for patterning the chemical amplification resist film, and a pattern forming method, a method of manufacturing an electronic device, and the electronic device using the same. More particularly, the present invention relates to an organic processing liquid for patterning a chemical amplification resist film, a container for the organic processing liquid for patterning the chemical amplification resist film, and a pattern forming method, a method of manufacturing an electronic device, and the electronic device using the same, which are suitable for a manufacturing process of a semiconductor such as an IC, a manufacturing process of a circuit board of, for example, a liquid crystal or a thermal head, and other lithography processes of photofabrication. Particularly, the present invention relates to an organic processing liquid for patterning a chemical amplification resist film, a container for the organic processing liquid for patterning the chemical amplification resist film, and a pattern forming method, a method of manufacturing an electronic device, and the electronic device using the same, which are suitable for the exposure in an ArF exposure apparatus or an ArF immersion-type projection exposure apparatus, which uses far-ultraviolet rays having a wavelength of 300 nm or less as a light source.

2. Background Art

There have been conventionally suggested various configurations as a positive pattern forming method using an alkali developer, and a positive resist composition used for the method (see, e.g., Japanese Patent Application Laid-Open Nos. 2006-257078, 2005-266766, and 2006-330098). In addition, a negative pattern forming method using an organic developer and a negative resist composition used for the method have recently been developed mainly for the purpose of a fine contact hole or trench pattern formation which may not be achieved by the positive resist composition (see, e.g., Japanese Patent Application Laid-Open Nos. 2007-325915, 2010-039146, and 2010-164958, and International Publication Pamphlet No. 2008-153110).

The organic developer used for the negative pattern forming method is supplied in the same manner as in an organic solvent (a thinner or a stripper) conventionally used in the electronic industry.

Here, it is required that a supply container of a chemical liquid for the electronic industry does not cause an increase of impure particles during storage or transport, a degeneration of components, a quantitative change in the composition, an increase of impure metal elements, or a decrease in quality caused by a deterioration of a photosensitive component due to light.

As for a container satisfying this requirements, for example, a polytetrafluoroethylene or polyolefin-based high purity resinous container has been known (See, Japanese Patent Publication H6-99000 and Unexamined Japanese Patent No. 3929000), but from the viewpoint of cost, a polyolefin-based high purity resinous container is generally used.

However, a need for further miniaturization in the formation of a contact hole or a trench pattern (for example, to 30 nm node or less) has recently been rapidly increased. In response to this, an occurrence of particles likely to affect, especially, the performance of a fine pattern is required to be further suppressed.

The present invention has been made in consideration of the problems described above, and an object thereof is to provide an organic processing liquid for patterning a chemical amplification resist film, which is capable of reducing occurrence of particles, a container for the organic processing liquid for patterning the chemical amplification resist film, and a pattern forming method, a method of manufacturing an electronic device, and the electronic device using the same, in a negative pattern forming method for forming a fine pattern (for example, 30 nm node or less) particularly using an organic developer.

The present inventors minutely investigated a container for an organic developer in consideration of the problems described above, and found that the organic developer contained in a general-purpose container represented by a polyolefin-based high purity resinous container is a main cause of occurrence of the particles. Then, the inventors found that concentrations of certain types of impurities are reduced in an organic developer contained in a particular container, and further the use of the organic developer may reduce the occurrence of particles which may be problematic in a fine pattern (for example, 30 nm node or less), and completed the present invention based on these findings.

SUMMARY OF INVENTION

That is, the present invention has the following configuration, and thus the above described object of the present invention is achieved.

[1] An organic processing liquid for patterning a chemical amplification resist film, in which the organic processing liquid contains 1 ppm or less of alkylolefin having a carbon number of 22 or less, and 5 ppm or less of a metal element concentration of each of Na, K, Ca, Fe, Cu, Mg, Mn, Li, Al, Cr, Ni, and, Zn.

[2] The organic processing liquid described in [1], in which the organic processing liquid is an organic developer.

[3] The organic processing liquid described in [2], in which the organic developer is butyl acetate.

[4] The organic processing liquid described in [1], in which the organic processing liquid is an organic rinsing liquid.

[5] The organic processing liquid described in [4], in which the organic rinsing liquid is 4-methyl-2-pentanol or butyl acetate.

[6] A container of an organic processing liquid for patterning a chemical amplification resist film, the container having a housing portion in which the organic processing liquid described in any one of [1] to [5] is contained, in which the housing portion has an inner wall to come in contact with the organic processing liquid, the inner wall being made of a resin different from at least one kind of resin selected from the group consisting of a polyethylene resin, a polypropylene resin, and a polyethylene-polypropylene resin, or a metal subjected to a rust-prevention/metal elution prevention treatment.

[7] The container described in [6], in which the resin different from the at least one kind of resin selected from the group consisting of a polyethylene resin, a polypropylene resin, and a polyethylene-polypropylene resin is a perfluoro resin.

[8] A pattern forming method including: (A) forming a film by a chemical amplification resist composition, (B) exposing the film, and (C) developing the exposed film using an organic developer, in which the organic developer is the organic processing liquid described in [2] or [3].

[9] The pattern forming method described in [8], further including: performing a washing step using an organic rinsing liquid after the developing of the exposed film using the organic developer, in which the organic rinsing liquid is the organic processing liquid described in [4] or [5].

[10] The pattern forming method described in [9], in which the organic developer is the organic processing liquid for patterning a chemical amplification resist film described in [3], and the organic rinsing liquid is the organic processing liquid for patterning a chemical amplification resist film described in [5].

[11] The pattern forming method described in any one of [8] to [10], in which the developing of the exposed film using the organic developer is performed by using a developing apparatus mounted with a filter for a processing liquid, in which the organic developer passes through the filter for the processing liquid to be used in development.

[12] A method of manufacturing an electronic device, the method including the pattern forming method described in any one of [8] to [11].

[13] An electronic device manufactured by the method described in [12].

According to the present invention, in a negative pattern forming method for forming a fine pattern (for example, 30 nm node or less) particularly using an organic developer, there may be provided an organic processing liquid for patterning the chemical amplification resist film which may reduce occurrence of particles, a container for the organic processing liquid for patterning the chemical amplification resist film, and a pattern forming method, a method of manufacturing an electronic device, and the electronic device using the same.

DETAILED DESCRIPTION OF EXEMPLARY EMBODIMENTS

Hereinafter, exemplary embodiments of the present invention will be described in detail.

In the present specification, when a group (atomic group) is denoted without specifying substitution or unsubstitution, the group may not include a substituent or include a substituent. For example, an "alkyl group" may include not only an alkyl group not having a substituent (unsubstituted alkyl group), but also an alkyl group having a substituent (substituted alkyl group).

In the present specification, "actinic ray" or "radiation" indicates, for example, a bright line spectrum of a mercury lamp, a far-ultraviolet ray represented by excimer laser, an extreme-ultraviolet ray (EUV light), an X-ray, or an electron beam (EB). Also, in the present invention, the light means an actinic ray or radiation.

Also, in the present specification, unless otherwise specifically indicated, "exposure" includes not only the exposure to a mercury lamp, a far-ultraviolet ray represented by excimer laser, an extreme-ultraviolet ray, an X-ray, or EUV light, but also drawing performed by a corpuscular beam such as an electron beam and an ion beam.

In an organic processing liquid for patterning a chemical amplification resist film, according to the present invention, a content of alkylolefin having a carbon number of 22 or less is 1 ppm or less, and a metal element concentration of each of Na, K, Ca, Fe, Cu, Mg, Mn, Li, Al, Cr, Ni, and, Zn is 5 ppm or less.

When the organic processing liquid satisfies the requirements described above, an occurrence of particles which may be problematic in, especially, a fine pattern (for example, 30 nm node or less) may be reduced.

That is, when the content of alkylolefin having a carbon number of 22 or less is higher than 1 ppm, or the concentration of at least any one of the metal elements including Na, K, Ca, Fe, Cu, Mg, Mn, Li, Al, Cr, Ni, and Zn is higher than 5 ppm, there is a tendency that considerable particles may occur, particularly, in a fine pattern (for example, 30 nm node or less).

In the organic processing liquid for patterning the chemical amplification resist film, according to the present invention, the content of alkylolefin having a carbon number of 22 or less is preferably 0.5 ppm or less, and more preferably 0.3 ppm or less. It is most preferable that alkylolefin having a carbon number of 22 or less is not present. However, if such alkylolefin is present, its content is generally 0.001 ppm or more.

In the organic processing liquid for patterning the chemical amplification resist film, according to the present invention, a metal element concentration of each of Na, K, Ca, Fe, Cu, Mg, Mn, Li, Al, Cr, Ni, and, Zn is preferably 4 ppm or less, and more preferably 3 ppm or less. It is most preferable that none of Na, K, Ca, Fe, Cu, Mg, Mn, Li, Al, Cr, Ni, and Zn are present. However, if any one of these metal elements is present, a minimum of the concentration of the existing metal element is generally 0.001 ppm or more.

The content of alkylolefin having a carbon number of 22 or less may be measured according to a gas chromatography mass spectrometry (e.g., GCMS-QP2010 (a gas chromatography mass spectrometer) manufactured by Shimadzu Corporation) connected to a pyrolysis apparatus (e.g., PY2020D manufactured by Frontier Lab).

The metal element concentration of Na, K, Ca, Fe, Cu, Mg, Mn, Li, Al, Cr, Ni, and Zn may be measured according to an inductively coupled plasma mass spectrometry (e.g., an inductively coupled plasma mass spectrometer, Agilent 7500cs (ICP-MS equipment) manufactured by Agilent Technologies, Inc.).

The organic processing liquid for patterning the chemical amplification resist film is generally an organic developer, or an organic rinsing liquid. Typically, the organic processing liquid is an "organic developer" in a pattern forming method or an "organic rinsing liquid" in washing. The pattern forming method includes (a) forming a film by a chemical amplification resist composition, (b) exposing the film, and (c) developing the exposed film using the organic developer, and may further include performing washing using the organic rinsing liquid after the step (c).

The organic developer refers to a developer containing an organic solvent. The amount of the organic solvent used in the organic developer ranges preferably from 90% by mass to 100% by mass with respect to the total amount of the developer, and more preferably from 95% by mass to 100% by mass.

As for the organic developer, a polar solvent such as a ketone-based solvent, an ester-based solvent, an alcohol-based solvent, an amide-based solvent and an ether-based solvent, and a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate and the like.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate and the like.

Examples of the alcohol-based solvent include an alcohol such as methyl alcohol, ethyl alcohol, n-propyl alcohol, isopropyl alcohol, n-butyl alcohol, sec-butyl alcohol, t-butyl alcohol, isobutyl alcohol, n-hexyl alcohol, n-heptyl alcohol, n-octyl alcohol and n-decanol, a glycol-based solvent such as ethylene glycol, diethylene glycol and triethylene glycol, a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol, and the like.

Examples of the ether-based solvent include, in addition to the glycol ether-based solvents, dioxane, tetrahydrofuran and the like.

As the amide-based solvent, it is possible to use, for example, N-methyl-2-pyrrolidone, N,N-dimethylacetamide, N,N-dimethylformamide, hexamethylphosphoric triamide, 1,3-dimethyl-2-imidazolidinone and the like.

Examples of the hydrocarbon-based solvent include an aromatic hydrocarbon-based solvent such as toluene and xylene, and an aliphatic hydrocarbon-based solvent such as pentane, hexane, octane and decane.

A plurality of the above-described solvents may be mixed, or the solvents may be used by being mixed with a solvent other than those described above or with water. However, in order to sufficiently exhibit the effects of the present invention, the water content ratio of the entire developer is preferably less than 10% by mass, and it is more preferred that the developer contains substantially no moisture.

In particular, the organic developer is preferably a developer containing at least one of organic solvent selected from the group consisting of a ketone-based solvent, an ester-based solvent, an alcohol-based solvent, an amide-based solvent and an ether-based solvent.

The vapor pressure of the organic developer is preferably 5 kPa or less, more preferably 3 kPa or less, and particularly preferably 2 kPa or less, at 20° C. By adjusting the vapor pressure of the organic developer to 5 kPa or less, evaporation of the developer on a substrate or in a development cup is suppressed so that the temperature uniformity in the wafer plane is improved, and as a result, the dimensional uniformity in the wafer plane is improved.

In the organic developer, a surfactant may be added in an appropriate amount, if necessary.

The surfactant is not particularly limited but, for example, ionic or nonionic fluorine-based and/or silicon-based surfactant and the like may be used. Examples of the fluorine and/or silicon-based surfactant include surfactants described in Japanese Patent Application Laid-Open Nos. S62-36663, S61-226746, S61-226745, S62-170950, S63-34540, H7-230165, H8-62834, H9-54432 and H9-5988, and U.S. Pat. Nos. 5,405,720, 5,360,692, 5,529,881, 5,296,330, 5,436,098, 5,576,143, 5,294,511 and 5,824,451, and a nonionic surfactant is preferred. The nonionic surfactant is not particularly limited, but a fluorine-based surfactant or a silicon-based surfactant is more preferably used.

The amount of the surfactant in use ranges usually from 0.001% by mass to 5% by mass, preferably from 0.005% by mass to 2% by mass, and more preferably from 0.01% by mass to 0.5% by mass, based on the total amount of the developer.

The organic developer is preferably butyl acetate.

The organic developer may include a nitrogen-containing compound as exemplified in Japanese Patent No. 5056974, paragraphs 0041 to 0063. In view of, for example, the storage stability of the developer, the nitrogen-containing compound may be added to the organic developer preferably immediately before the pattern forming method of the present invention is performed.

The organic rinsing liquid refers to a rinsing liquid containing an organic solvent, and the amount of the organic solvent used in the organic rinsing liquid ranges preferably from 90% by mass to 100% by mass with respect to the total amount of the rinsing liquid, more preferably from 95% by mass to 100% by mass, and more preferably from 95% by mass to 100% by mass.

There is no particular limitation in the organic rinsing liquid, as long as it does not dissolve a resist pattern, and a solution including a general organic solvent may be used. As for the rinsing liquid, a rinsing liquid containing at least one of organic solvent selected from the group consisting of a hydrocarbon-based solvent a ketone-based solvent, an ester-based solvent, an alcohol-based solvent, an amide-based solvent and an ether-based solvent may be preferably used.

Specific examples of the hydrocarbon-based solvent, the ketone-based solvent, the ester-based solvent, the alcohol-based solvent, the amide-based solvent and the ether-based solvent may be the same as those described in the organic developer.

Among them, the organic rinsing liquid is preferably 4-methyl-2-pentanol or butyl acetate.

The water content ratio in the organic rinsing liquid is preferably 10% by mass or less, more preferably 5% by mass or less, and particularly preferably 3% by mass or less. By setting the water content ratio to 10% by mass or less, good development characteristics may be obtained.

The vapor pressure of the organic rinsing liquid ranges preferably from 0.05 kPa to 5 kPa, more preferably from 0.1 kPa to 5 kPa, and most preferably from 0.12 kPa to 3 kPa, at 20° C. By setting the vapor pressure of the rinsing liquid to range from 0.05 kPa to 5 kPa, the temperature uniformity in the wafer plane is improved, and furthermore, swelling caused by permeation of the rinsing liquid is suppressed, and as a result, the dimensional uniformity in the wafer plane is improved.

In the organic rinsing liquid, a surfactant described above may be added and used in an appropriate amount.

In the organic processing liquid for patterning the chemical amplification resist film, according to the present invention (typically, an organic developer or an organic rinsing liquid), as described above, a content of alkylolefin having a carbon number of 22 or less is 1 ppm or less, and a metal element concentration of each of Na, K, Ca, Fe, Cu, Mg, Mn, Li, Al, Cr, Ni, and, Zn is 5 ppm or less.

For example, how to obtain the organic processing liquid of the present invention is not particularly limited, as long as the conditions described above are satisfied. The organic processing liquid may be properly obtained as follows. As for a container of the organic processing liquid for patterning the chemical amplification resist film, a container having a housing portion is prepared. The housing portion has an inner wall to come in contact with the organic processing liquid, and the inner wall is made of a resin different from at least one kind of resin selected from the group consisting of a polyethylene resin, a polypropylene resin, and a polyethylene-polypropylene resin, or a metal subjected to a rust-prevention/metal elution prevention treatment. The organic solvent to be used as for the organic processing liquid for patterning the chemical amplification resist film is contained in the housing portion of the container, and is discharged from the housing portion at the patterning of the chemical amplification resist film.

Accordingly, the present invention also relates to the container of the organic processing liquid for patterning the chemical amplification resist film. The container of the organic processing liquid for patterning the chemical amplification resist film includes the housing portion configured to contain the above described organic processing liquid for patterning the chemical amplification resist film of the present invention, and a sealing portion configured to seal the housing portion. The inner wall of the housing portion which comes in contact with the organic processing liquid is made of a resin different from at least one kind of resin selected from the group consisting of a polyethylene resin, a polypropylene resin, and a polyethylene-polypropylene resin, or a metal subjected to a rust-prevention/metal elution prevention treatment.

When the organic processing liquid is contained in the housing portion of the container, the condition "a content of alkylolefin having a carbon number of 22 or less is 1 ppm or less, and a metal element concentration of each of Na, K, Ca, Fe, Cu, Mg, Mn, Li, Al, Cr, Ni, and, Zn is 5 ppm or less" of the present invention may be properly satisfied. The reason for this is not fully clarified, but is presumed as follows.

That is, when in the container, the inner wall of the housing portion which comes in contact with the organic processing liquid is made of at least one kind of resin selected from the group consisting of a polyethylene resin, a polypropylene resin, and a polyethylene-polypropylene resin, or a metal which has not been subjected to a rust-prevention/metal elution prevention treatment, the organic processing liquid comes in contact with the at least one resin or the metal which has not been subjected to the rust-prevention/metal elution prevention treatment during a general period (e.g., one week to one year) from filling of the organic processing liquid into the housing portion to discharge of the organic processing liquid from the housing portion at the time of patterning the chemical amplification resist film. Thus, a low molecular olefin (considered to remain in the synthesis process of the resin) contained in the resin is eluted in the organic processing liquid, and it is hard to satisfy the condition "a content of alkylolefin having a carbon number of 22 or less is 1 ppm or less, and a metal element concentration of each of Na, K, Ca, Fe, Cu, Mg, Mn, Li, Al, Cr, Ni, and, Zn is 5 ppm or less." In contrast, it is assumed that according to the container of the present invention, as described above, since a resin different from at least one kind of resin selected from the group consisting of a polyethylene resin, a polypropylene resin, and a polyethylene-polypropylene resin, or a metal subjected to a rust-prevention/metal elution prevention treatment is used, the organic processing liquid of the present invention which satisfies the above described condition is obtained.

When the container further includes the sealing portion for sealing the housing portion, the sealing portion may also be preferably made of a resin different from at least one kind of resin selected from the group consisting of a polyethylene resin, a polypropylene resin, and a polyethylene-polypropylene resin, or a metal subjected to a rust-prevention/metal elution prevention treatment.

Here, the sealing portion refers to a member capable of shielding the housing portion from an outside air, and, for example, a packing or an O-ring may be properly exemplified.

The resin different from at least one kind of resin selected from the group consisting of a polyethylene resin, a polypropylene resin, and a polyethylene-polypropylene resin is preferably a perfluoro resin.

As for the perfluoro resin, a polytetrafluoroethylene resin (PTFE), a tetrafluoroethylene-perfluoroalkylvinyl ether copolymer (PFA), a tetrafluoroethylene-hexafluoropropylene copolymer resin (FEP), an ethylene tetrafluoroethylene copolymer resin (ETFE), an ethylene chlorotrifluoroethylene copolymer resin (ECTFE), a polyvinylidene resin (PVDF), a polychlorotrifluoroethylene copolymer resin (PCTFE), or a polyvinyl fluoride resin (PVF) may be exemplified.

In particular, as a preferred perfluoro resin, a tetrafluoroethylene resin, a tetrafluoroethylene-perfluoroalkylvinyl ether copolymer, or a tetrafluoroethylene-hexafluoropropylene copolymer resin may be exemplified.

In the metal subjected to the rust-prevention/metal elution prevention treatment, as for the metal, carbon steel, alloy steel, nickel-chrome steel, nickel chrome molybdenum steel, chrome steel, chrome molybdenum steel, or manganese steel may be exemplified.

As for the rust-prevention/metal elution prevention treatment, a coating technique may be preferably applied.

The coating technique is largely divided into three kinds of coatings such as metal coating (various platings), inorganic coating (e.g., various chemical conversion treatments, glass, concrete, ceramics) and organic coating (rust preventive oil, paint, rubber, plastics).

As a preferred coating technique, a surface treatment using a rust preventive oil, a rust inhibitor, a corrosion inhibitor, a chelate compound, a peelable plastic, or a lining agent may be exemplified.

Among them, various corrosion inhibitors such as chromate, nitrite, silicate, phosphate, carboxylic acids (such as an oleic acid, a dimer acid, or a naphthalenic acid), a carboxylic acid metallic soap, sulfonate, amine salt, esters (a glycerin ester or a phosphate ester of a higher fatty acid), chelate compounds such as an ethylenediaminetetraacetic acid, a gluconic acid, a nitrilotriacetic acid, a hydroxyethylethylenediaminetriacetic acid, or a diethylenetriaminepentaacetic acid, and a fluorine resin lining are preferred. In particular, a phosphate treatment and a fluorine resin lining are preferred.

A "pre-treatment" may be preferably employed as a processing method which leads to extension of an anti-rust period through a coating treatment at a pre-stage of the rust-prevention treatment although not directly preventing rust unlike a direct coating treatment.

As for a specific example of such a pre-treatment, a treatment for removing various corrosive factors, such as chloride or sulfate, present on a metal surface through washing or polishing may be properly exemplified.

Hereinafter, descriptions will be made on a pattern forming method using the above described organic processing liquid for patterning the chemical amplification resist film according to the present invention.

The pattern forming method of the present invention includes:

(A) forming a film (chemical amplification resist film) by a chemical amplification resist composition, (B) exposing the film, and (C) developing the exposed film using an organic developer.

Here, the organic developer in step (C) is an organic developer as the above described organic processing liquid for patterning the chemical amplification resist film according to the present invention, and specific and preferred examples thereof are the same as described above.

The exposure in exposing of the film may be immersion exposure.

The pattern forming method of the present invention may preferably include a heating step after the exposing step.

The pattern forming method of the present invention may preferably further include a developing step using an alkali developer.

In the pattern forming method of the present invention, the exposing step may be performed a plurality of times.

In the pattern forming method of the present invention, the heating step may be performed a plurality of times.

In the pattern forming method of the present invention, the exposing step, and the developing step may be performed according to a conventionally known method.

The method may preferably include a prebaking step (PB) after the film is formed before the exposing step.

The method may also preferably include a post exposure baking step (PEB) after the exposing step before the developing step.

In both the PB and PEB steps, the heating for may be preferably performed at a temperature ranging from 70° C. to 130° C., and more preferably from 80° C. to 120° C.

The heating time ranges preferably from 30 sec to 300 sec, more preferably 30 sec to 180 sec, and further preferably 30 sec to 90 sec.

The heating may be performed using a means equipped with a conventional exposure/developing machine or may be performed using, for example, a hot plate.

By means of baking, the reaction in the exposed area is accelerated, and thus the sensitivity or pattern profile is improved.

The light source wavelength used in the exposure apparatus in the present invention is not limited, but examples of the light source may include an infrared light, a visible light, an ultraviolet light, a far ultraviolet light, an extreme-ultraviolet light, an X-ray, an electron beam and the like. The light source may be a far ultraviolet light at a wavelength of preferably 250 nm or less, more preferably 220 nm or less, and particularly preferably 1 nm to 200 nm. Specifically, the light source may be a KrF excimer laser (248 nm), an ArF excimer laser (193 nm), a $F_2$ excimer laser (157 nm), an X-ray, an EUV (13 nm), an electron beam or the like. A KrF excimer laser, an ArF excimer laser, an EUV or an electron beam is preferred, and an ArF excimer laser is more preferred.

Further, in the exposing step of the present invention, an immersion exposure method may be applied.

The immersion exposure method is a technique for increasing the resolution, that is, a technique in which a high refractive-index liquid (hereinafter, also referred to as an "immersion liquid") is filled between a projection lens and a sample to perform the exposure.

As described above, for the "effect of immersion", assuming that $\lambda_0$ is the wavelength of exposure light in air, n is the refractive index of the immersion liquid for air, $\theta$ is the convergence half-angle of beam and $NA_0=\sin\theta$, the resolution and the depth of focus in immersion may be expressed by the following equations. Here, $k_1$ and $k_2$ are coefficients related to the process.

(Resolution)=$k_1 \cdot (\lambda_0/n)/NA_0$ (Depth of focus)=$\pm k_2 \cdot (\lambda_0/n)/NA_0^2$ That is, the effect of immersion is equal to the use of an exposure wavelength having a wavelength of 1/n. In other words, in the case of a projection optical system having the same NA, the depth of focus may be made n times larger by the immersion. This is effective for all pattern shapes and may be combined with the super-resolution technology that is being now currently studied, such as a phase-shift method and a modified illumination method.

In the case of performing immersion exposure, a step of washing the surface of the film with an aqueous chemical liquid may be performed (1) after forming the film on a substrate and before the exposing step and/or (2) after the step of exposing the film through an immersion liquid before the step of heating the film.

The immersion liquid is preferably a liquid which is transparent to light at the exposure wavelength and has a temperature coefficient of refractive index as small as possible in order to minimize the distortion of an optical image projected on the film, but particularly, when the exposure light source is an ArF excimer laser (wavelength; 193 nm), water is preferably used from the viewpoint of easy availability and easy handleability in addition to the above-described viewpoint.

When water is used, an additive (liquid) capable of decreasing the surface tension of water and increasing the interfacial activity may be added in a small ratio. It is preferred that the additive does not dissolve the resist layer on the wafer and has only a negligible effect on the optical coat at the undersurface of the lens element.

Such an additive is preferably an aliphatic alcohol having a refractive index almost equal to that of, for example, water, and specific examples thereof may include methyl alcohol, ethyl alcohol, isopropyl alcohol and the like. By adding an alcohol having a refractive index almost equal to that of water, even when the alcohol component in water is evaporated and the content concentration thereof is changed, it is possible to obtain an advantage in that the change in the refractive index of the liquid as a whole may be made very small.

On one hand, when a substance opaque to light at 193 nm or an impurity greatly differing from water in the refractive index is incorporated, the incorporation incurs distortion of the optical image projected on the resist, and thus, the water to be used is preferably distilled water. Further, pure water filtered through an ion exchange filter or the like may also be used.

The electrical resistance of water used as the immersion liquid is preferably 18.3 MΩcm or more, and TOC (organic concentration) is preferably 20 ppb or less and the water is preferably subjected to deaeration treatment.

Further, the lithography performance may be enhanced by raising the refractive index of the immersion liquid. From the viewpoint, an additive for raising the refractive index may be added to water, or heavy water ($D_2O$) may be used in place of water.

In the case where the film formed by using the composition in the present invention is subjected to exposure through an immersion medium, the aforementioned hydrophobic resin (D) may be further added if necessary. The receding contact angle of the surface is improved by the addition of the hydrophobic resin (D). The receding contact angle of the film preferably ranges from 60° to 90° and more preferably is 70° or more.

In the immersion exposure step, the immersion liquid needs to move on a wafer following the movement of an exposure head that scans the wafer at a high speed and forms an exposure pattern, and thus the contact angle of the immersion liquid for the resist film in a dynamic state is important, and it is required for the resist to be capable of following the high-speed scanning of the exposure head without leaving droplets.

In order to prevent the film from directly coming in contact with the immersion liquid, between the film formed using the composition of the present invention and the immersion liquid, a film (hereinafter, also referred to as a "topcoat") sparingly soluble in an immersion liquid may be provided. Examples of a function required of the topcoat may include coating suitability to the upper layer portion of the resist, transparency to radiation, particularly, to radiation having a wavelength of 193 nm, and poor solubility in the immersion liquid. It is preferred that the topcoat may be uniformly coated onto the upper layer of the resist without being mixed with the resist.

The topcoat is preferably a polymer not containing an aromatic group from the viewpoint of the transparency to 193 nm.

Specific examples of such a polymer include a hydrocarbon polymer, an acrylic acid ester polymer, polymethacrylic acid, polyacrylic acid, polyvinyl ether, a silicon-containing polymer and a fluorine-containing polymer. The hydrophobic resin (D) described above is suitable also as the topcoat. If impurities are eluted into the immersion liquid from the topcoat, the optical lens is contaminated, and thus it is preferred the amounts of residual monomer components of the polymer contained in the topcoat are small.

When the topcoat is peeled off, a developer may be used, or another peeling agent may be used. As the peeling agent, a solvent that rarely penetrates the film is preferred. From the viewpoint that the peeling process may be performed simultaneously with the developing treatment process of the film, it is preferred that the topcoat may be peeled off by an alkali developer. From the viewpoint of peeling off the topcoat with an alkali developer, the topcoat is preferably acidic, but from the viewpoint of a non-intermixture property with respect to the film, the topcoat may be neutral or alkaline.

It is preferred that there is no difference or a small difference in the refractive index between the topcoat and the immersion liquid. In this case, the resolution may be improved. When the exposure light source is an ArF excimer laser (wavelength: 193 nm), it is preferred that water is used as the immersion liquid, and thus the topcoat for ArF liquid immersion exposure preferably has a refractive index close to the refractive index (1.44) of water. Further, from the viewpoint of transparency and refractive index, the topcoat is preferably a thin film.

It is preferred that the topcoat is not mixed with the film and the immersion liquid. From this viewpoint, when the immersion liquid is water, it is preferred that the solvent used for the topcoat is sparingly soluble in the solvent used for the composition of the present invention and is a water-insoluble medium. Further, when the immersion liquid is an organic solvent, the topcoat may be water-soluble or water-insoluble.

In the present invention, the substrate on which the film is formed is not particularly limited, and it is possible to use an inorganic substrate such as silicon, SiN, $SiO_2$ or SiN, a coating-type inorganic substrate such as SOG, or a substrate generally used in the process of manufacturing a semiconductor such as IC or manufacturing a liquid crystal device or a circuit board such as a thermal head or in the lithography process of other photo-fabrication processes. Further, if necessary, an organic antireflection film may be formed between the film and the substrate.

When the pattern forming method of the present invention further includes performing development using an alkali developer, it is possible to use an alkaline aqueous solution of inorganic alkalis such as sodium hydroxide, potassium hydroxide, sodium carbonate, sodium silicate, sodium metasilicate, aqueous ammonia and the like, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, cyclic amines such as pyrrole and piperidine, and the like, as the alkali developer.

Further, alcohols and a surfactant may be added to the alkaline aqueous solution each in an appropriate amount and the mixture may be used.

The alkali concentration of the alkali developer ranges usually from 0.1% by mass to 20% by mass.

The pH of the alkali developer ranges usually from 10.0 to 15.0.

In particular, an aqueous solution of 2.38% by mass of tetramethylammonium hydroxide is preferred.

When the development using the organic developer is combined with the development using the alkali developer, it is expected that as illustrated in FIGS. 1 to 11 of U.S. Pat. No. 8,227,183, a pattern having a ½ line width of a mask pattern is resolved.

As for the rinsing liquid in the rinse treatment performed after the alkali development, pure water is used, and an appropriate amount of a surfactant may be added thereto to use the mixture.

Further, after the development treatment or rinse treatment, a treatment of removing the developer or rinsing liquid adhering on the pattern by a supercritical fluid may be performed.

In the step of developing the exposed film using the organic developer, the organic developer is an organic developer as described above, as the organic processing liquid for patterning the chemical amplification resist film according to the present invention. As for the developing method, it is possible to apply, for example, a method of dipping a substrate in a bath filled with a developer for a predetermined time (a dipping method), a method of heaping up a developer on a substrate surface by a surface tension and keeping the substrate still for a fixed time, thereby performing development (a puddle method), a method of spraying a developer on a substrate surface (a spraying method), a method of continuously ejecting a developer on a substrate spinning at a constant speed while scanning a developer ejecting nozzle at a constant rate (a dynamic dispense method) and the like.

When the aforementioned various developing methods include ejecting a developer toward a resist film from a development nozzle of a developing apparatus, the ejection pressure of the ejected developer (the flow velocity per unit area of the ejected developer) is preferably 2 mL/sec/mm$^2$ or less, more preferably 1.5 mL/sec/mm$^2$ or less, and still more preferably 1 mL/sec/mm$^2$ or less. The flow velocity has no particular lower limit, but is preferably 0.2 mL/sec/mm$^2$ or more in consideration of throughput.

By setting the ejection pressure of the ejected developer to the above-described range, pattern defects resulting from the resist scum after development may be significantly reduced.

Details on the mechanism are not clear, but it is thought that it is because by setting the ejection pressure in the above-described range, the pressure imposed on the resist film by the developer is decreased and the resist film or resist pattern is suppressed from being inadvertently cut or collapsing.

Further, the ejection pressure (mL/sec/mm$^2$) of the developer is the value at the outlet of the development nozzle in the developing apparatus.

Examples of the method for adjusting the ejection pressure of the developer may include a method of adjusting the ejection pressure by, for example, a pump, and a method of supplying a developer from a pressurized tank and adjusting the pressure to change the ejection pressure.

Further, after the step of performing development using a developer containing an organic solvent, a step of stopping the development while replacing the solvent with another solvent may be performed.

The developing apparatus used for the step of performing development using the organic developer is preferably a coating and developing apparatus which can apply an organic developer. Examples of the coating and developing apparatus may include LITHIUS, LITHIUS i+, LITHIUS Pro, LITHIUS Pro-i, LITHIUS Pro V, and LITHIUS Pro V-i manufactured by Tokyo Electron Limited, and RF$^{3S}$, SOKUDO DUO manufactured by SOKUDO Co., Ltd.

The coating and developing apparatus is normally mounted with a filter for a connection chemical liquid called a POU filter (a filter for a processing liquid).

Accordingly, in the developing step, the coating and developing apparatus mounted with the POU (a developing apparatus mounted with a filter for a processing liquid) is used. The organic processing liquid (especially, the organic developer) for patterning, according to the present invention, may pass through the POU filter to be used for the development.

When the coating and developing apparatus mounted with the POU is used, following two things may be preferably performed.

1. When a new POU filter is used, a processing liquid to be used passes through the POU filter in an amount of 30 L or more, immediately after the POU filter is set in the apparatus. 2. When a filter is not used for 6 hours or more, a dummy dispense in 1 L or more is performed immediately before the filter is used.

The pattern forming method of the present invention may preferably further include a washing step using an organic rinsing liquid, after the step of performing development using an organic developer.

Here, the organic rinsing liquid is the above described organic rinsing liquid as the organic processing liquid for patterning the chemical amplification resist film according to the present invention, and specific and preferred examples thereof are the same as described above.

After the step of performing development using the organic developer, the washing step may be more preferably performed using at least one organic rinsing liquid selected from the group consisting of a ketone-based solvent, an ester-based solvent, an alcohol-based solvent, and an amide-based solvent. Further preferably, the washing step may be performed using a rinsing liquid containing an alcohol-based solvent or an ester-based solvent, particularly preferably, the washing step may be performed using a rinsing liquid containing a monohydric alcohol, and most preferably, the washing step may be performed using a rinsing liquid containing a monohydric alcohol having 5 or more carbon atoms.

Here, examples of the monohydric alcohol used in the rinsing step includes straight, branched or cyclic monohydric alcohols, and specifically, it is possible to use 1-butanol, 2-butanol, 3-methyl-1-butanol, t-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol and the like, and as the particularly preferred monohydric alcohol having 5 or more carbon atoms, it is possible to use 1-hexanol, 2-hexanol, 4-methyl-2-pentanol, 1-pentanol, 3-methyl-1-butanol and the like.

Otherwise, in the washing step, butyl acetate may be used as for the organic rinsing liquid.

A plurality of the components may be mixed, or the solvents may be used by being mixed with an organic solvent other than those described above.

The vapor pressure of the rinsing liquid used after the step of performing development using a developer including an organic solvent ranges preferably from 0.05 kPa to 5 kPa, more preferably from 0.1 kPa to 5 kPa, and most preferably from 0.12 kPa to 3 kPa, at 20° C. By setting the vapor pressure of the rinsing liquid to range from 0.05 kPa to 5 kPa, the temperature uniformity in the wafer plane is improved, and furthermore, swelling caused by permeation of the rinsing liquid is suppressed, and as a result, the dimensional uniformity in the wafer plane is improved.

The rinsing liquid may also be used by adding an appropriate amount of a surfactant thereto.

In the rinsing step, the wafer subjected to development using a developer containing an organic solvent is washed by using the above-described rinsing liquid including an organic solvent. The method of washing treatment is not particularly limited, but it is possible to employ, for example, a method of continuously ejecting a rinsing liquid on a substrate spinning at a constant speed (spin coating method), a method of dipping a substrate in a bath filled with a rinsing liquid for a fixed time (dipping method), a method of spraying a rinsing liquid on a substrate surface (spraying method), and the like, and among them, it is preferred that the washing treatment is performed by the spin coating method and after the washing, the substrate is spun at a rotational speed from 2,000 rpm to 4,000 rpm to remove the rinsing liquid from the substrate. It is also preferred that a heating step (post baking) is included after the rinsing step. The developer and rinsing liquid remaining between patterns and in the inside of the pattern are removed by the baking. The heating step after the rinsing step is performed at usually 40° C. to 160° C., and preferably 70° C. to 95° C., for usually 10 sec to 3 min, and preferably 30 sec to 90 sec.

The pattern forming method of the present invention further includes a washing step using an organic rinsing liquid, after the step of performing development using an organic developer. It is more preferred that the organic developer is butyl acetate as the above described organic processing liquid for patterning the chemical amplification resist film according to the present invention, and the organic rinsing liquid is butyl acetate as the above described organic processing liquid for patterning the chemical amplification resist film according to the present invention.

The chemical amplification resist composition used for the pattern forming method of the present invention is not particularly limited as long as its chemical reaction in a system triggered by the exposure is a catalytic chain reaction. Typically, a chemical amplification resist containing a part or all of the components described below is preferably used.

[1] (A) Resin of Which the Polarity Increases Due to the Action of an Acid, and Thereby the Solubility in a Developer Containing an Organic Solvent Decreases As for the resin (A) of which the polarity increases due to the action of an acid, and thereby the solubility in a developer containing an organic solvent decreases, a resin (hereinafter, also referred to as an "acid-decomposable resin" or "resin (A)") having a group (hereinafter, also referred to as an "acid-decomposable group") capable of decomposing by the action of an acid to generate a polar group at either the main chain or side chain of the resin, or at both the main chain and the side chain may be exemplified.

In the structure of the acid-decomposable group, it is preferred that a polar group is protected with a group capable of decomposing and leaving by the action of an acid. Preferred polar groups may include a carboxyl group, a phenolic hydroxyl group, a fluorinated alcohol group (preferably hexafluoroisopropanol group), and a sulfonic acid group.

A preferred acid-decomposable group is a group obtained by substituting a hydrogen atom of the groups with a group capable of leaving by an acid.

Examples of the group capable of leaving by the acid may include —C($R_{36}$)($R_{37}$)($R_{38}$), —C($R_{36}$)($R_{37}$)(O$R_{39}$), and —C($R_{01}$)($R_{02}$)(O$R_{39}$).

In Formula, each of $R_{36}$ to $R_{39}$ independently represents an alkyl group, a cycloalkyl group, an aryl group, an aralkyl group or an alkenyl group. $R_{36}$ and $R_{37}$ may be bound with each other to form a ring.

Each of $R_{01}$ and $R_{02}$ independently represents a hydrogen atom, an alkyl group, a cycloalkyl group, an aryl group, an aralkyl group or an alkenyl group.

As the acid-decomposable group, a cumyl ester group, an enol ester group, an acetal ester group, a tertiary alkyl ester group and the like are preferred. The group is more preferably a tertiary alkyl ester group. When the pattern forming method of the present invention is performed by exposure to KrF light or EUV light, or electron beam irradiation, an acid-decomposable group in which a phenolic hydroxyl group is protected with a group capable of leaving by an acid may be used.

It is preferred that the resin (A) has a repeating unit having an acid-decomposable group.

The repeating unit may be exemplified as follows.

In the specific examples, Rx represents a hydrogen atom, $CH_3$, $CF_3$ or $CH_2OH$. Each of Rxa and Rxb represents an alkyl group having 1 to 4 carbon atoms. $Xa_1$ represents a hydrogen atom, $CH_3$, $CF_3$, or $CH_2OH$. Z represents a substituent. When a plurality of Z's exist, Z's may be the same or different. p represents 0 or a positive integer. Specific examples and preferred examples of Z are the same as those of substituents which respective groups of $Rx_1$ to $Rx_3$ may have.

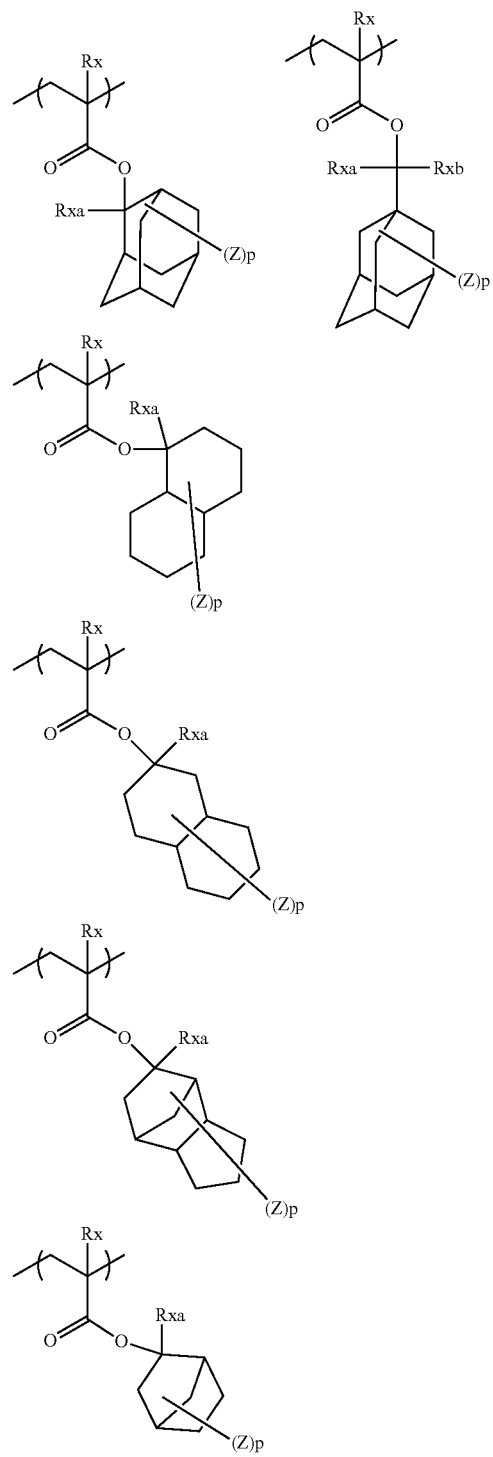

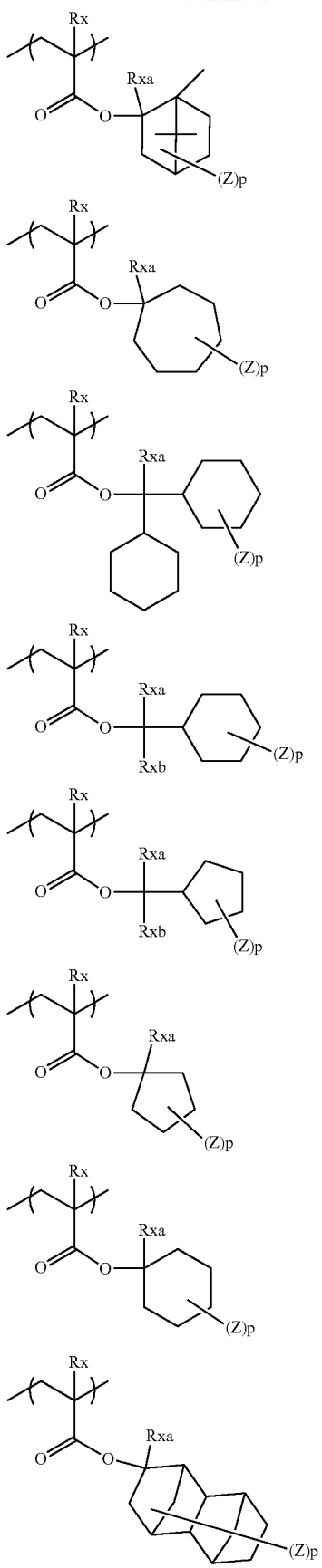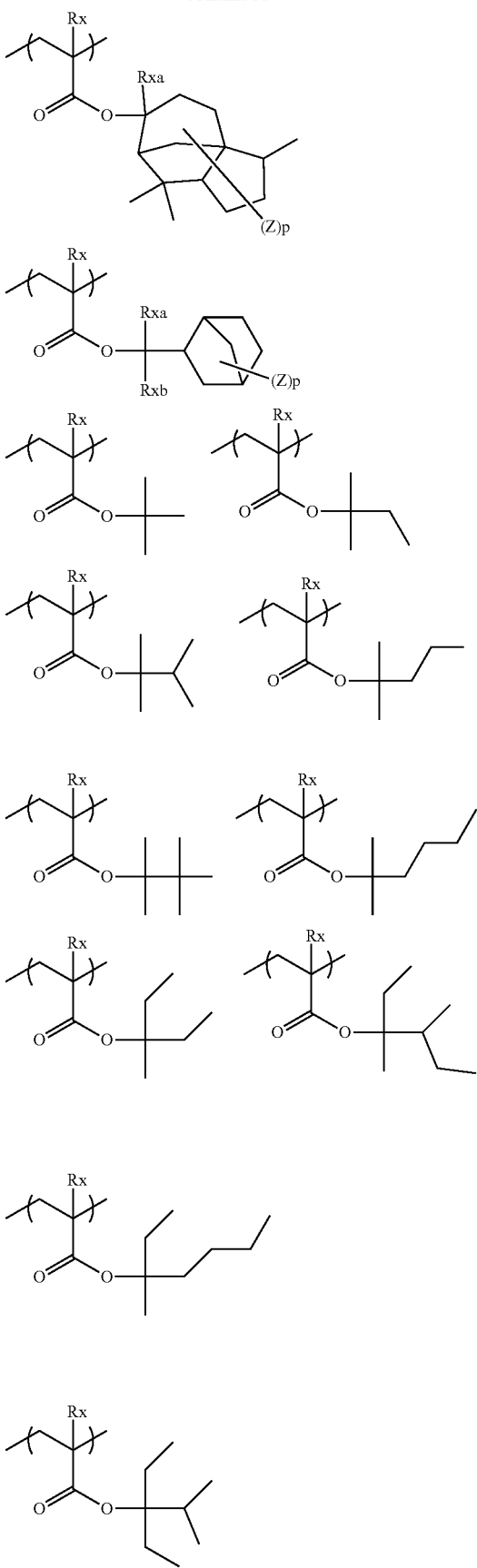

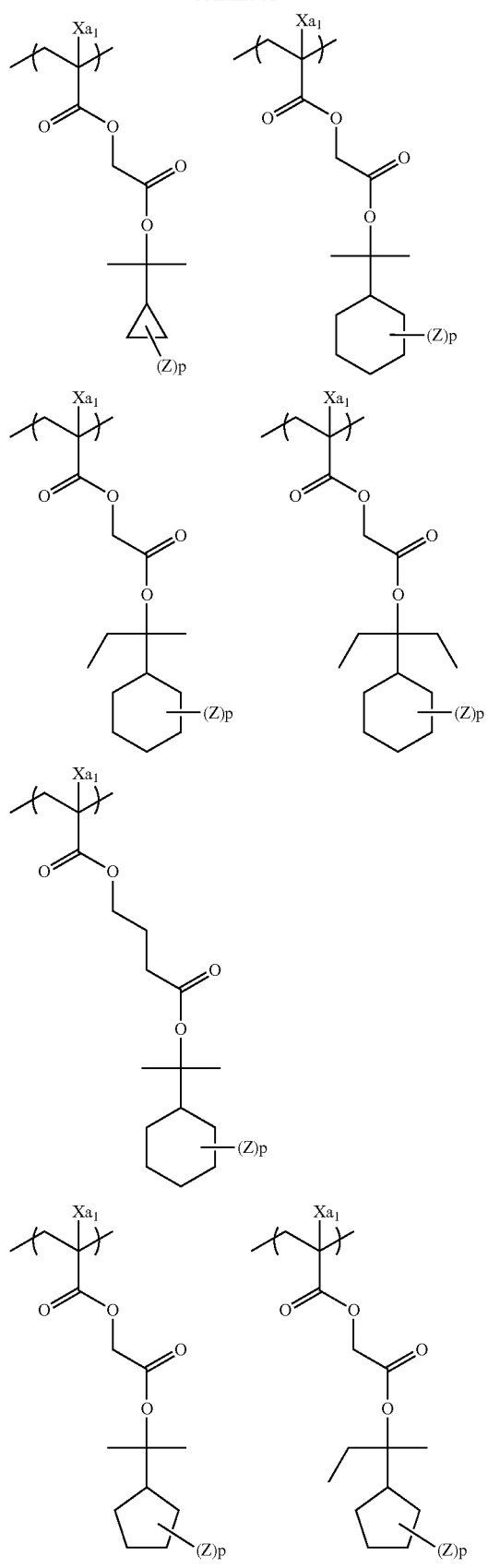
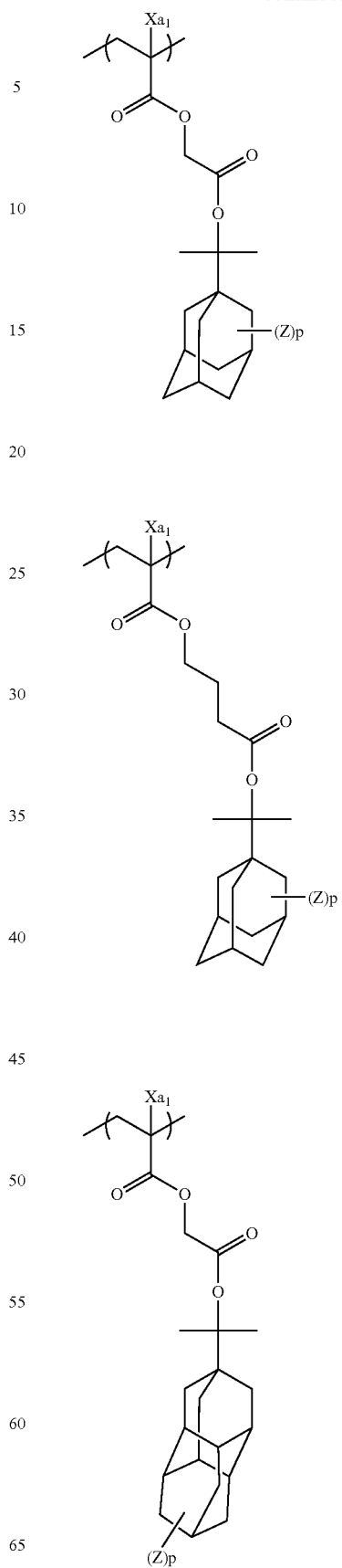

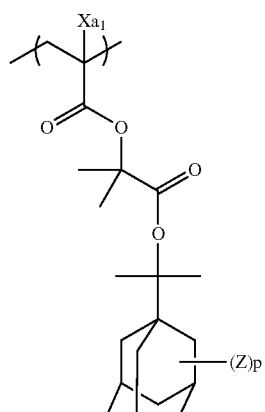
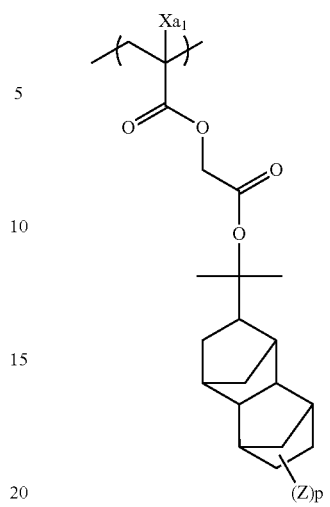
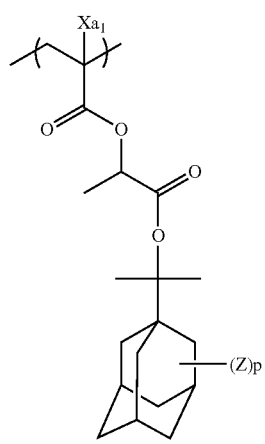
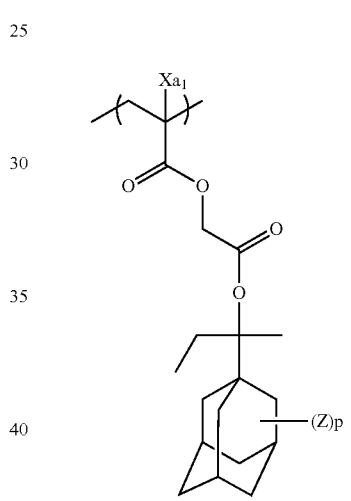
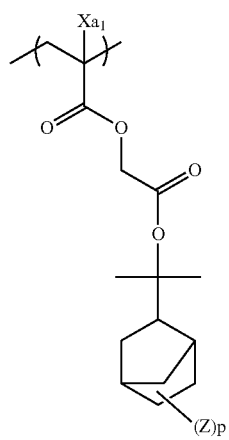
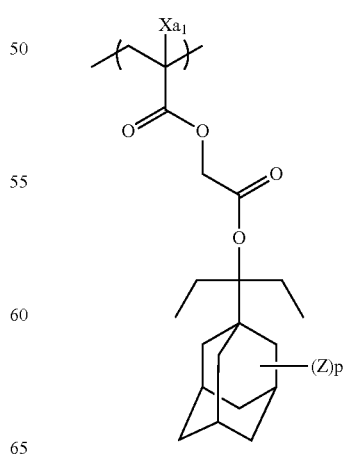

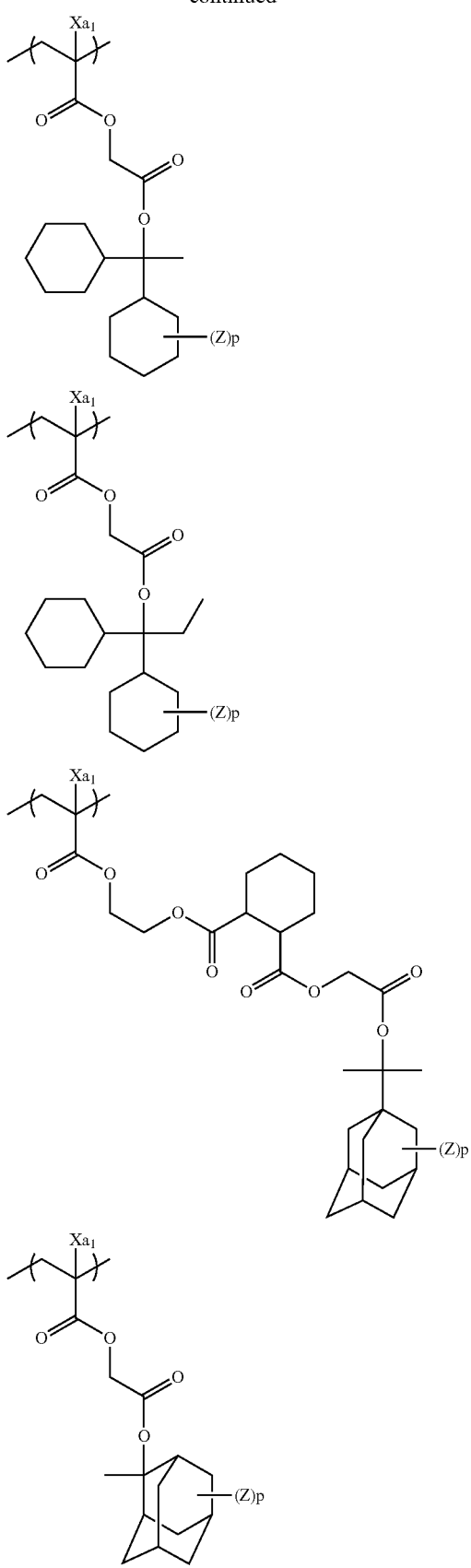
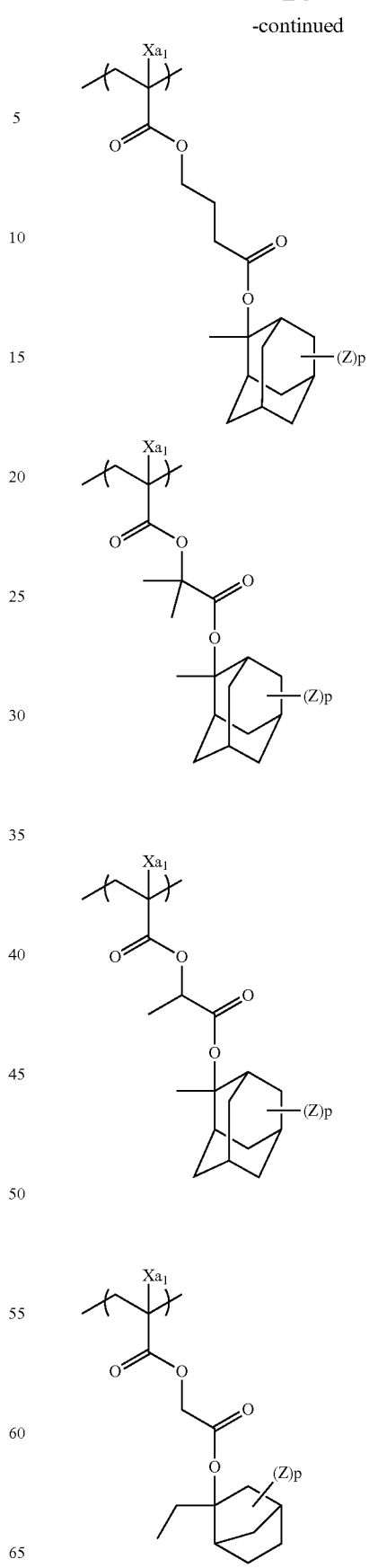

-continued
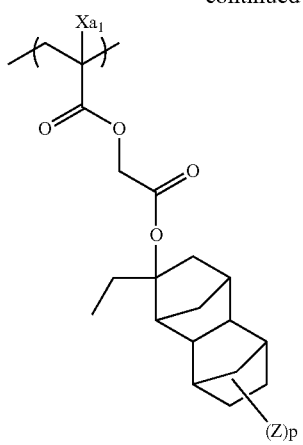
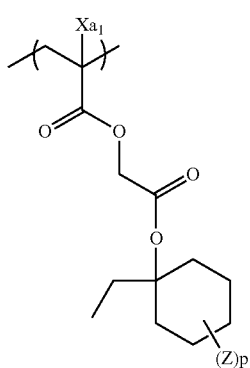
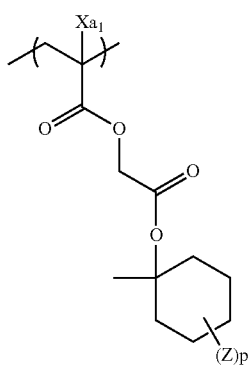
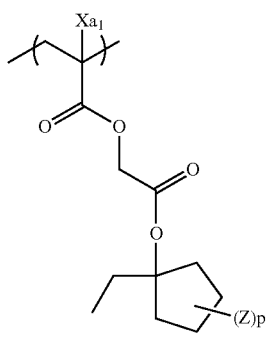
-continued
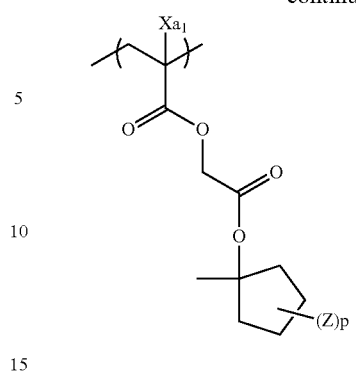
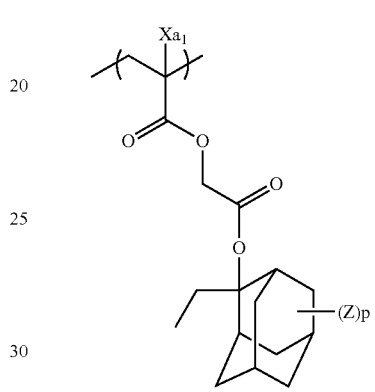
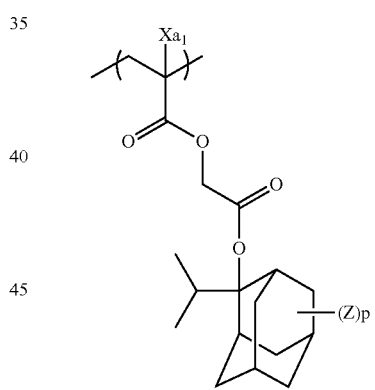
In the specific examples below, Xa represents a hydrogen atom, an alkyl group, a cyano group or a halogen atom.
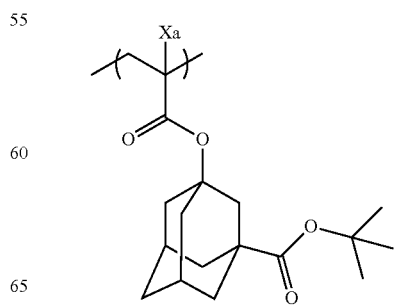

27
-continued
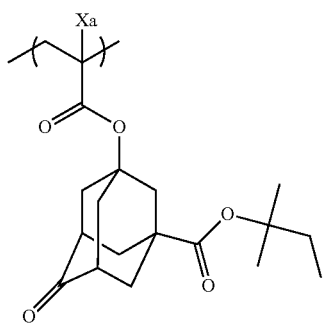
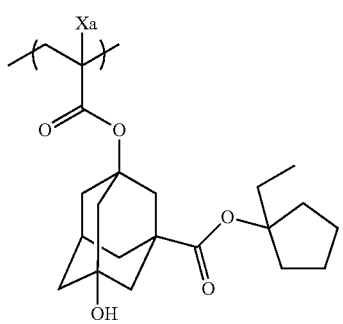
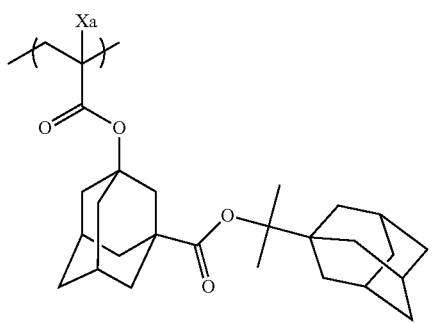
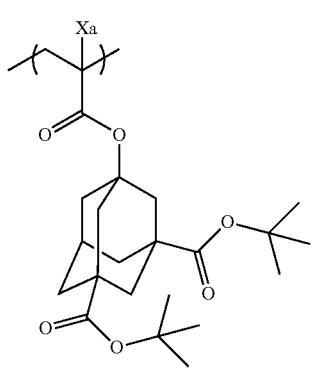
28
-continued
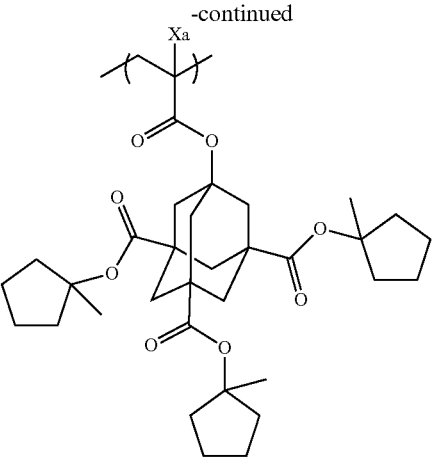
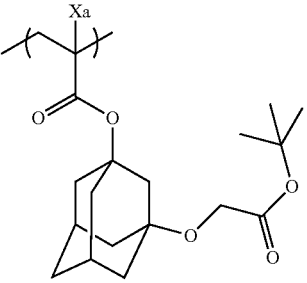
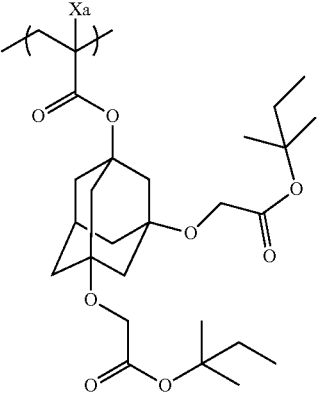
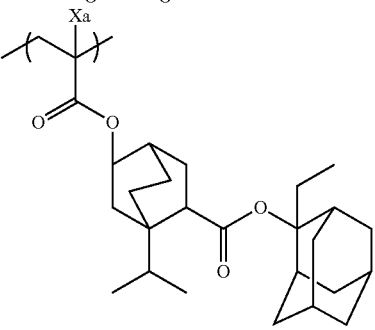
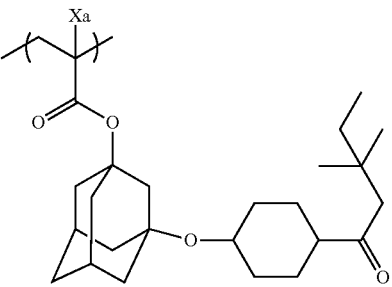

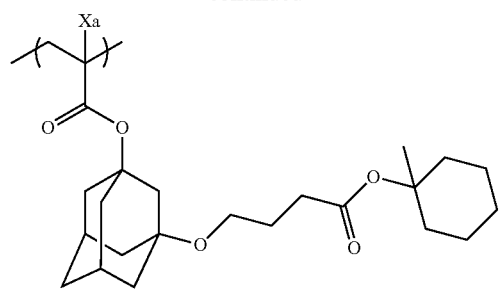
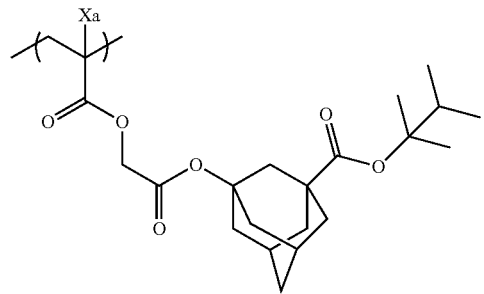
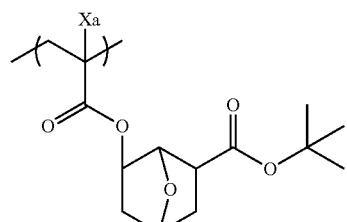
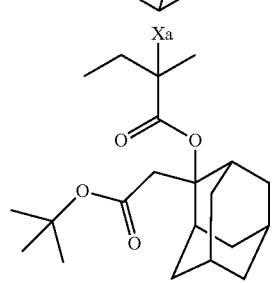
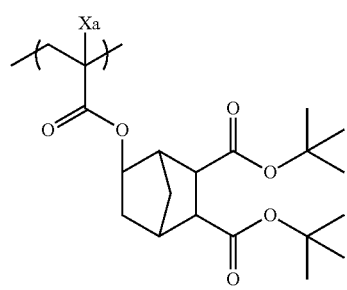
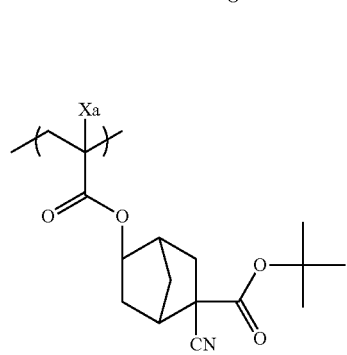
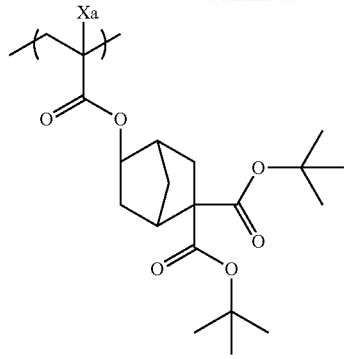
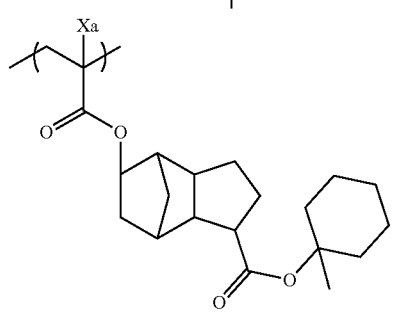
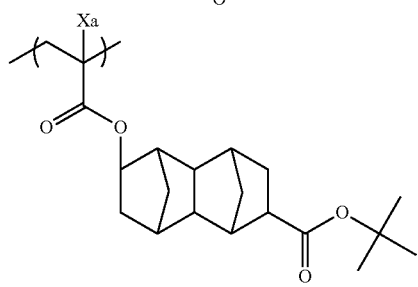
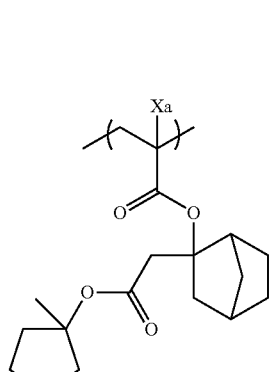
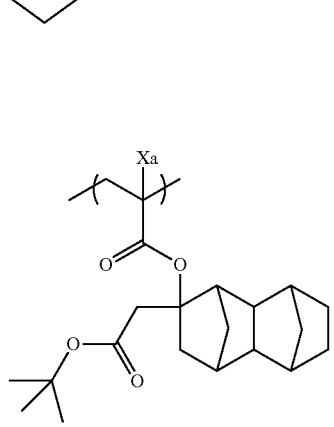

31
-continued
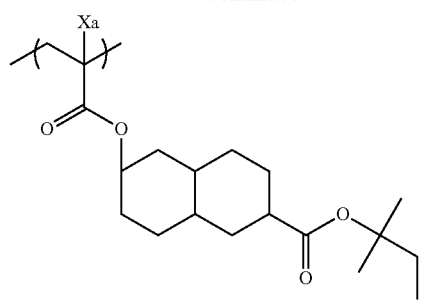
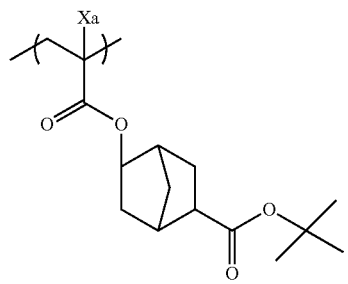
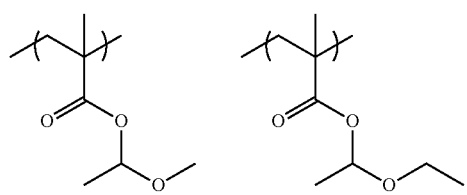
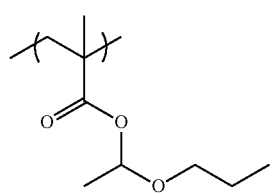
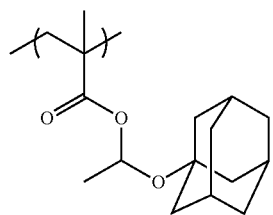
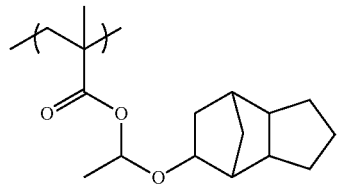
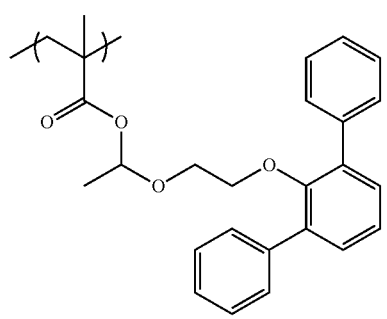
32
-continued
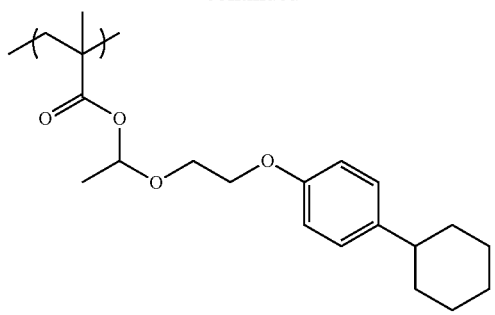
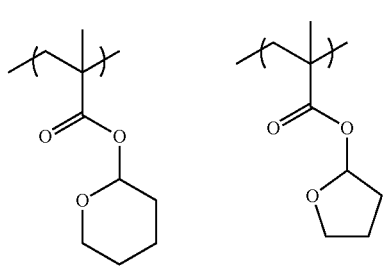
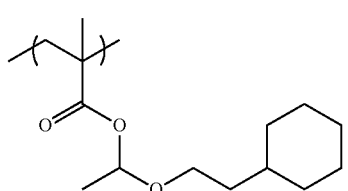
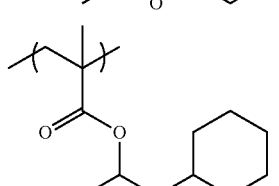
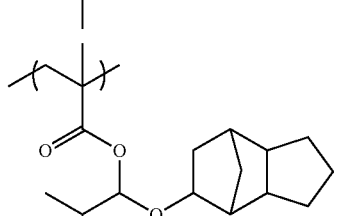
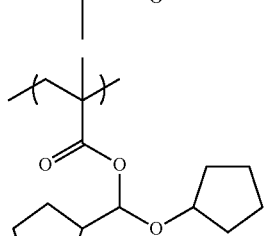
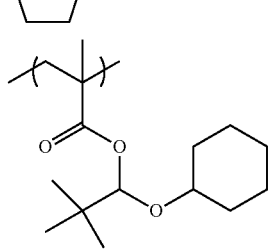

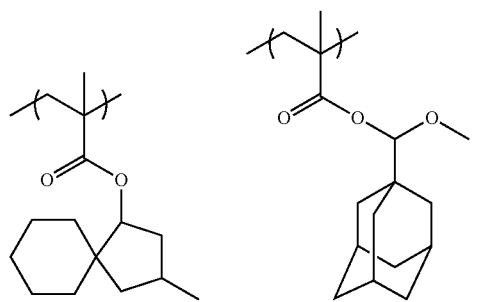
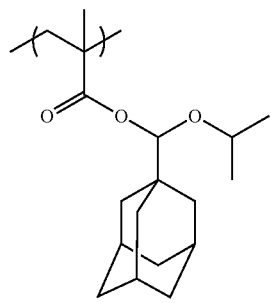
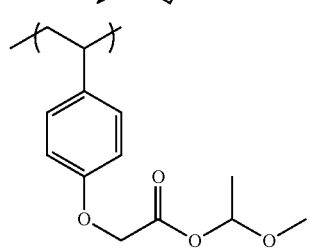
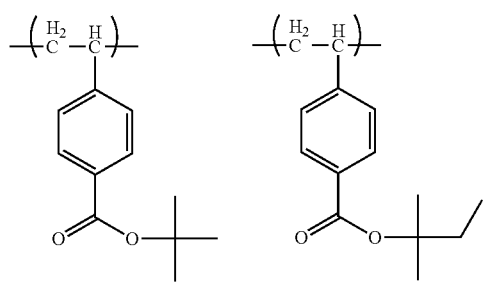
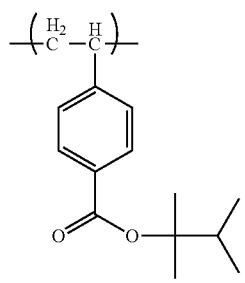
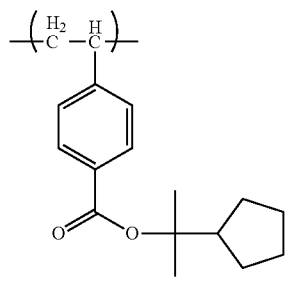
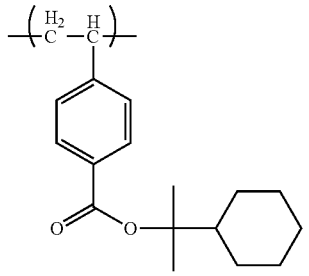
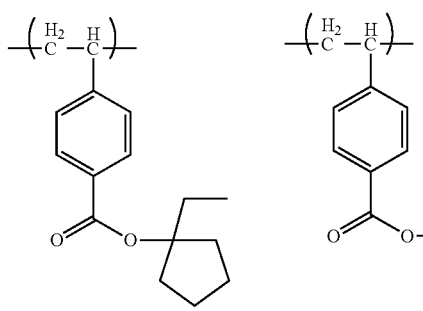
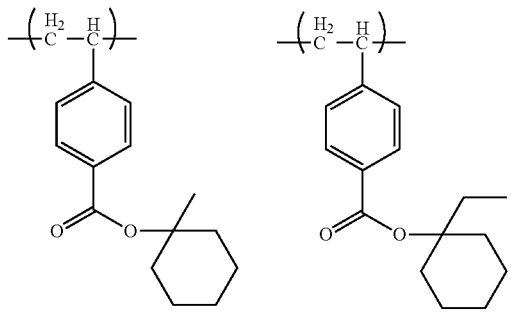
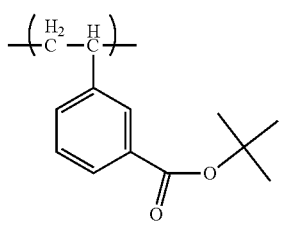
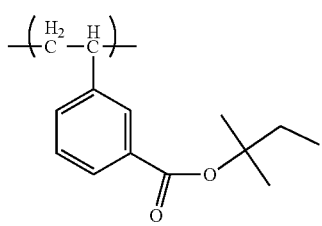
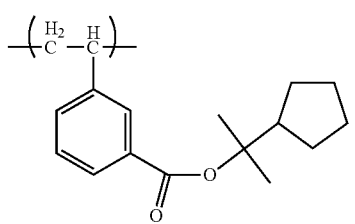

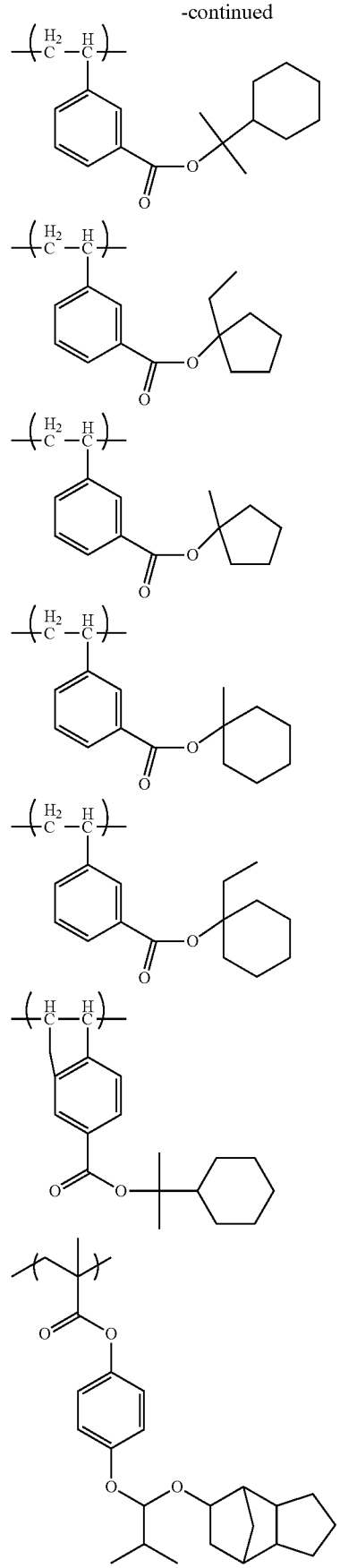
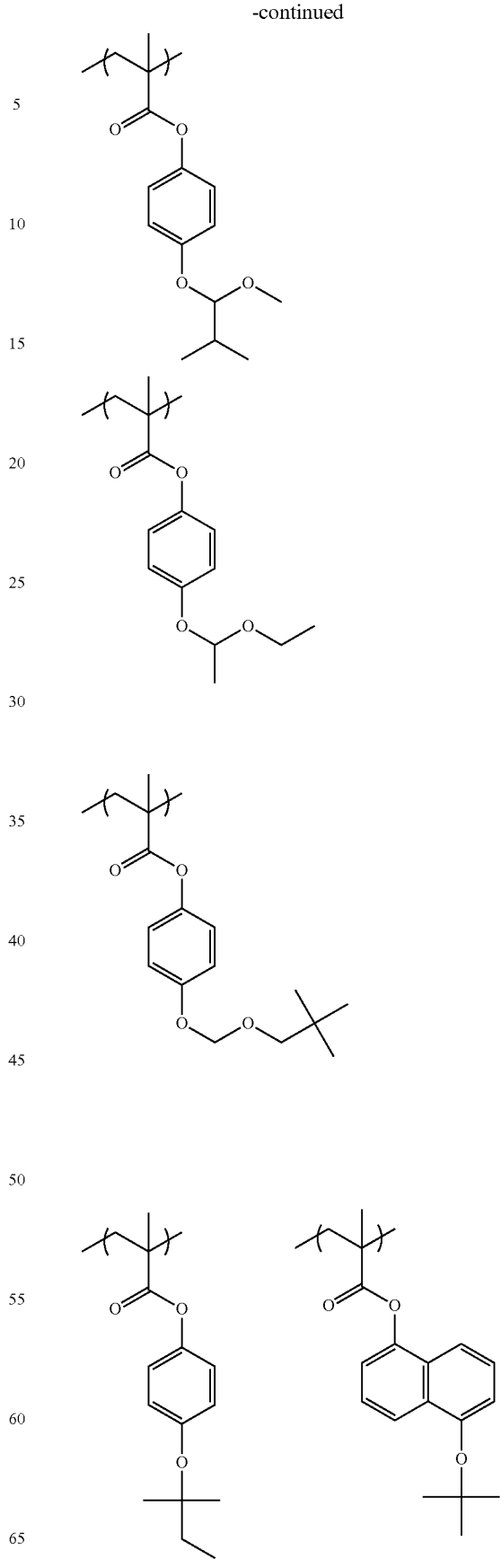

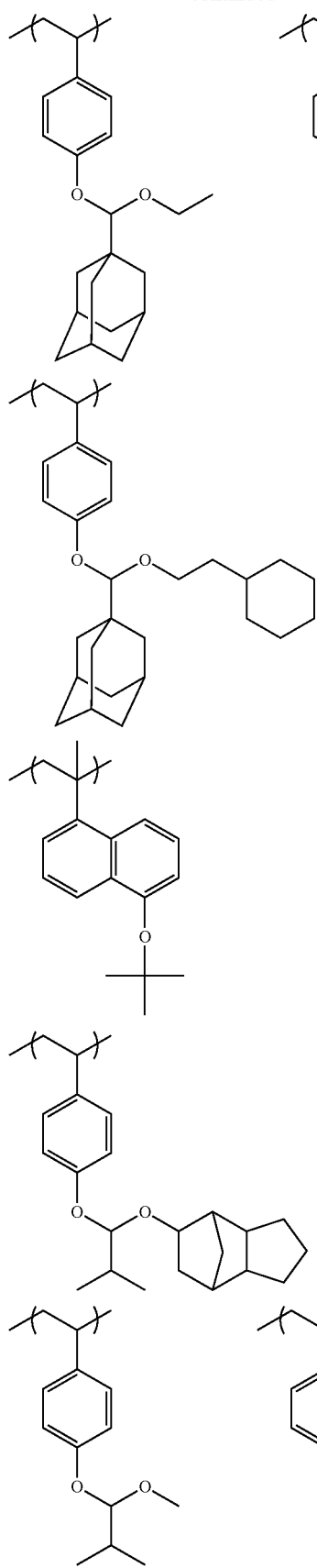
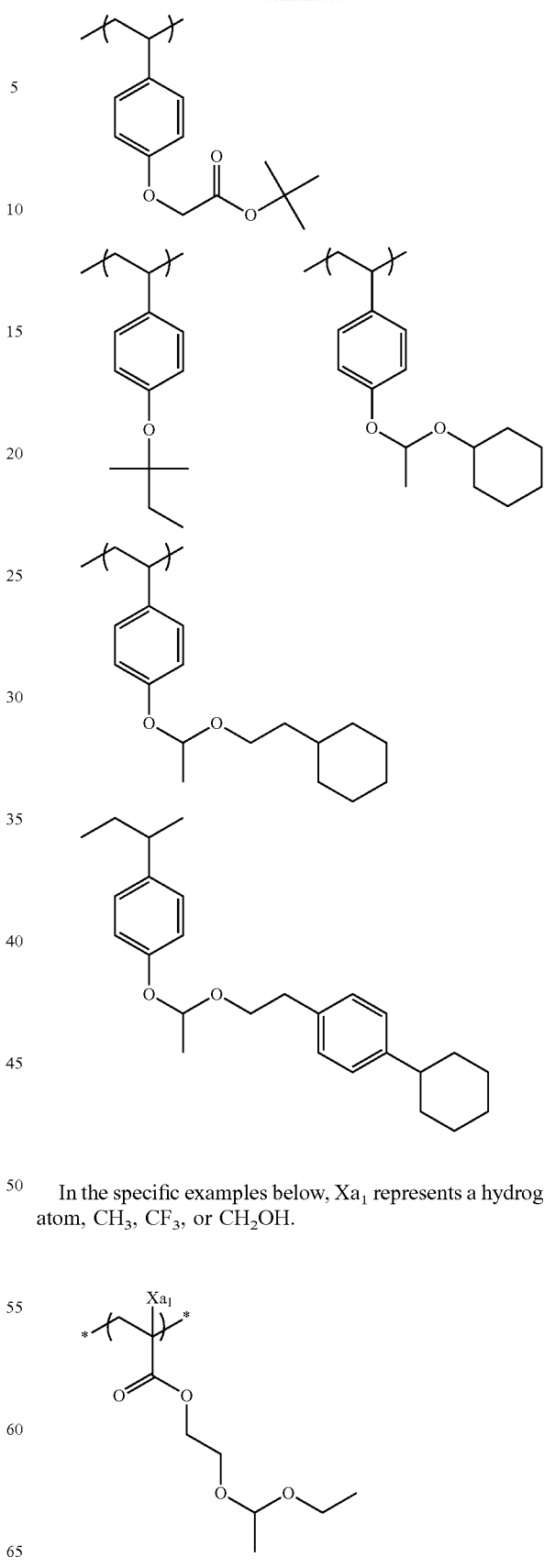
In the specific examples below, Xa₁ represents a hydrogen atom, CH₃, CF₃, or CH₂OH.

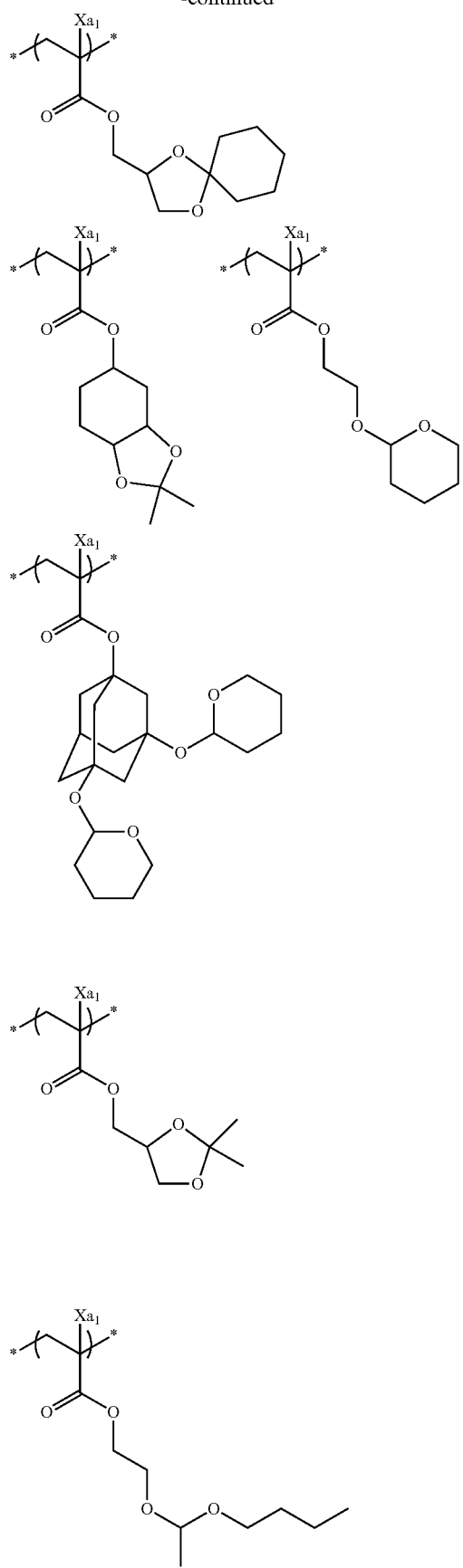
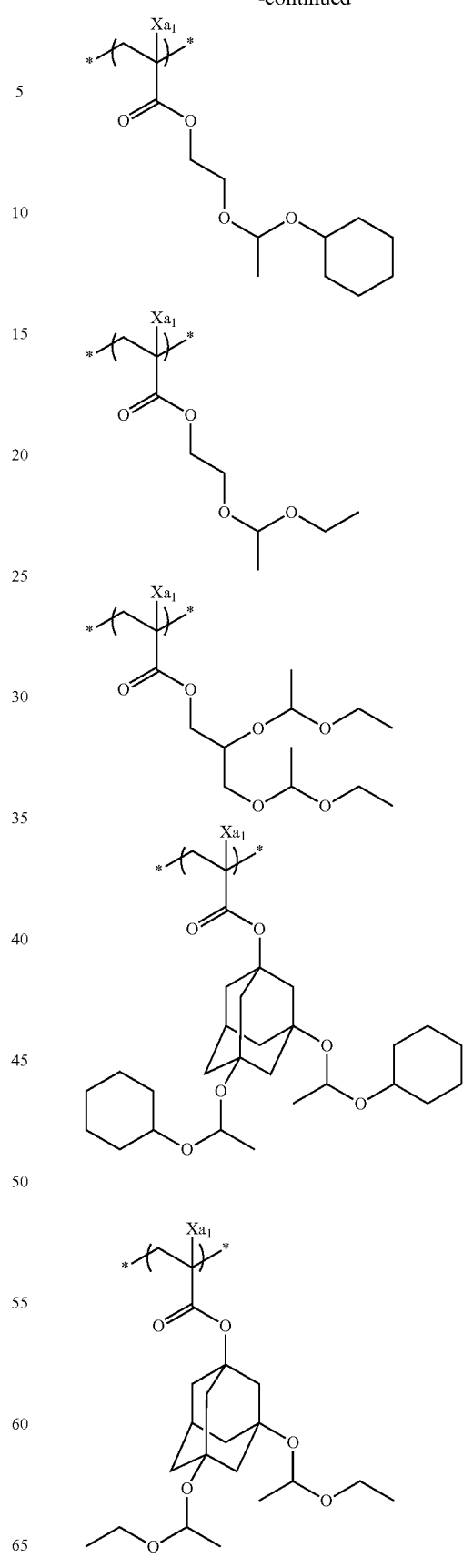

-continued

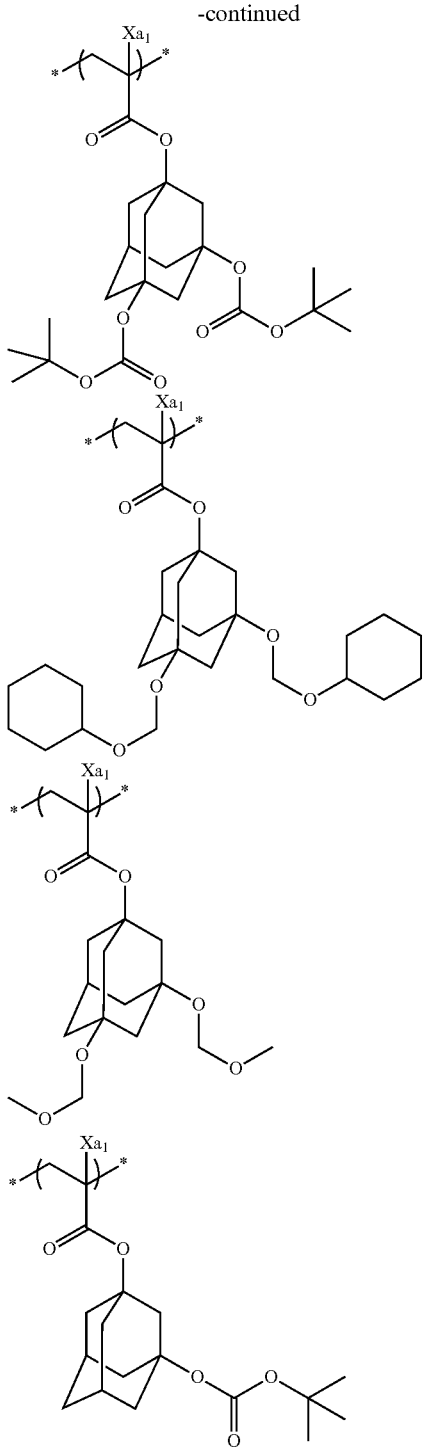

The repeating unit having the acid-decomposable group may be used either alone or in combination of two or more kinds thereof.

The content of the repeating unit having an acid-decomposable group contained in the resin (A) (or the sum in the case where a plurality of repeating units having an acid-decomposable group is present) is preferably 15 mol % or more, more preferably 20 mol % or more, still more preferably 25 mol % or more, and particularly preferably 40 mol % or more based on all repeating units of the resin (A).

The resin (A) may contain a repeating unit having a lactone structure or a sultone structure.

Hereinafter, the specific examples of the repeating unit having a group having a lactone structure or a sultone structure will be described, but the present invention is not limited thereto.

(In Formula, Rx represents H, $CH_3$, $CH_2OH$, or $CF_3$.)

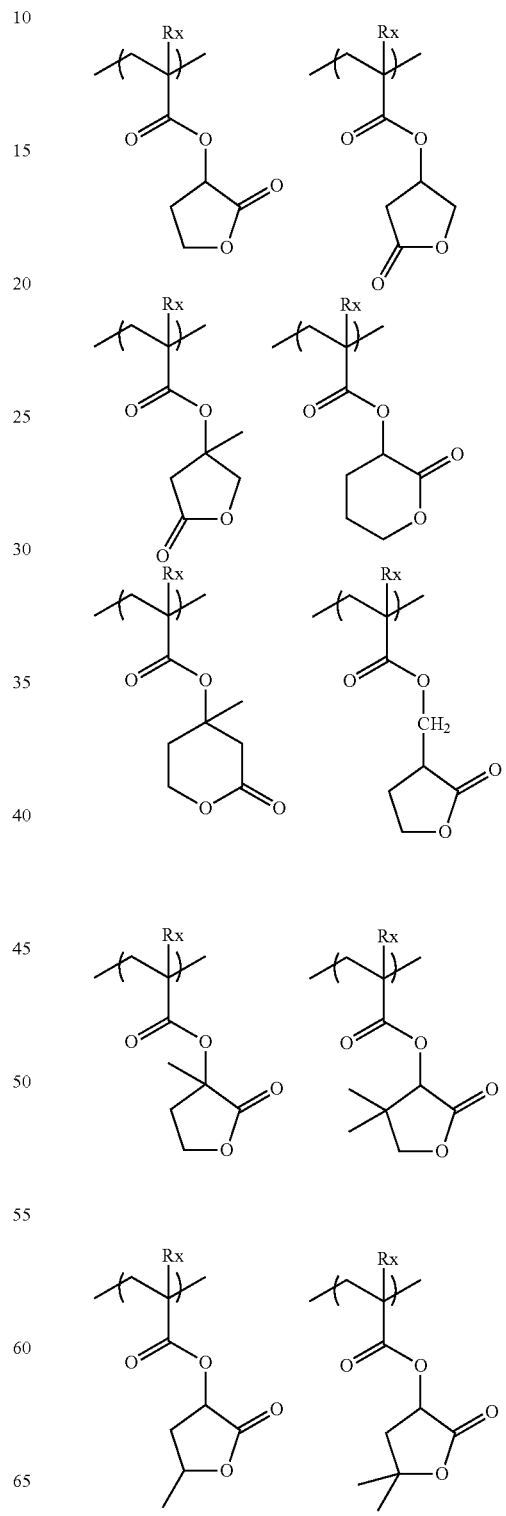

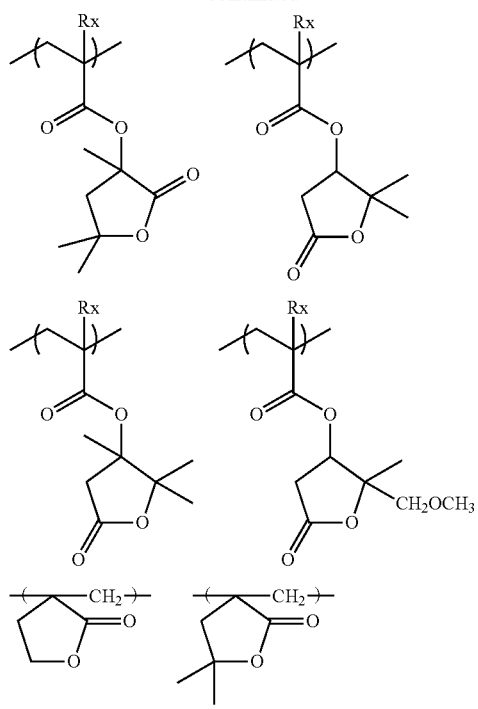
(In Formula, Rx represents H, CH₃, CH₂OH, or CF₃.)
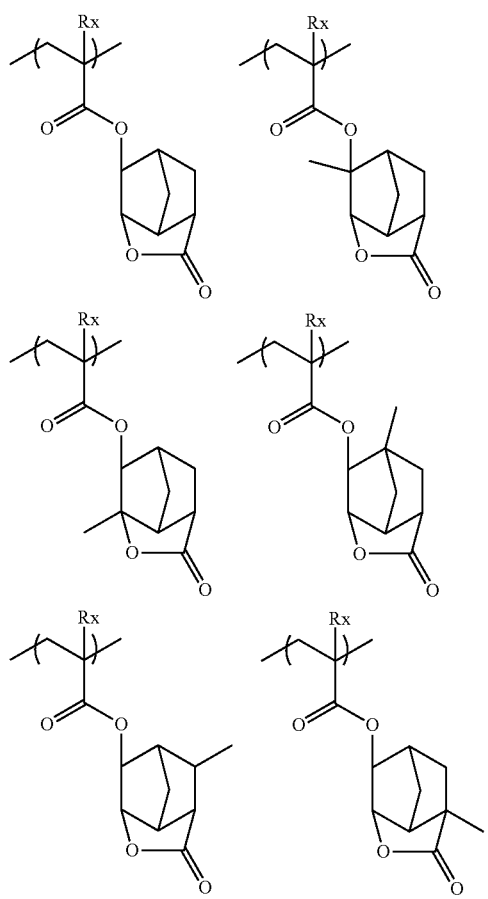
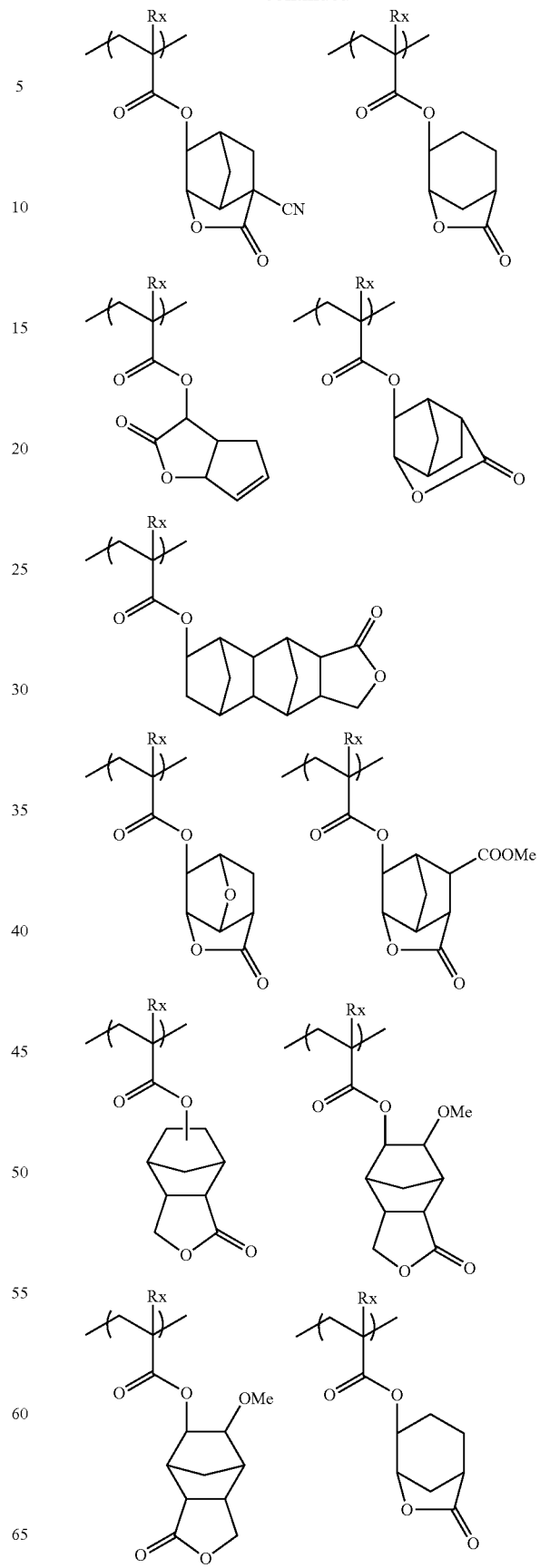

-continued
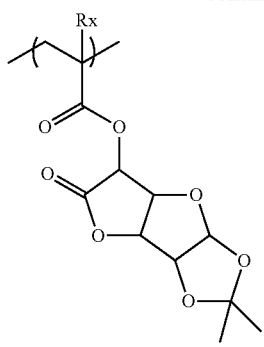
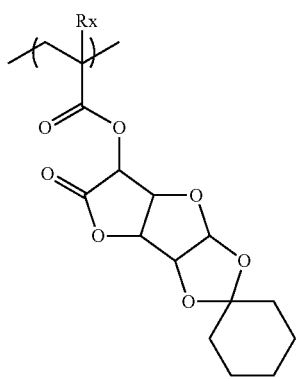
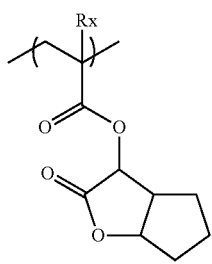 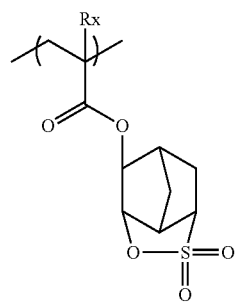
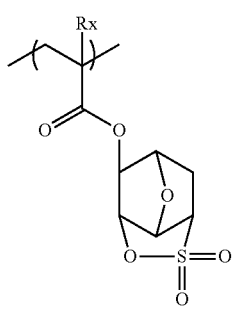
(In Formula, Rx represents H, CH₃, CH₂OH, or CF₃.)
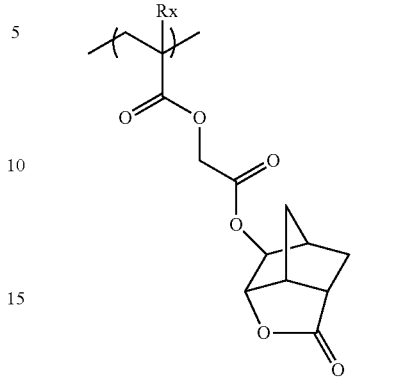
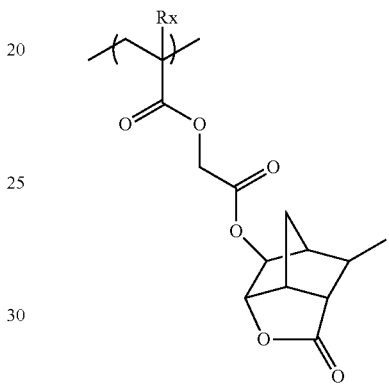
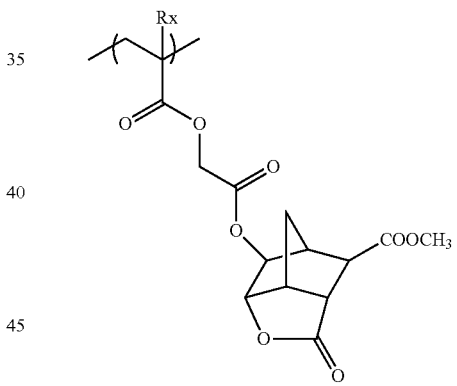
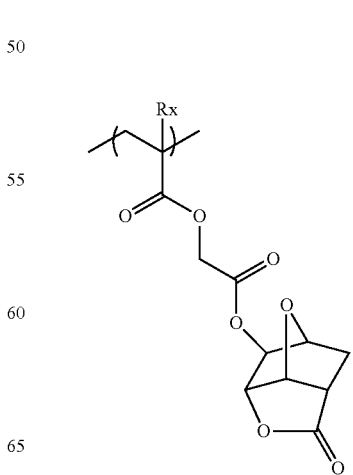

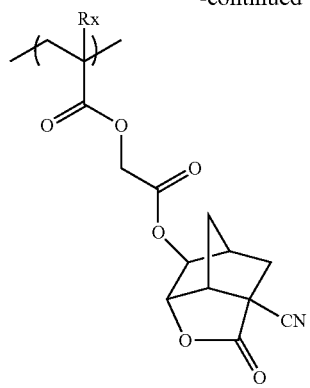
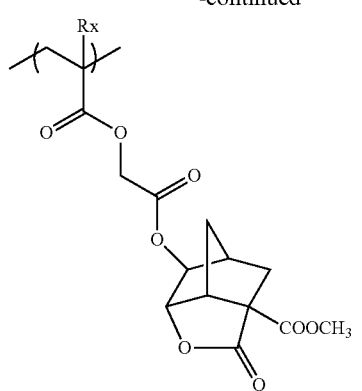
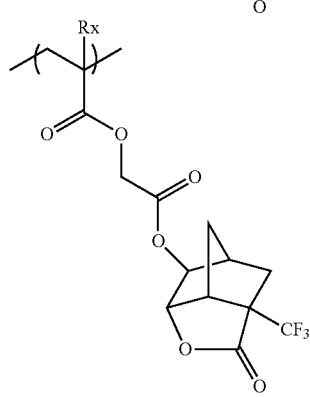
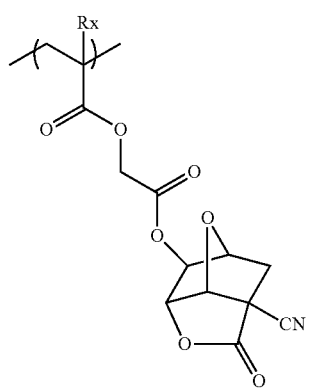
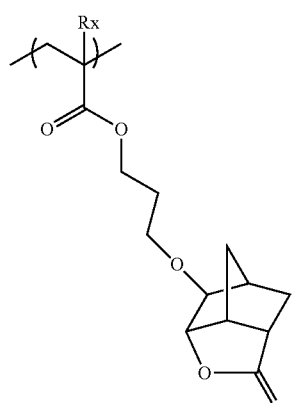
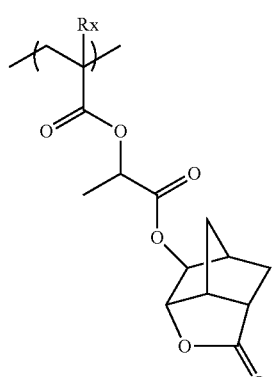
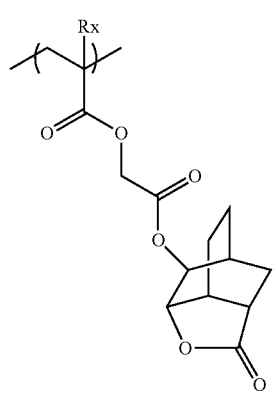
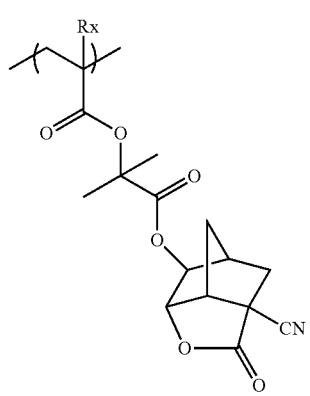

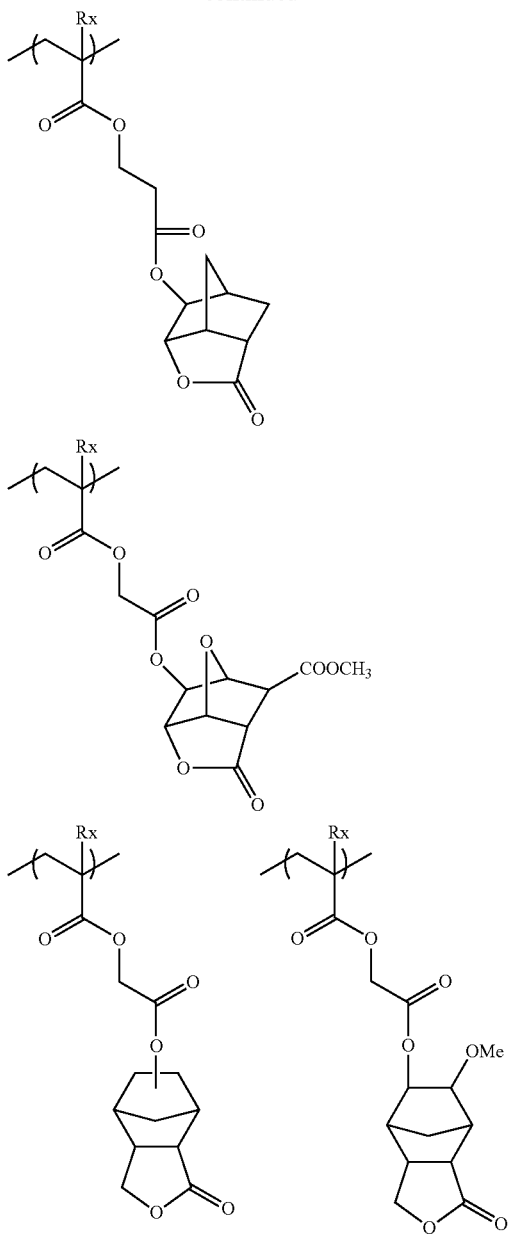
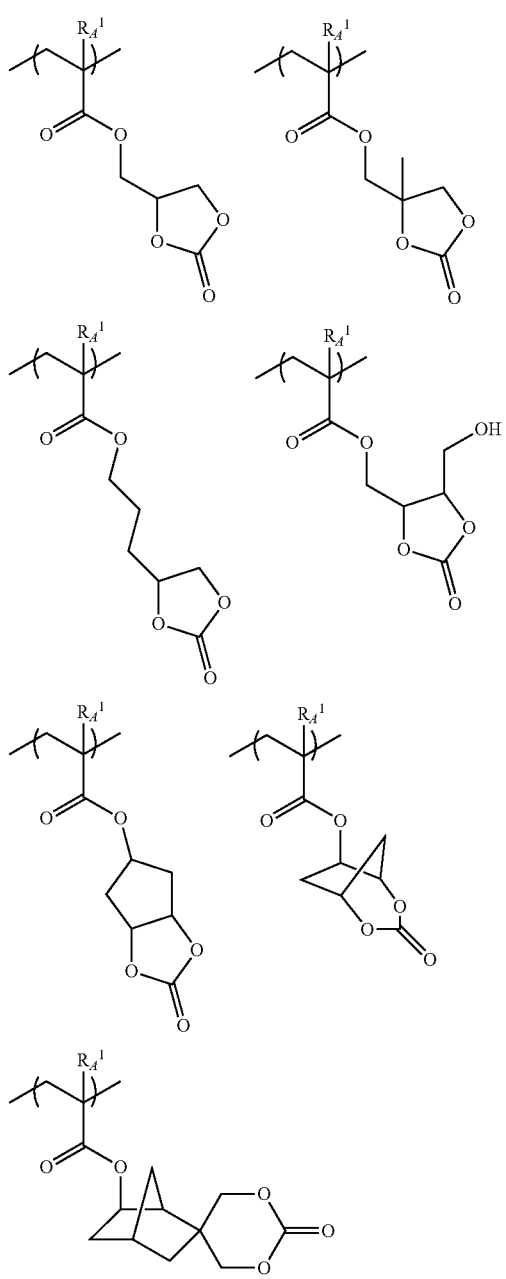

The repeating unit having a lactone structure or a sultone structure may be used in combination of two or more kinds thereof.

In the case where the resin (A) contains a repeating unit having a lactone structure or a sultone structure, the content of the repeating unit having a lactone structure or a sultone structure ranges preferably from 5 mol % to 60 mol %, more preferably from 5 mol % to 55 mol %, and still more preferably from 10 mol % to 50 mol % based on all repeating units of the resin (A).

Further, the resin (A) may have a repeating unit having a cyclic carbonate ester structure. Specific examples thereof are mentioned below, but the present invention is not limited thereto.

In the specific examples below, $R_A^1$ represents a hydrogen atom or an alkyl group (preferably, a methyl group).

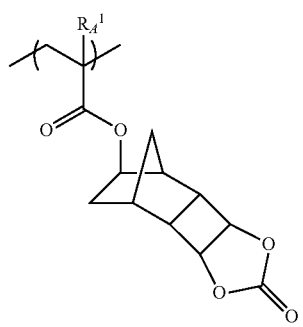

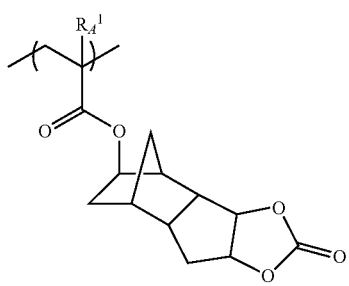
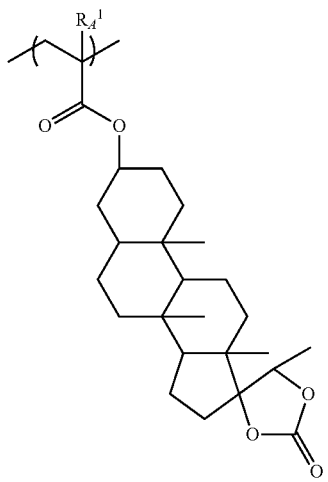
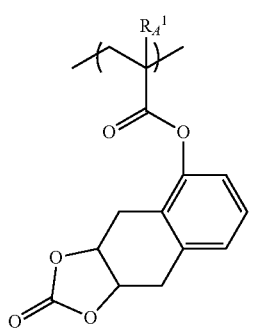
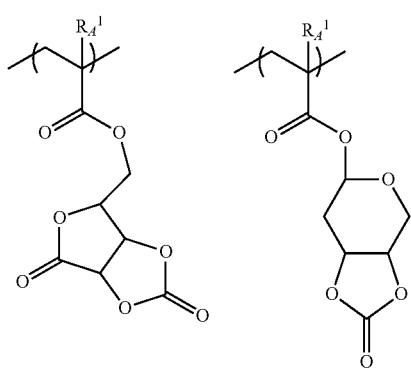
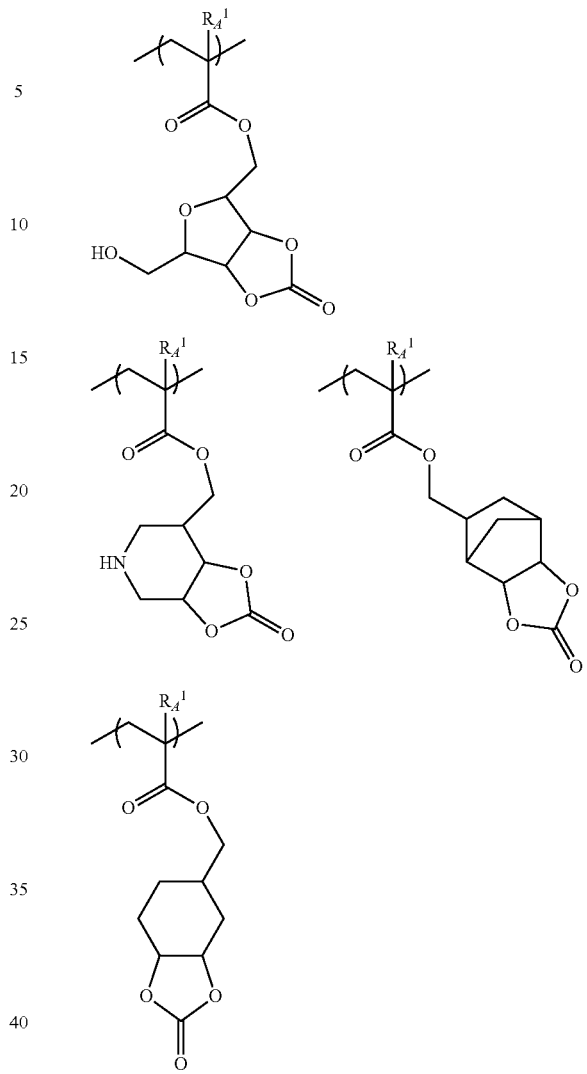
The resin (A) may have a repeating unit having a hydroxyl group or a cyano group.
Specific examples of the repeating unit having a hydroxyl group or a cyano group will be described below, but the present invention is not limited thereto.
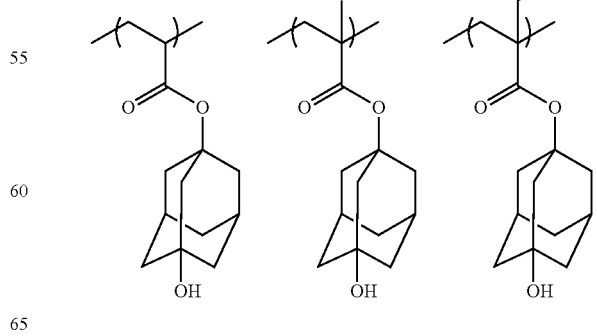

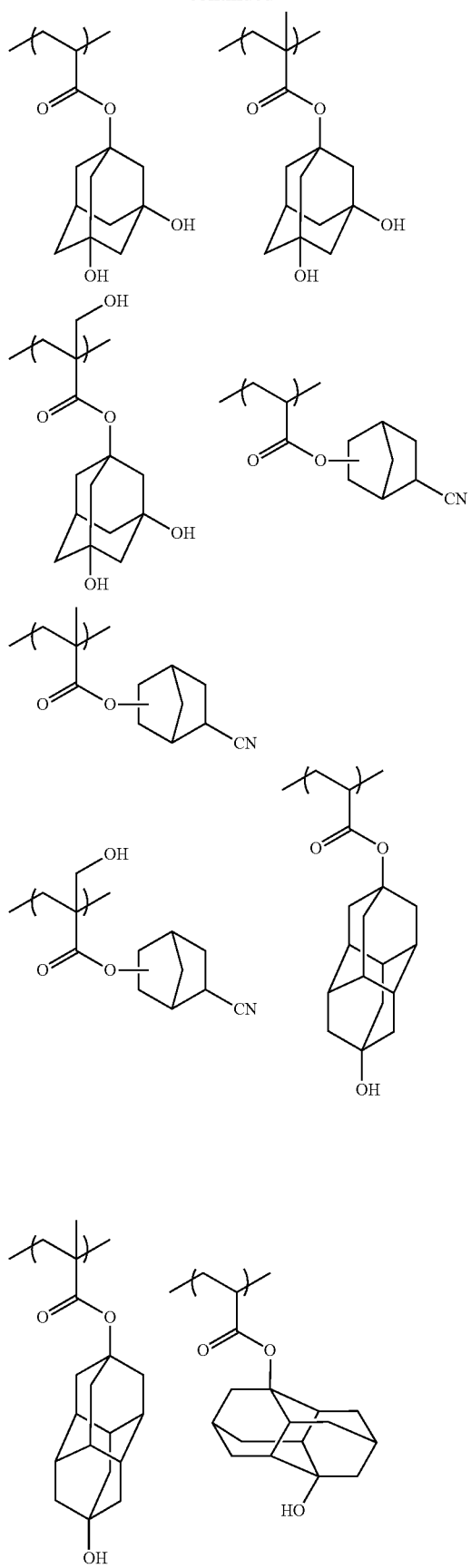
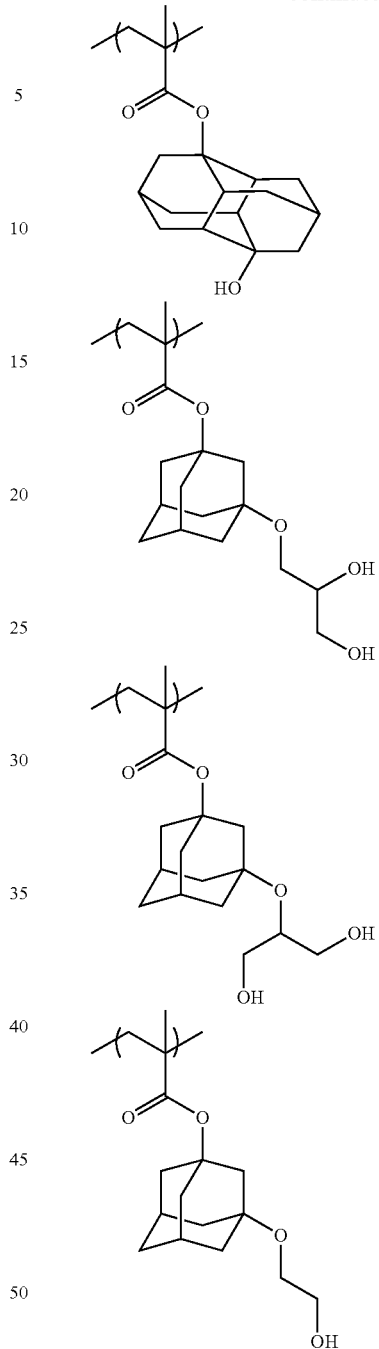

The resin (A) may have a repeating unit having an acid group.

The resin (A) may or may not contain a repeating unit having an acid group, but in the case of containing a repeating unit having an acid group, the content of the repeating unit having an acid group is preferably 25 mol % or less, and more preferably 20 mol % or less, based on all repeating units in the resin (A). When the resin (A) contains a repeating unit having an acid group, the content of the repeating unit having an acid group in the resin (A) is usually 1 mol % or more.

Specific examples of the repeating unit having an acid group will be described below, but the present invention is not limited thereto.

In the specific examples, Rx represents H, CH₃, CH₂OH or CF₃.

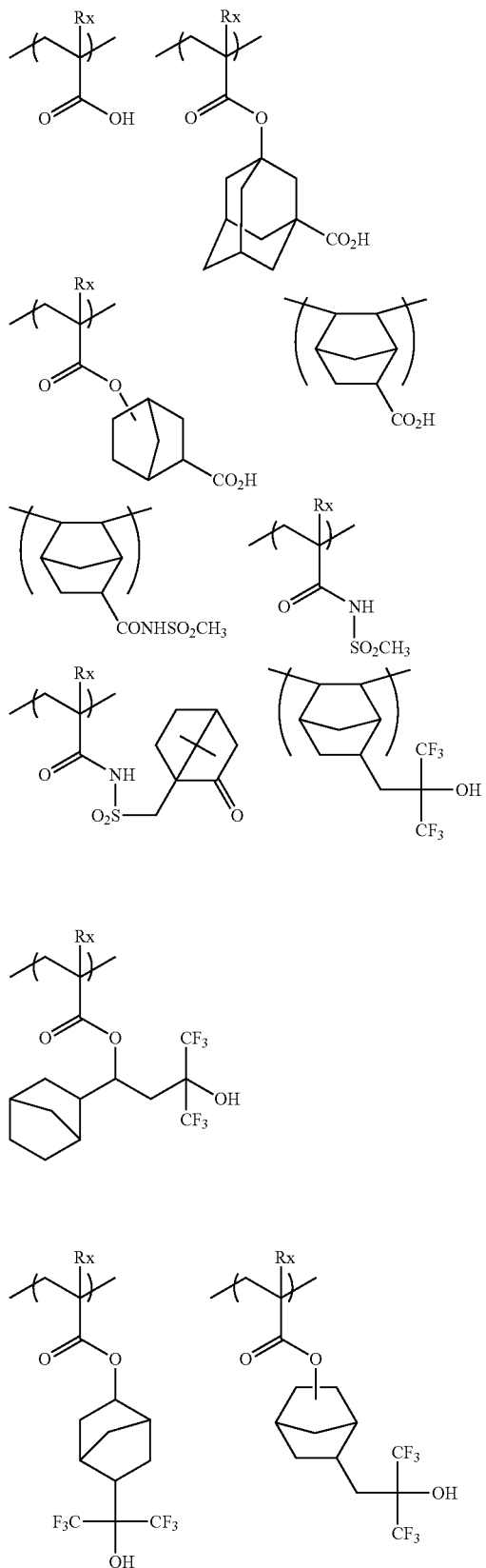

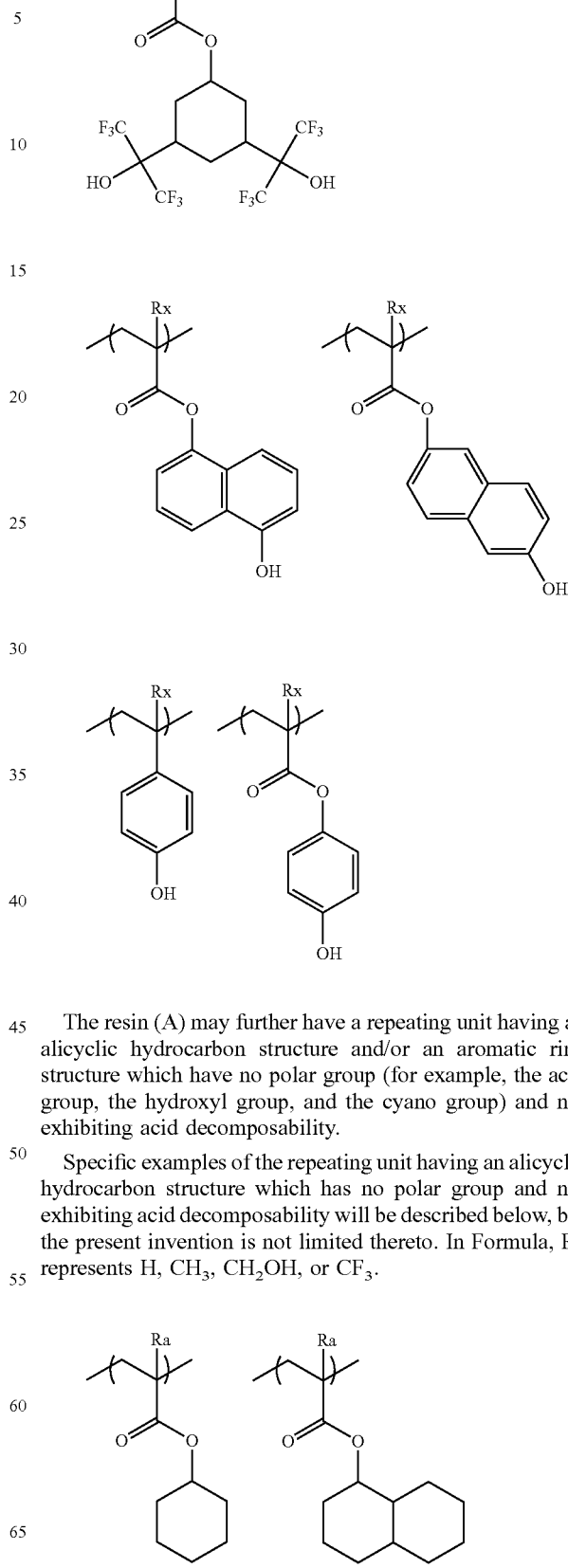

The resin (A) may further have a repeating unit having an alicyclic hydrocarbon structure and/or an aromatic ring structure which have no polar group (for example, the acid group, the hydroxyl group, and the cyano group) and not exhibiting acid decomposability.

Specific examples of the repeating unit having an alicyclic hydrocarbon structure which has no polar group and not exhibiting acid decomposability will be described below, but the present invention is not limited thereto. In Formula, Ra represents H, CH₃, CH₂OH, or CF₃.

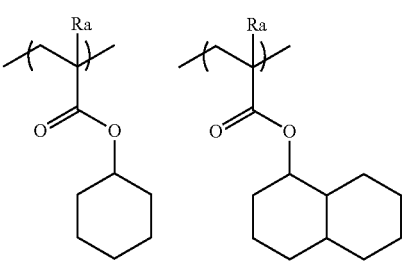

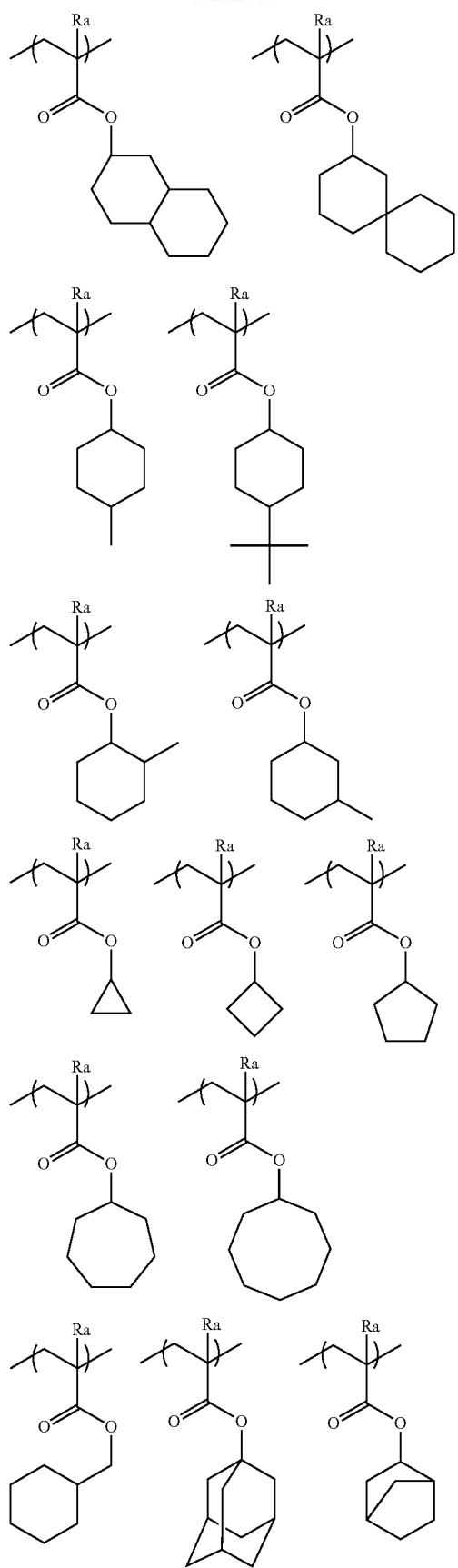
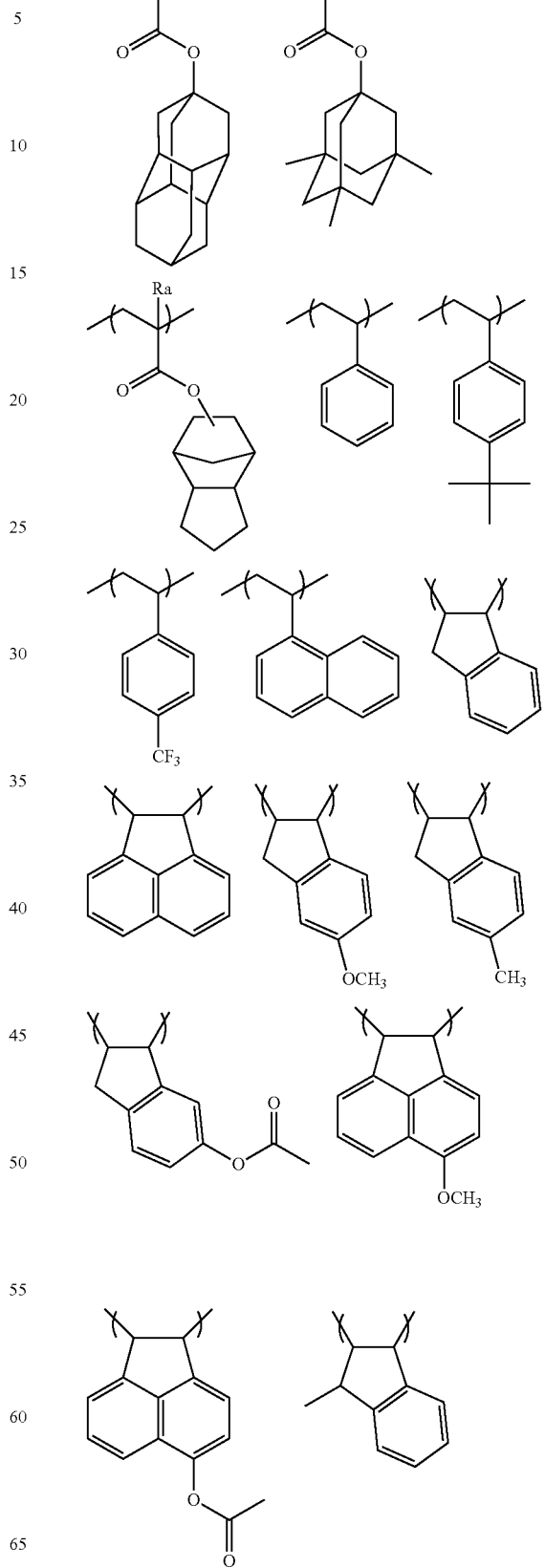

-continued

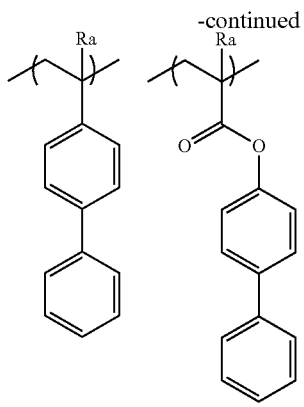

When the composition of the present invention is for ArF exposure, from the viewpoint of transparency to ArF light, the resin (A) used in the composition of the present invention preferably has substantially no aromatic ring (specifically, the ratio of a repeating unit having an aromatic group in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

The form of the resin (A) in the present invention may be any form of a random type, a block type, a comb type, and a star type. The resin (A) may be synthesized, for example, by polymerization of radicals, cations, or anions of an unsaturated monomer, corresponding to each structure. Further, it is also possible to obtain a target resin by using an unsaturated monomer corresponding to a precursor of each structure to perform polymerization, and then performing a polymer reaction.

When the composition of the present invention includes a resin (D) to be described below, it is preferred that the resin (A) contains no fluorine atom and no silicon atom from the viewpoint of compatibility with the resin (D).

The resin (A) used in the composition of the present invention is preferably a resin in which all the repeating units are composed of a (meth)acrylate-based repeating unit. In this case, it is possible to use any of a resin in which all the repeating units are methacrylate-based repeating units, a resin in which all the repeating units are an acrylate-based repeating unit, and a resin in which all the repeating units are composed of methacrylate-based repeating units and acrylate-based repeating units, but it is preferred that the acrylate-based repeating unit is present in an amount of 50 mol % or less based on all the repeating units.

In the case where KrF excimer laser light, electron beam, X-ray or high-energy beam having a wavelength of 50 nm or less (EUV and the like) is irradiated on the composition of the present invention, the resin (A) may have a repeating unit having an aromatic ring. The repeating unit having an aromatic ring is not particularly limited, and is exemplified in the above described descriptions of the repeating units. Examples thereof may include a styrene unit, a hydroxystyrene unit, a phenyl(meth)acrylate unit, and a hydroxyphenyl (meth)acrylate. More specifically, examples of the resin (A) may include a resin having a hydroxystyrene-based repeating unit, and a hydroxystyrene-based repeating unit protected by an acid-decomposable group, and a resin having a repeating unit having the aromatic ring, and a repeating unit in which a carboxylic acid moiety of (meth)acrylic acid is protected by an acid-decomposable group.

The resin (A) in the present invention may be synthesized and purified by a conventional method (e.g., radical polymerization). In regard to the synthesis and purification methods, see, e.g., the description in paragraphs 0201 to 0202 of Japanese Patent Application Laid-Open No. 2008-292975.

The weight average molecular weight of the resin (A) in the present invention is 7,000 or more as described above, preferably in a range of 7,000 to 200,000, more preferably 7,000 to 50,000, still more preferably 7,000 to 40,000, and particularly preferably 7,000 to 30,000, in terms of polystyrene by the GPC method. If the weight average molecular weight is less than 7,000, the solubility in an organic developer becomes higher, and thus, there is a concern that a fine pattern may not be formed.

The polydispersity (molecular weight distribution) is usually in a range of 1.0 to 3.0, preferably 1.0 to 2.6, more preferably 1.0 to 2.0, and particularly preferably 1.4 to 2.0. The smaller the molecular weight distribution is, the better the resolution and resist shape are, and the smoother the side wall of the resist pattern is, and thus roughness is excellent.

In the chemical amplification resist composition of the present invention, the blending ratio of the resin (A) in the entire composition ranges preferably from 30% by mass to 99% by mass, and more preferably from 60% by mass to 95% by mass, based on the total solid.

Further, in the present invention, the resin (A) may be used either alone or in combination of two or more thereof.

Hereinafter, specific examples of the resin (A) (the composition ratio of the repeating units is mol %) will be described, but the present invention is not limited thereto. Also, hereinafter, an aspect in a case where a structure corresponding to an acid generator (B) to be described below is carried on the resin (A) will be exemplified.

[Chem. 20]

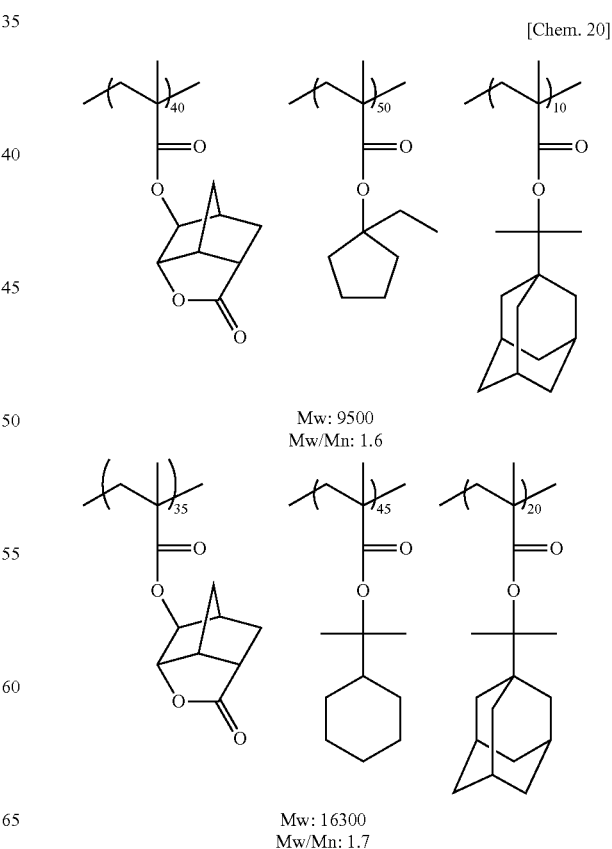

Mw: 9500
Mw/Mn: 1.6

Mw: 16300
Mw/Mn: 1.7

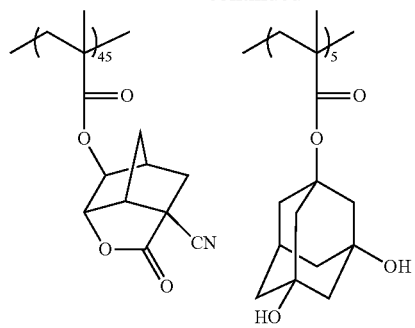
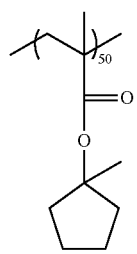
Mw: 11100
Mw/Mn: 1.6
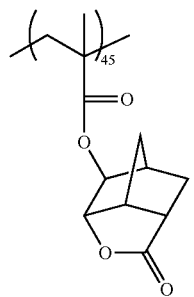
Mw: 18000
Mw/Mn: 1.70
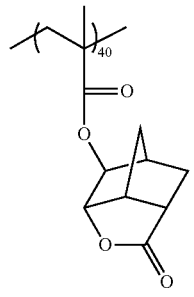
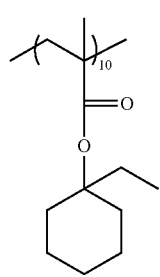
Mw: 13500
Mw/Mn: 1.7
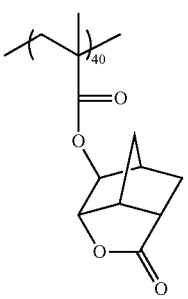
Mw: 15500
Mw/Mn: 1.7
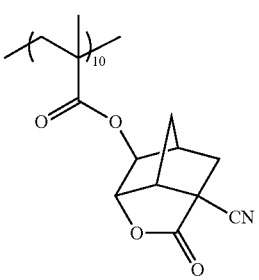
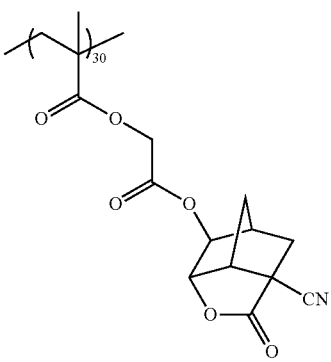
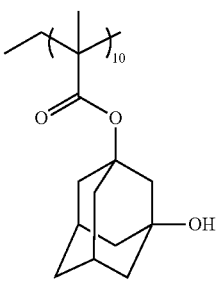
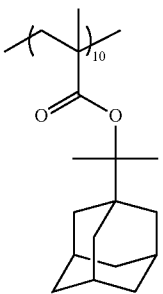
Mw: 10900
Mw/Mn: 1.6

-continued
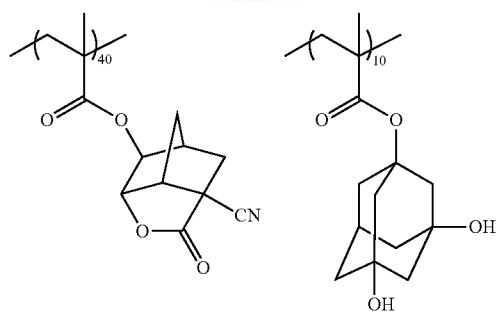
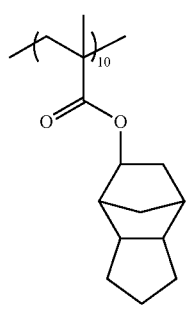
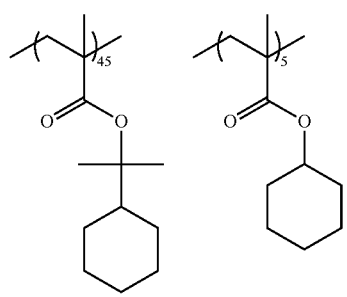
Mw: 10200
Mw/Mn: 1.7
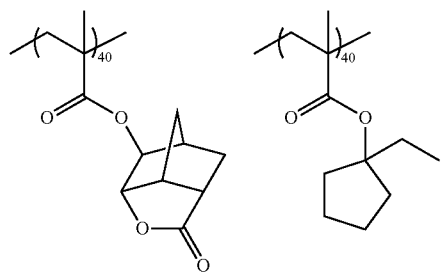
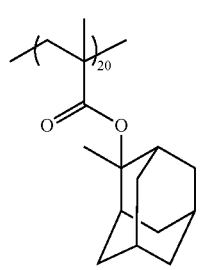
Mw: 10300
Mw/Mn: 1.7
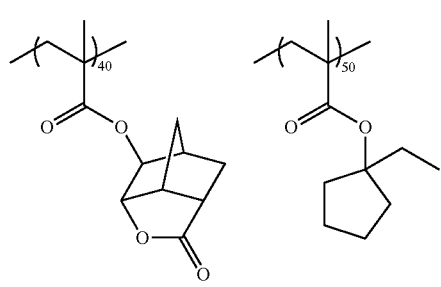
-continued
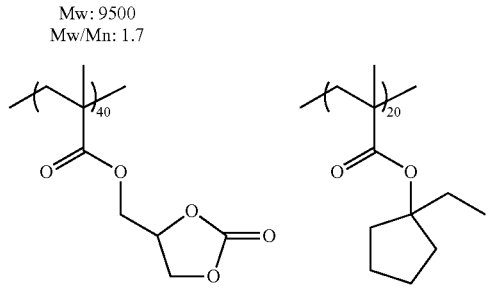
Mw: 9500
Mw/Mn: 1.7
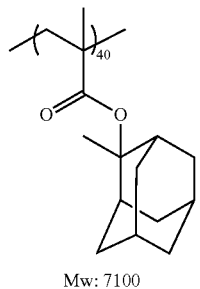
Mw: 7100
Mw/Mn: 1.6
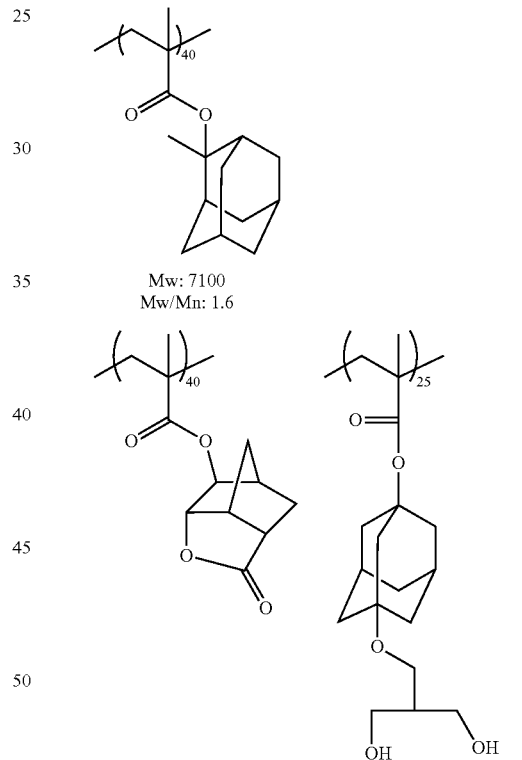
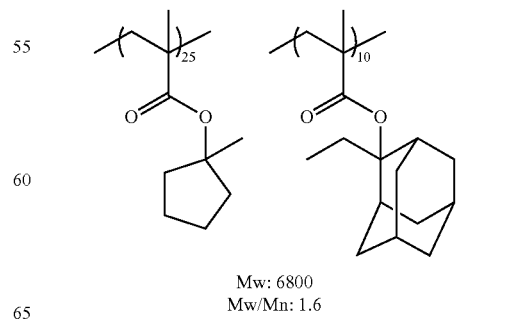
Mw: 6800
Mw/Mn: 1.6

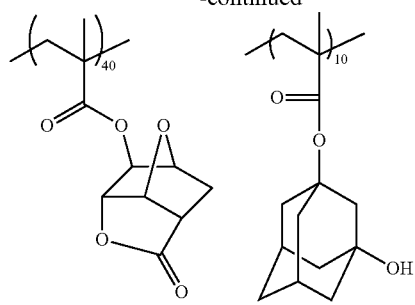
Mw: 10800
Mw/Mn: 1.7
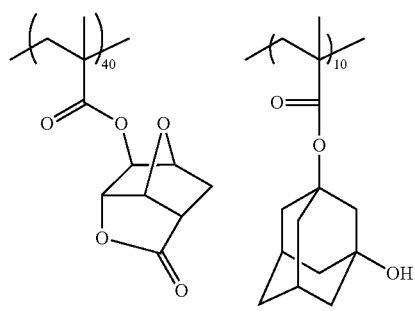
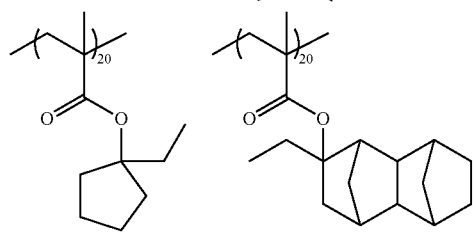
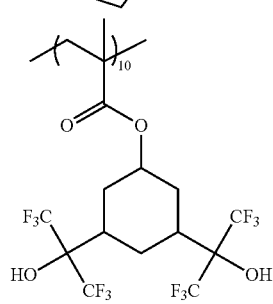
Mw: 9600
Mw/Mn: 1.7
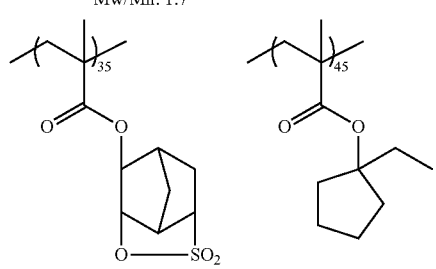
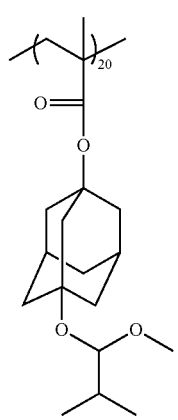
Mw: 10500
Mw/Mn: 1.6
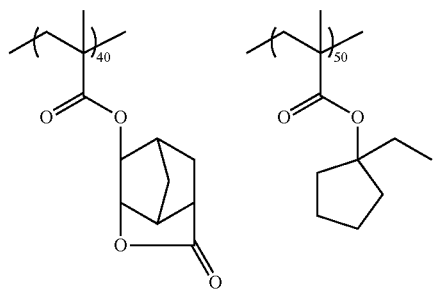
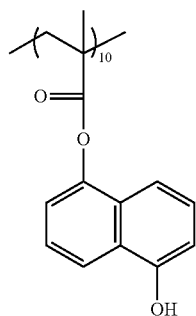
Mw: 8900
Mw/Mn: 1.7
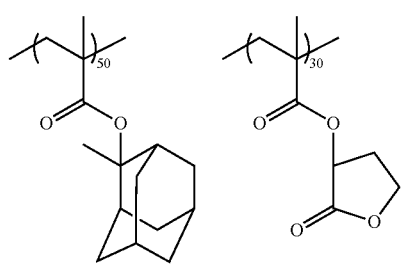

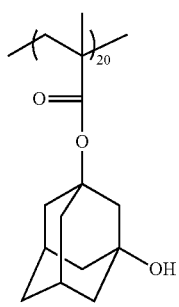
Mw: 11000
Mw/Mn: 1.7
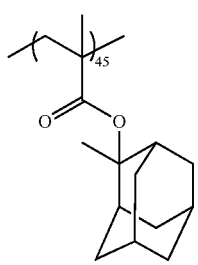 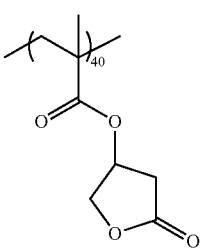
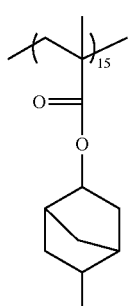
Mw: 9800
Mw/Mn: 1.7
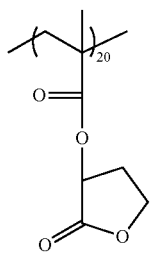 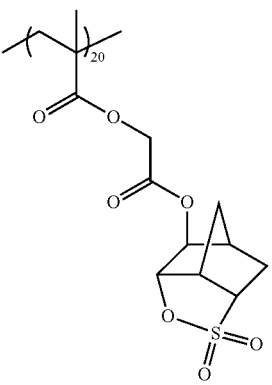
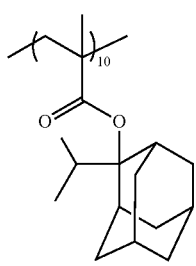 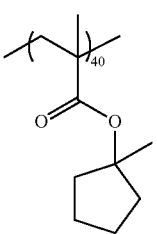
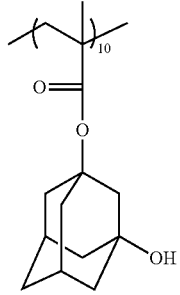
Mw: 11200
Mw/Mn: 1.6
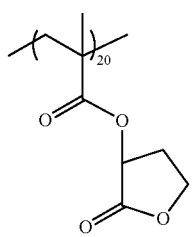 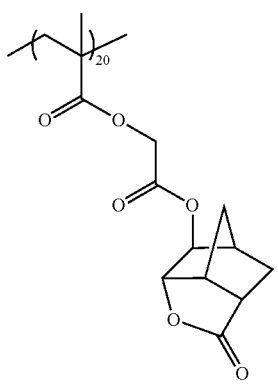
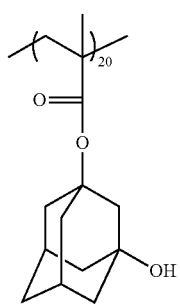 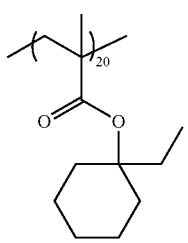
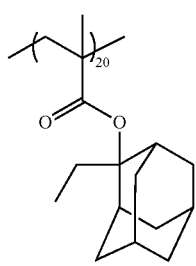
Mw: 9500
Mw/Mn: 1.7
The resin to be exemplified below is an example of a resin properly used in particular, at EUV exposure or electron beam exposure.

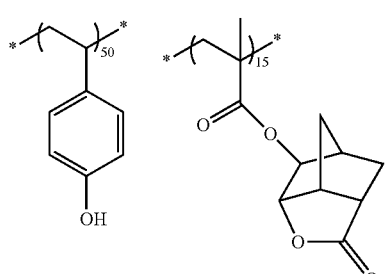
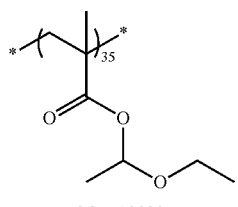
Mw: 10000
Mw/Mn: 1.6
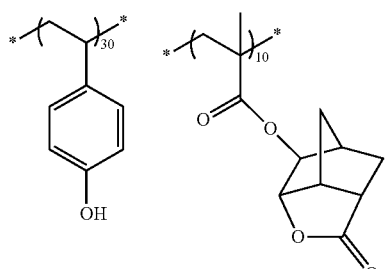
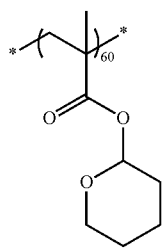
Mw: 8800
Mw/Mn: 1.7
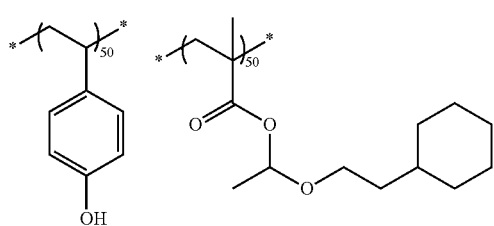
Mw: 8800
Mw/Mn: 1.7
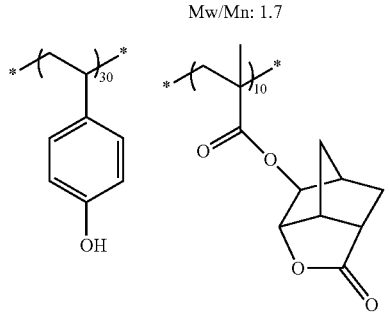
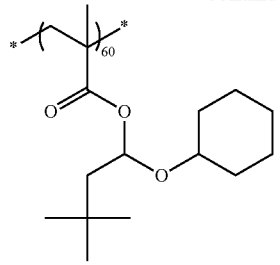
Mw: 20000
Mw/Mn: 1.7
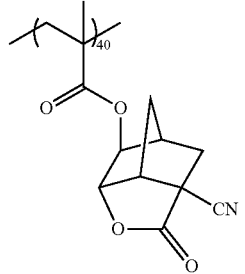 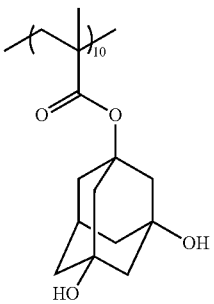
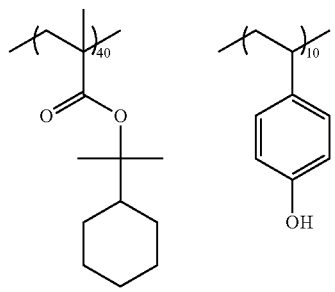
Mw = 10000
Mw/Mn = 1.60
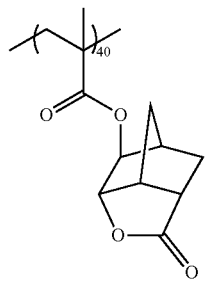 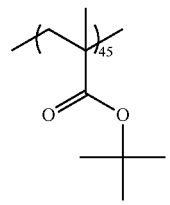
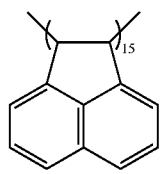
Mw = 7500
Mw/Mn = 1.50

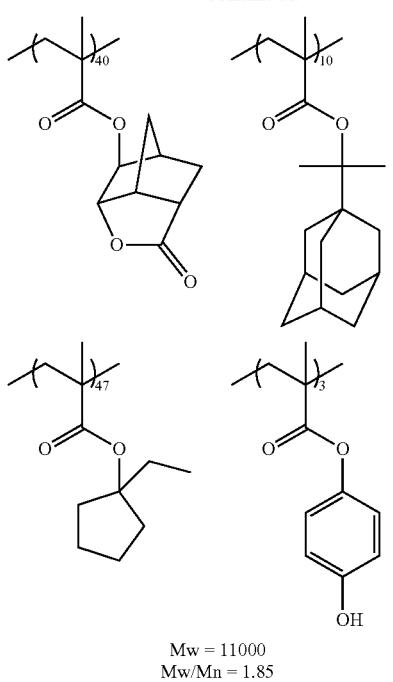
Mw = 11000
Mw/Mn = 1.85
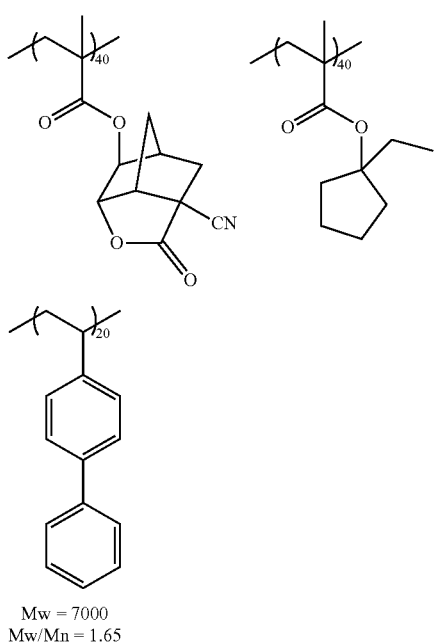
Mw = 7000
Mw/Mn = 1.65
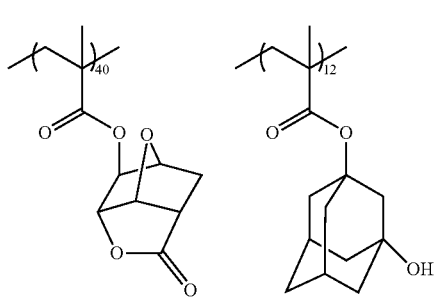
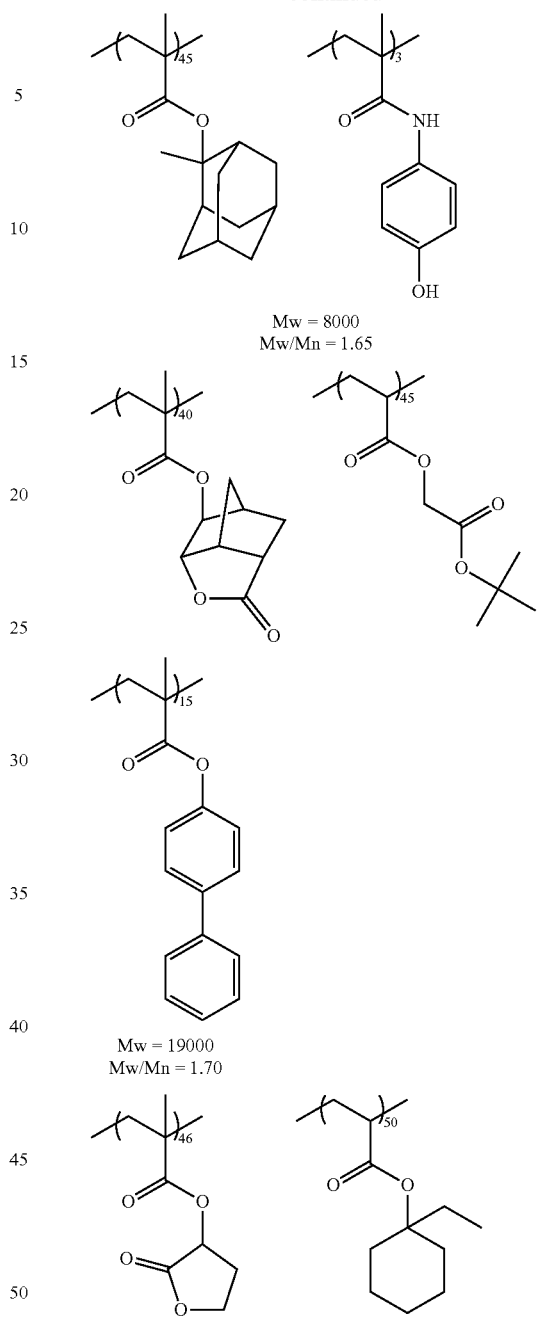
Mw = 8000
Mw/Mn = 1.65
Mw = 19000
Mw/Mn = 1.70
Mw = 26000
Mw/Mn = 1.85

-continued
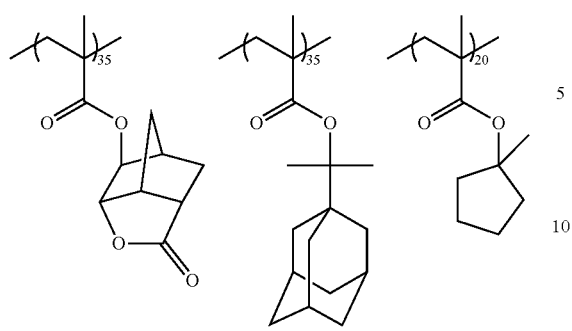
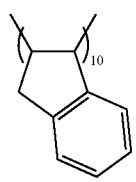
Mw = 21000
Mw/Mn = 1.60
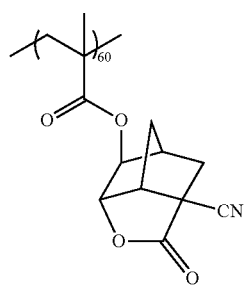 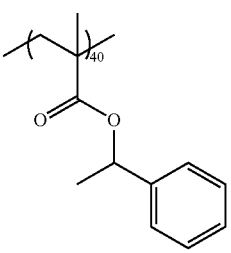
Mw = 6500
Mw/Mn = 1.50
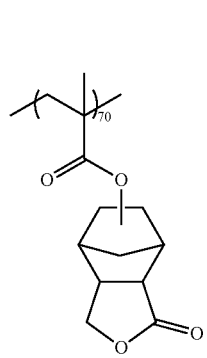
Mw = 8000
Mw/Mn = 1.85
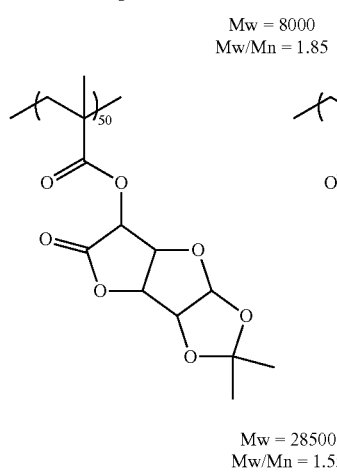
Mw = 28500
Mw/Mn = 1.55
-continued
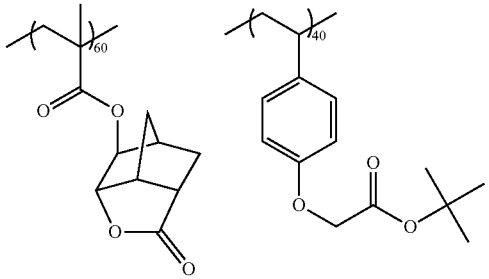
Mw = 7000
Mw/Mn = 1.65
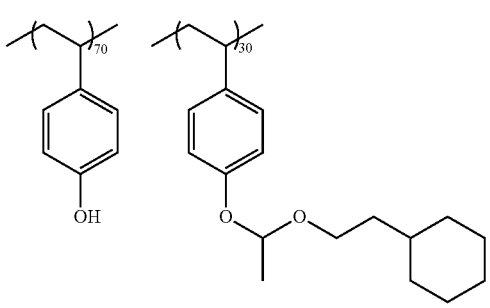
Mw = 15100
Mw/Mn = 1.40
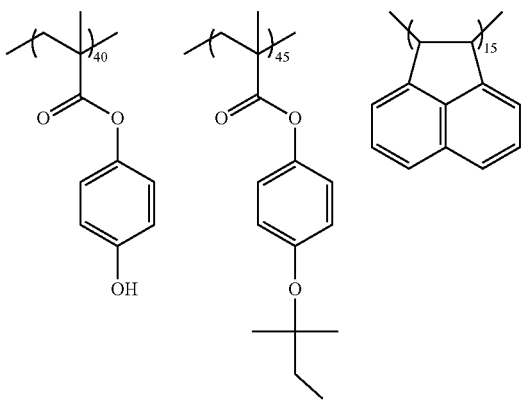
Mw = 8000
Mw/Mn = 1.35
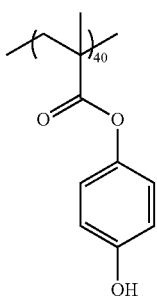

75
-continued
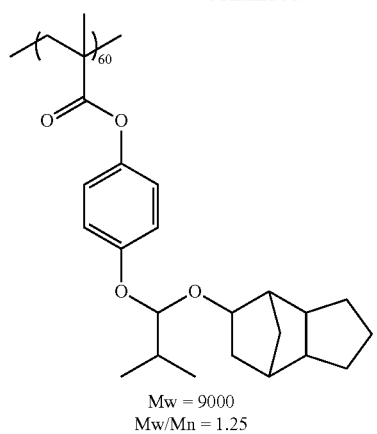
Mw = 9000
Mw/Mn = 1.25
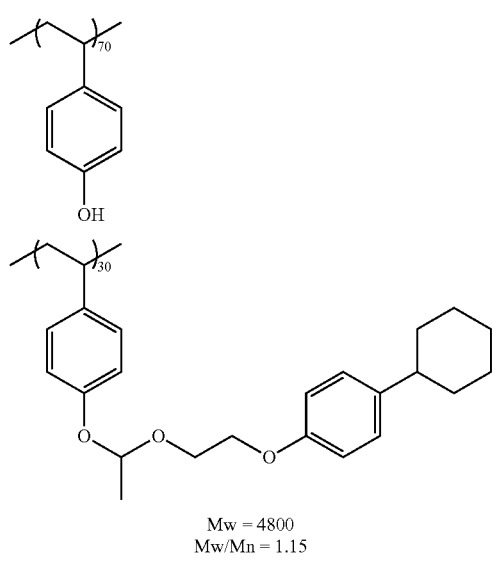
Mw = 4800
Mw/Mn = 1.15
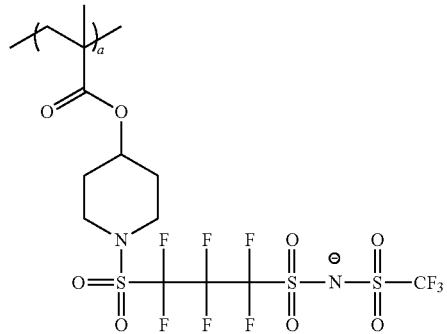
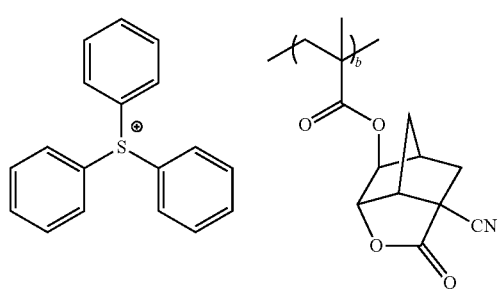
76
-continued
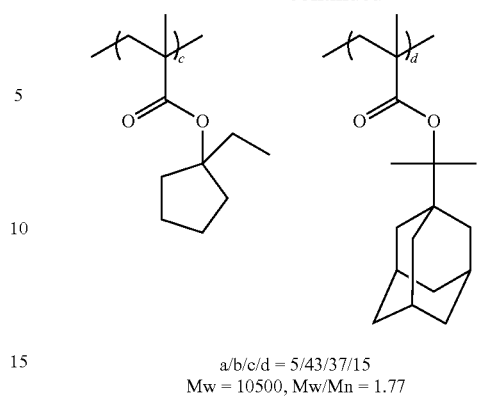
a/b/c/d = 5/43/37/15
Mw = 10500, Mw/Mn = 1.77
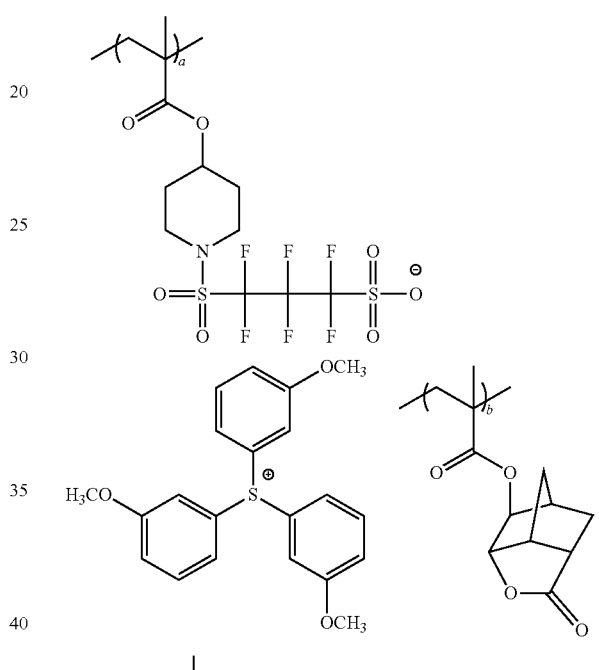
a/b/c= 10/30/60
Mw = 8500, Mw/Mn = 1.78
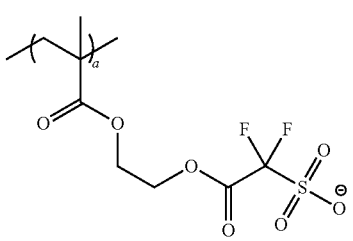

77
-continued
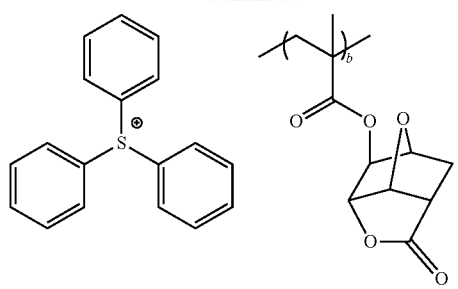
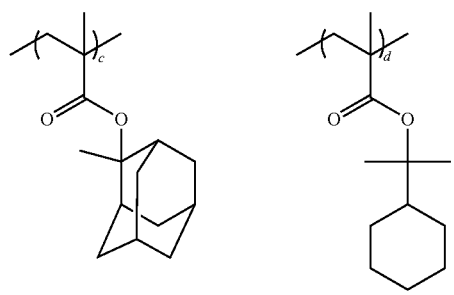
a/b/c/d = 10/40/10/40
Mw = 11500, Mw/Mn = 1.82
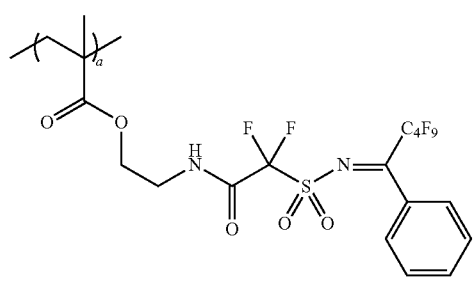
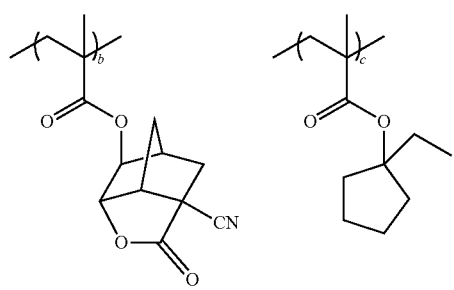
a/b/c = 20/35/45
Mw = 9000, Mw/Mn = 1.68
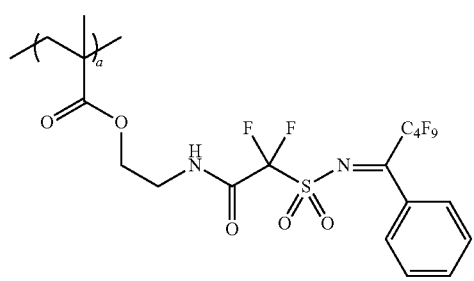
78
-continued
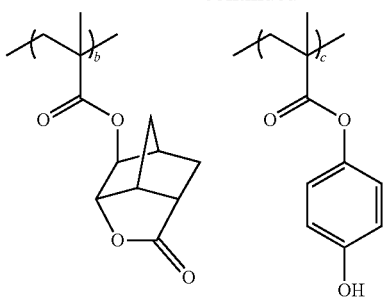
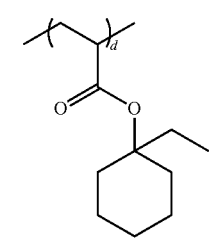
a/b/c/d = 20/15/15/50
Mw = 16000, Mw/Mn = 1.65
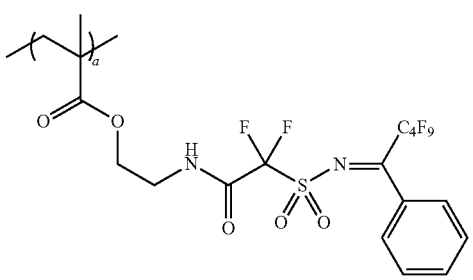
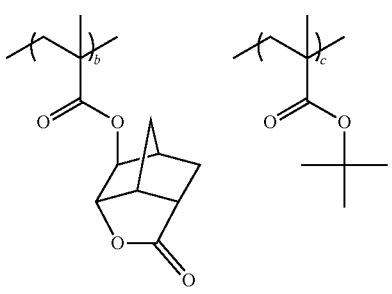
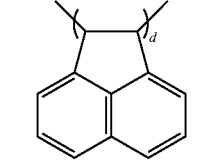
a/b/c/d = 20/20/50/10
Mw = 9500, Mw/Mn = 1.74
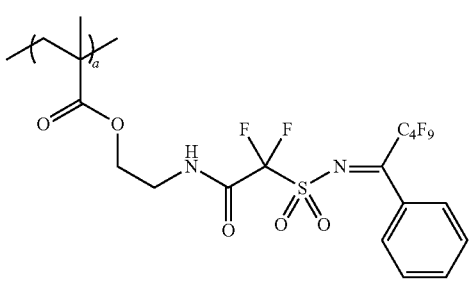

-continued
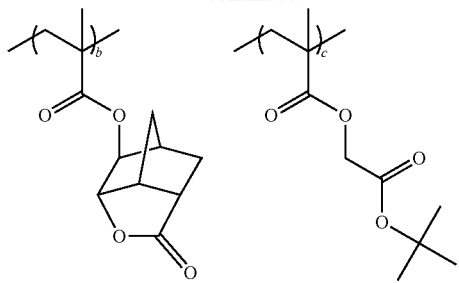
a/b/c = 20/35/45
Mw = 7500, Mw/Mn = 1.55
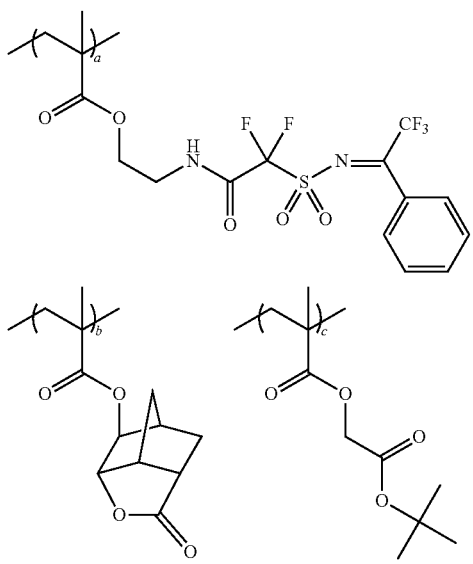
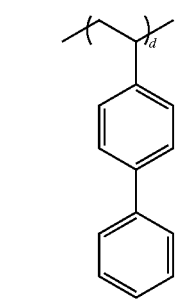
a/b/c/d = 15/30/50/5
Mw = 10000, Mw/Mn = 1.75
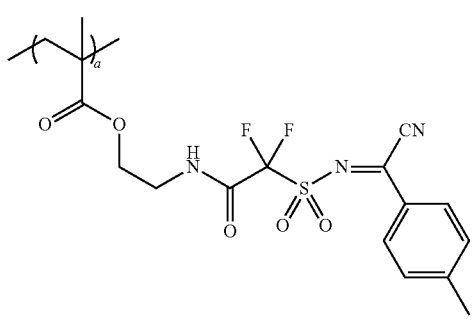
-continued
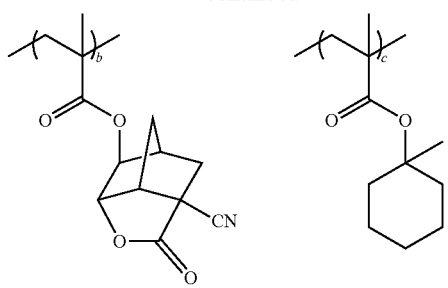
a/b/c = 15/40/45
Mw = 6500, Mw/Mn = 1.72
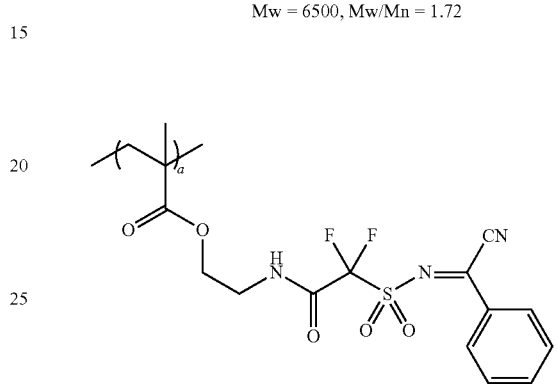
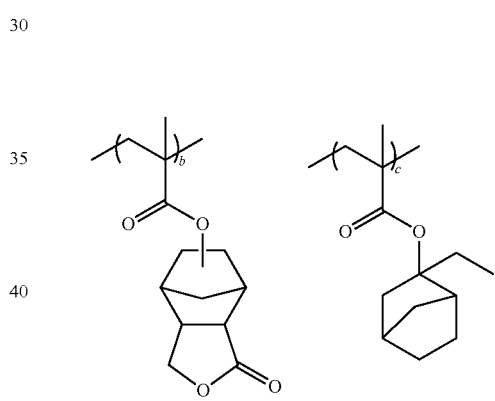
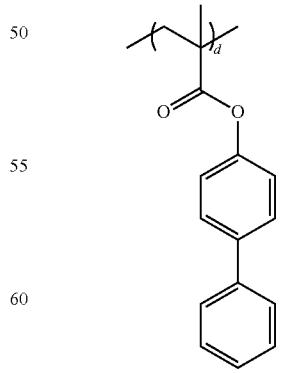
a/b/c/d = 15/25/45/15
Mw = 13000, Mw/Mn = 1.90

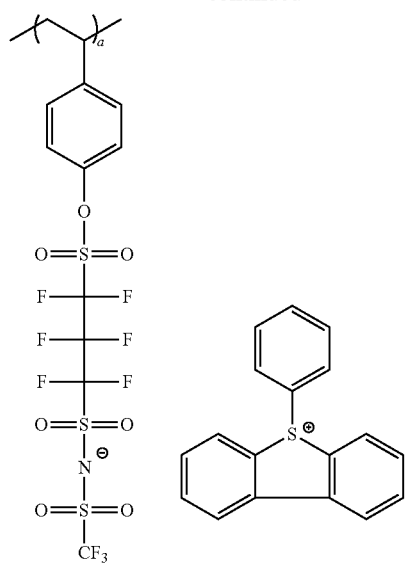
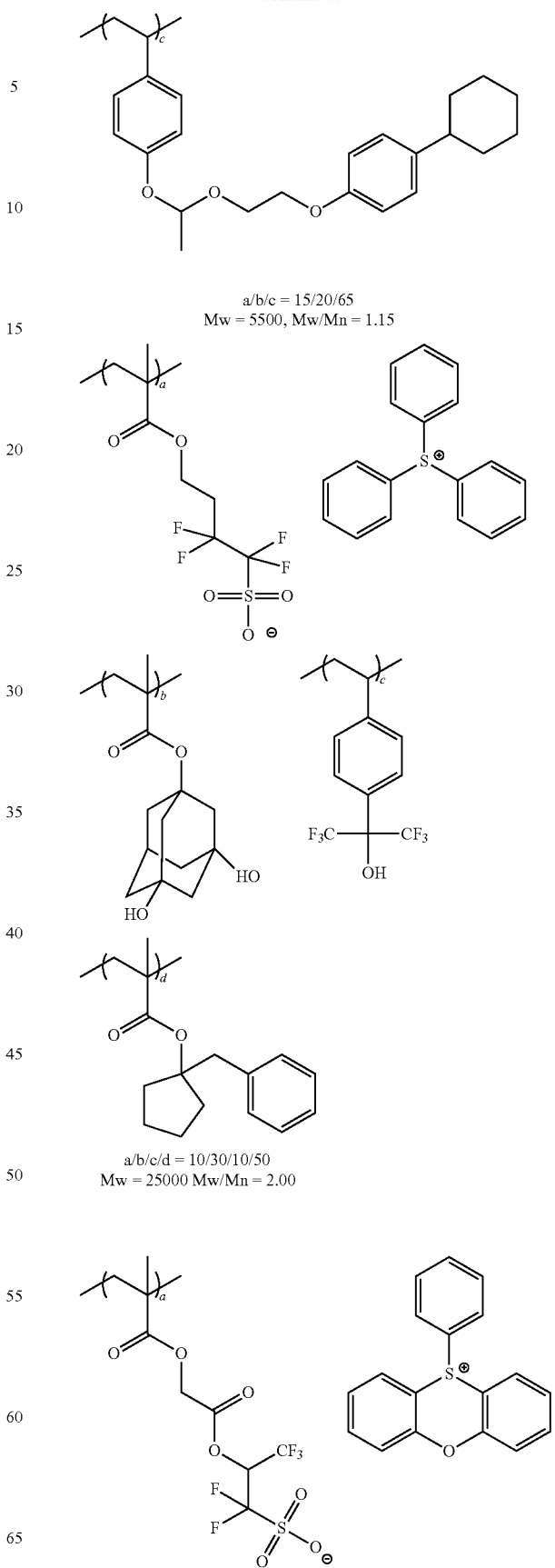

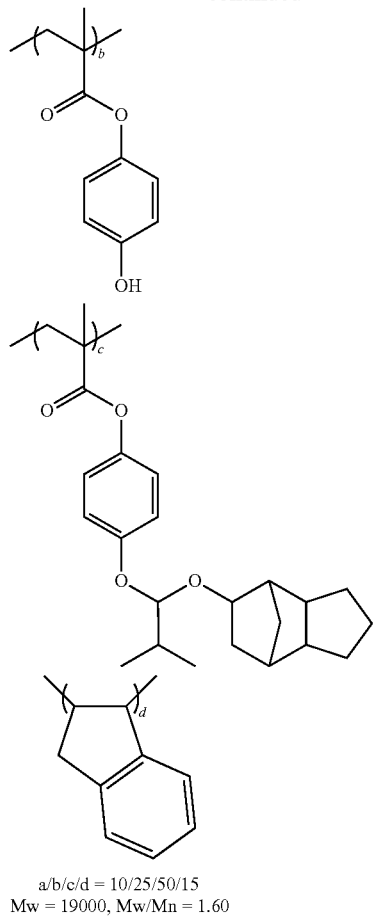
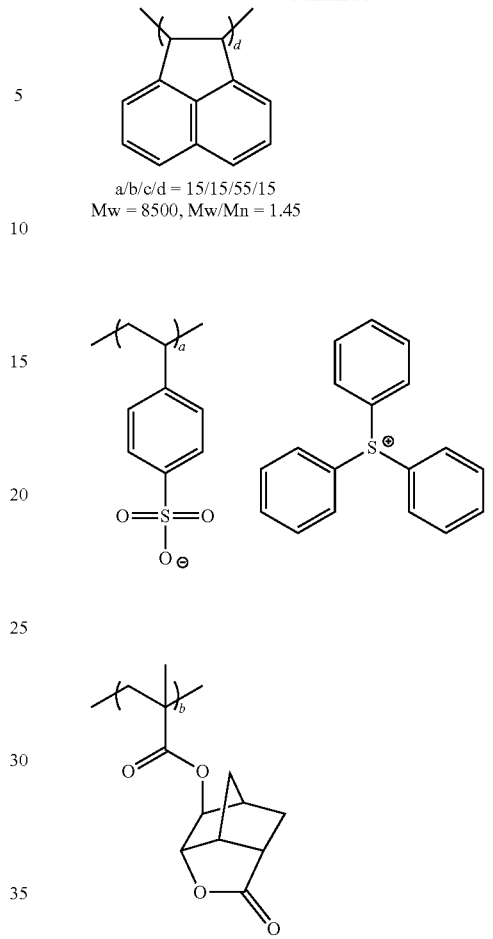
a/b/c/d = 10/25/50/15
Mw = 19000, Mw/Mn = 1.60
a/b/c/d = 15/15/55/15
Mw = 8500, Mw/Mn = 1.45
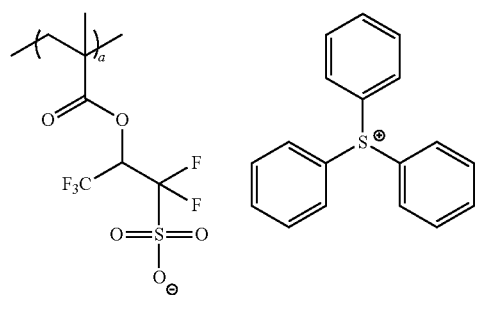
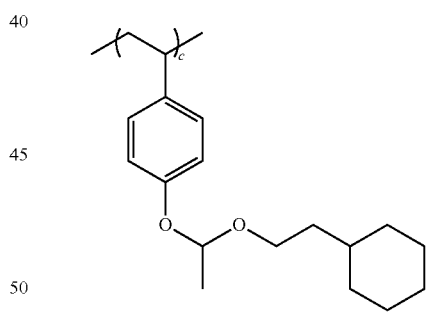
a/b/c = 15/30/55
Mw = 6500, Mw/Mn = 1.40
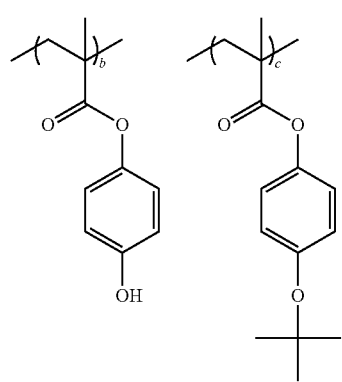
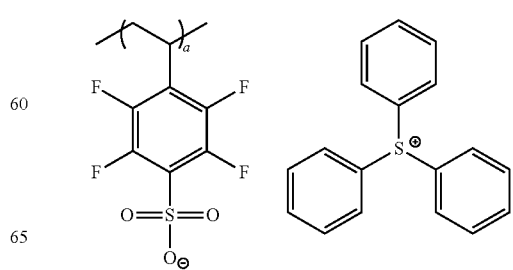

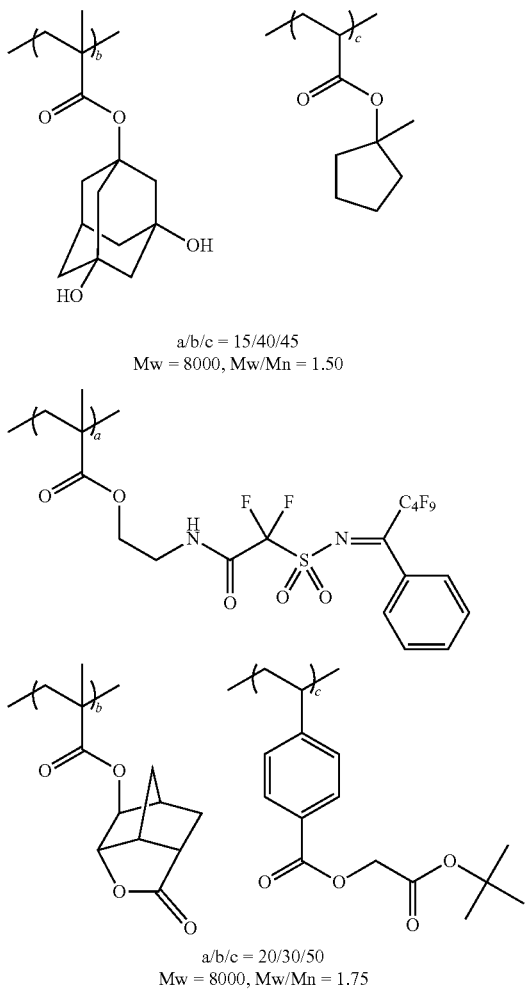

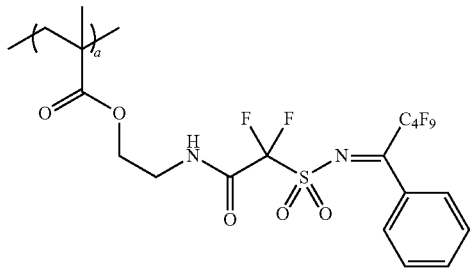

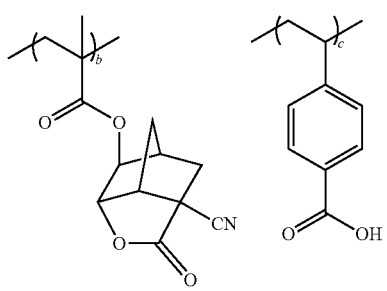

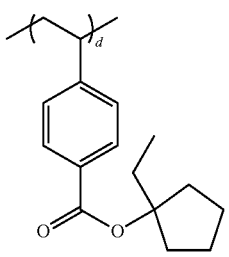

a/b/c/d = 15/25/10/50
Mw = 9000, Mw/Mn = 1.75

[2] (B) Compound Capable of Generating an Acid Upon Irradiation with an Actinic Ray or Radiation The composition of the present invention generally further contains a compound (B) capable of generating an acid upon irradiation with an actinic ray or radiation (hereinafter, also referred to as "acid generator").

It is preferred that the compound (B) capable of generating an acid upon irradiation with an actinic ray or radiation is a compound capable of generating an organic acid upon irradiation with an actinic ray or radiation.

As the acid generator, a photo-initiator for cationic photopolymerization, a photo-initiator for radical photopolymerization, a photodecoloring agent for dyes, a photodiscoloring agent, a conventionally known compound used for, for example, a micro resist, and generating an acid upon irradiation with an actinic ray or radiation, or a mixture thereof may be properly selected and used.

Examples thereof may include a diazonium salt, a phosphonium salt, a sulfonium salt, an iodonium salt, imidosulfonate, oxime sulfonate, diazodisulfone, disulfone, and o-nitrobenzylsulfonate.

Among acid generators, particularly preferred examples will be described below.

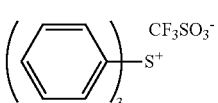 (z1)

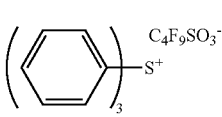 (z2)

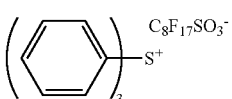 (z3)

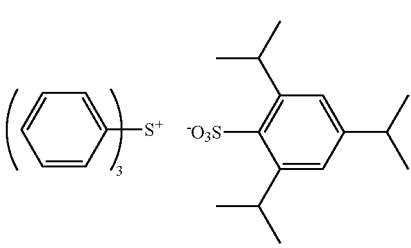 (z4)

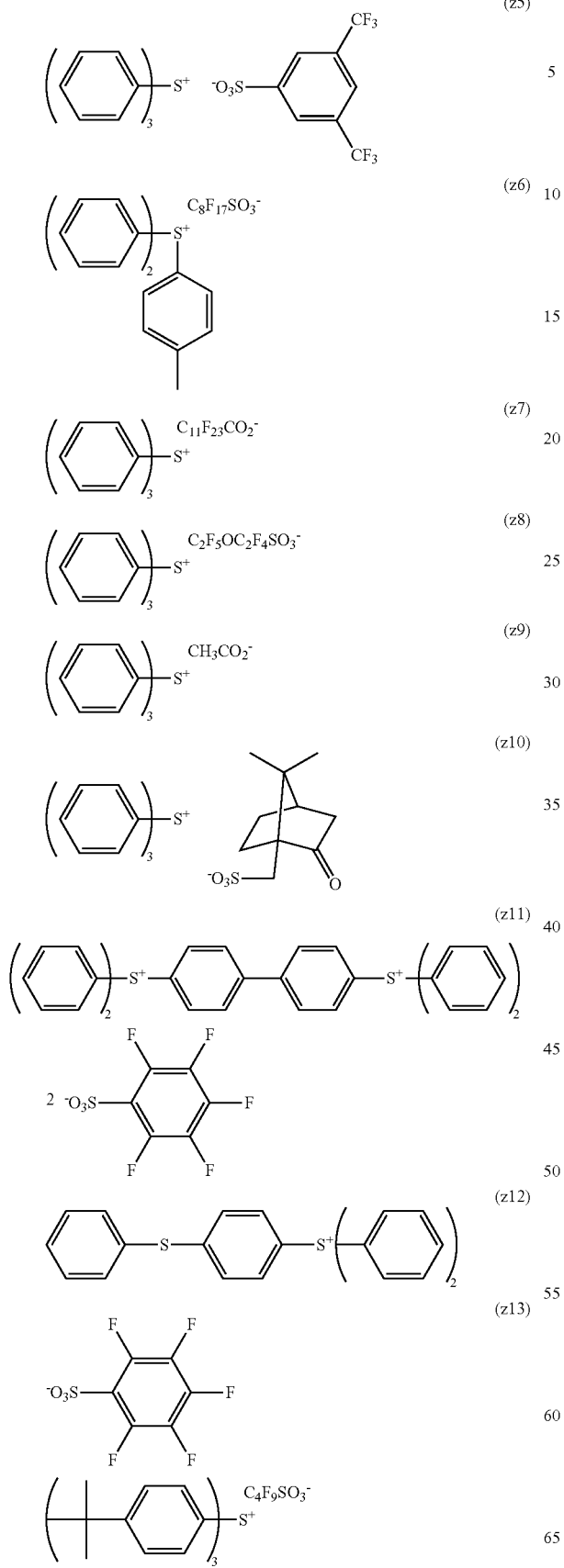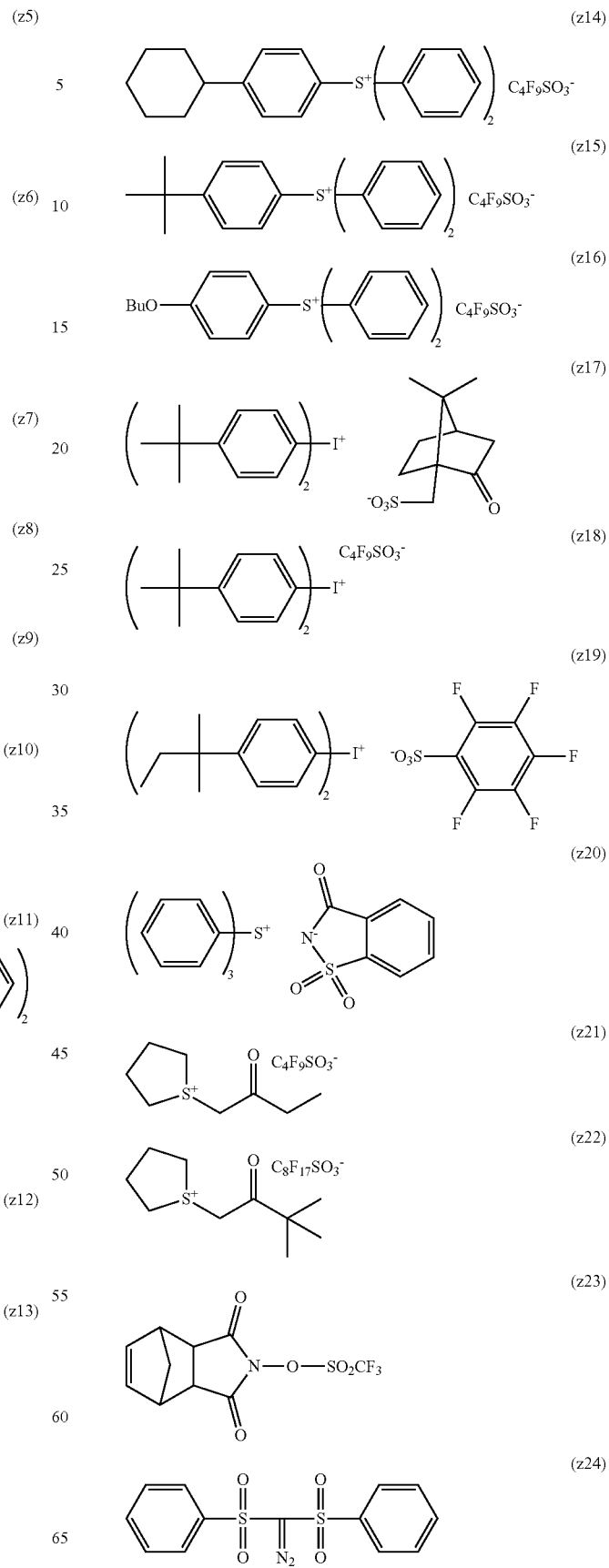

(z25) 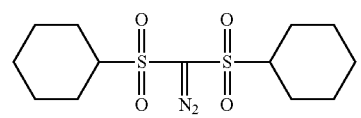
(z26) 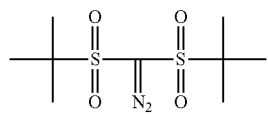
(z27) 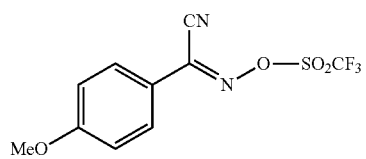
(z28) 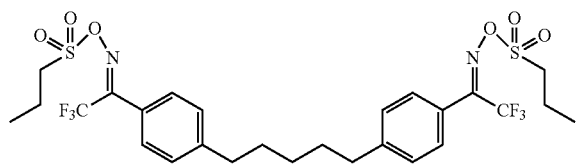
(z29) 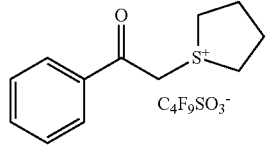
(z30) 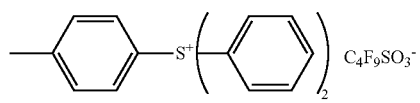
(z31) 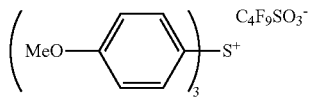
(z32) 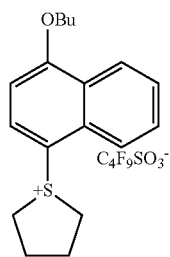
(z33) 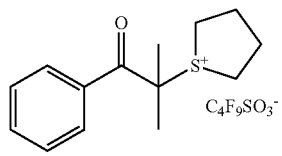
(z34) 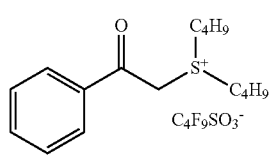
(z35) 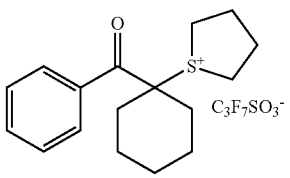
(z36) 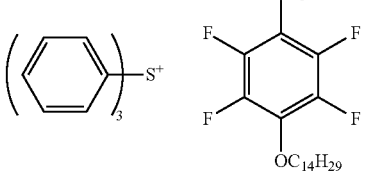
(z37) 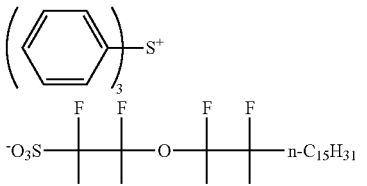
(z38) 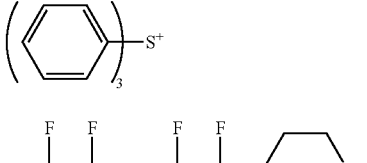
(z39) 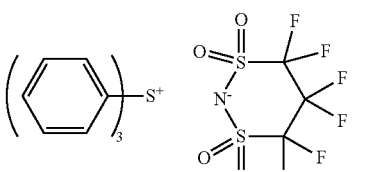
(z40) 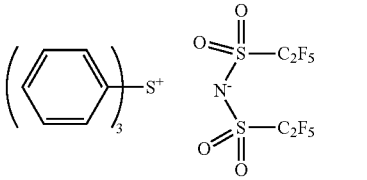
(z41) 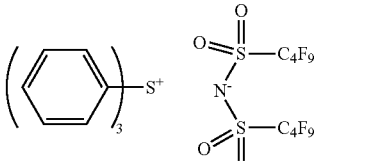
(z42) 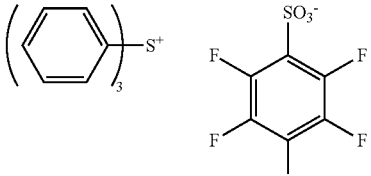

(z43)
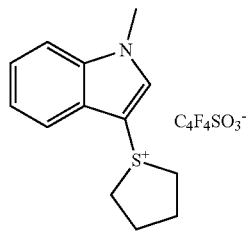
(z44)
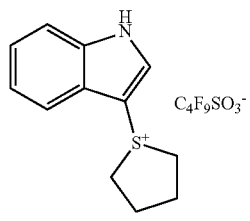
(z45)
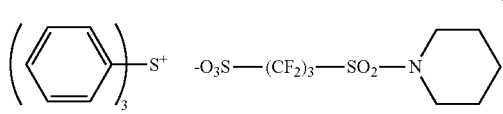
(z46)
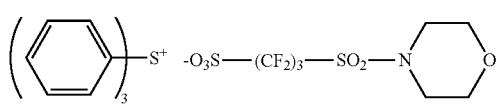
(z47)
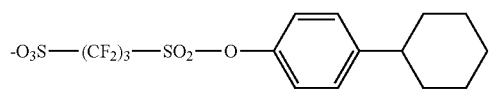
(z48)
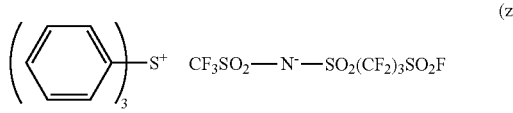
(z49)
(z50)
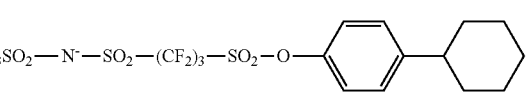
(z51)
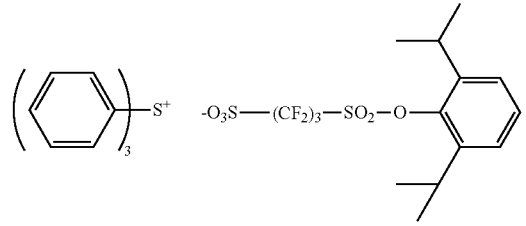
(z52)
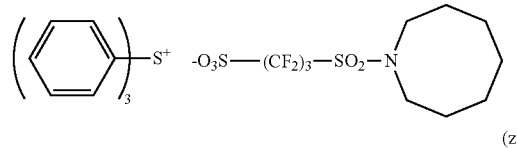
(z53)
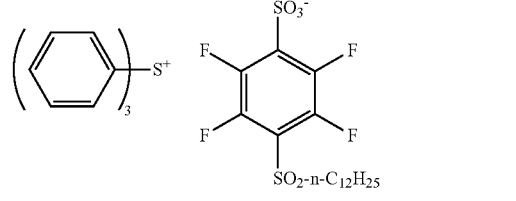
(z54)
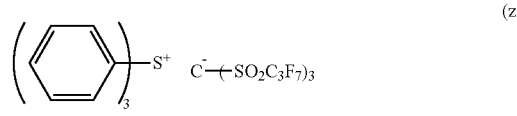
(z55)
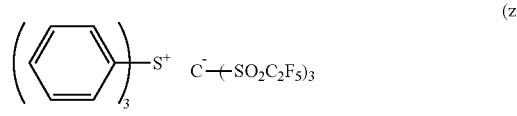
(z56)
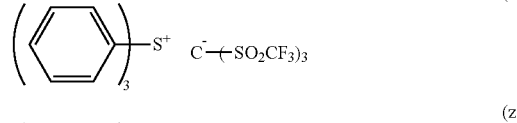
(z57)
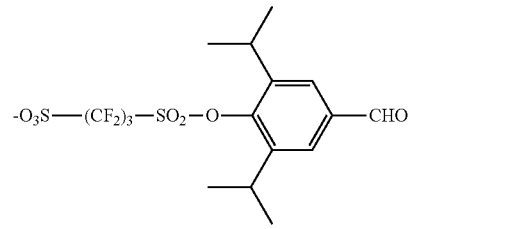
(z58)
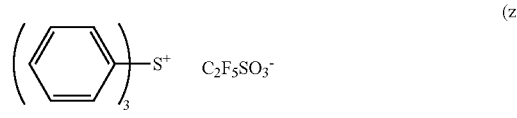
(z59)
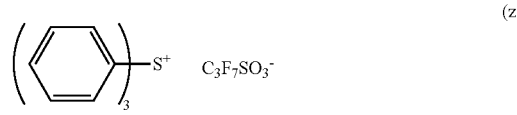
(z60)
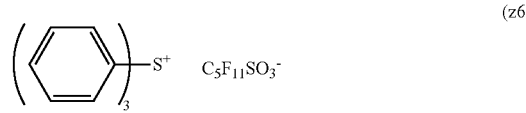

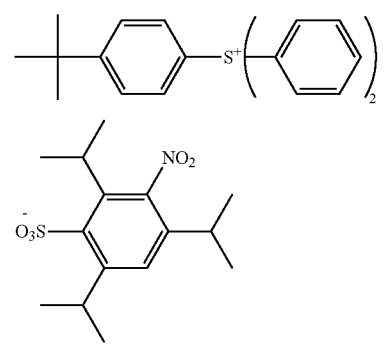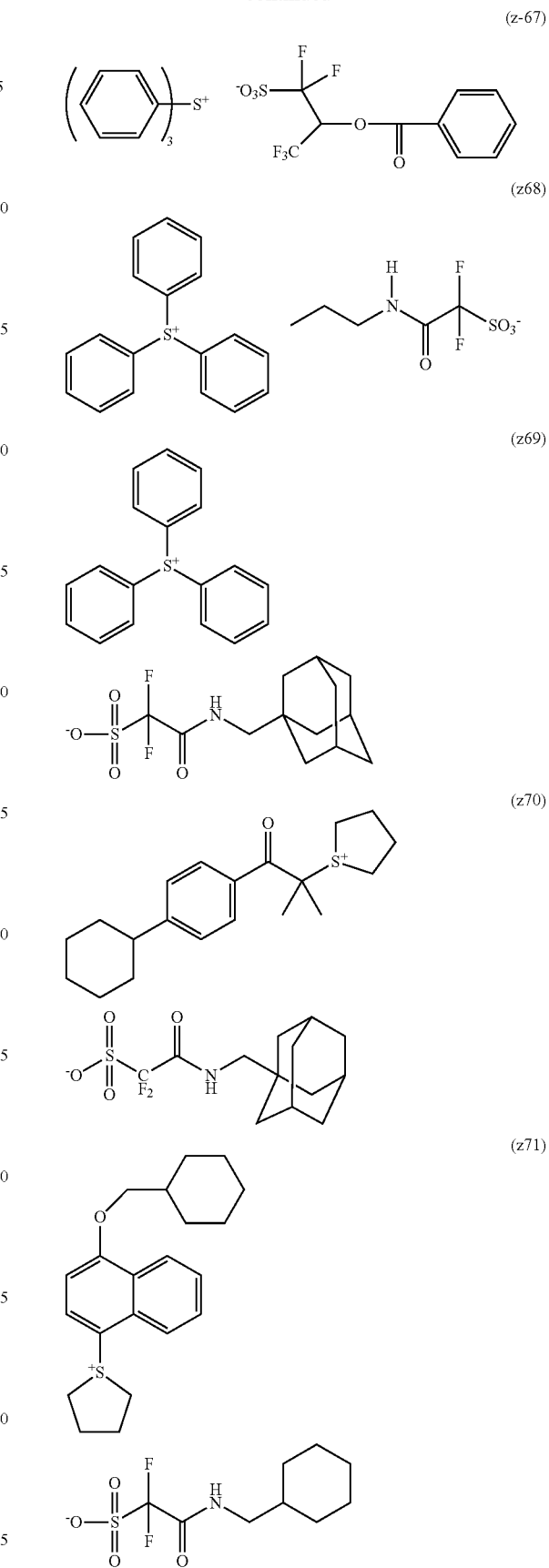

(z72)
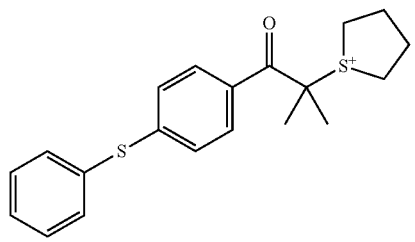
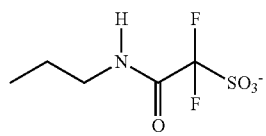
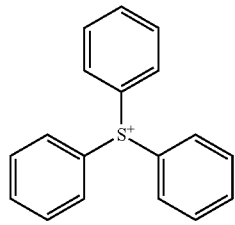
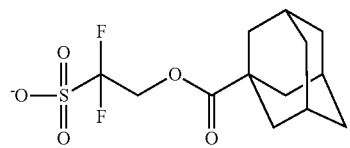
(z73)
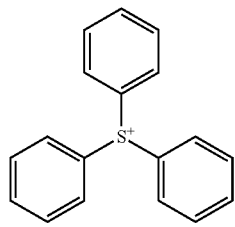
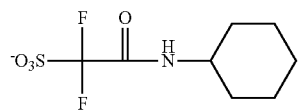
(z74)
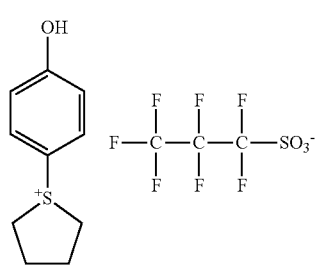
(z75)
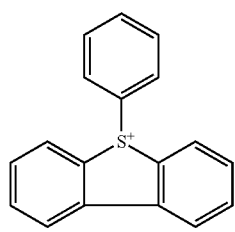 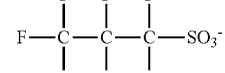
(z77)
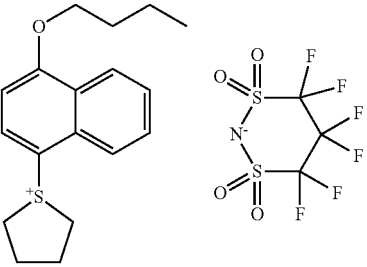
(z78)
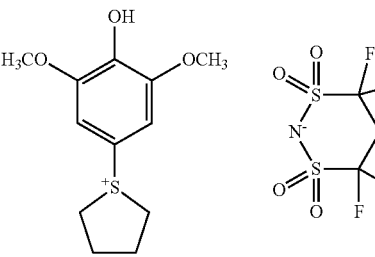
(z79)
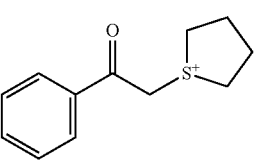
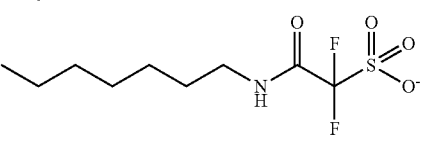
(z80)
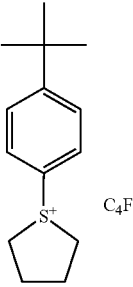 $C_4F_9SO_3^-$
(z81)
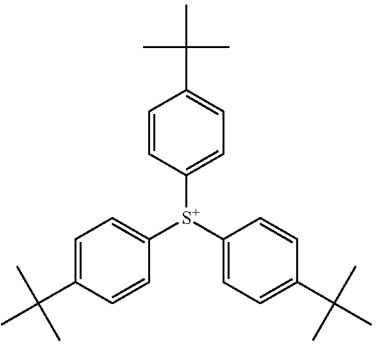
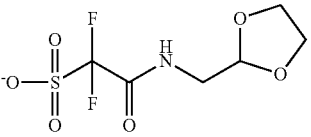

(z82) 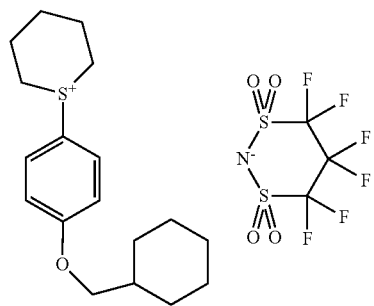
(z83) 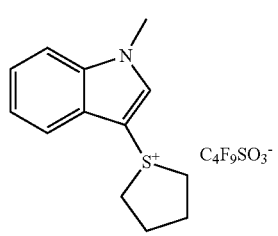
(z84) 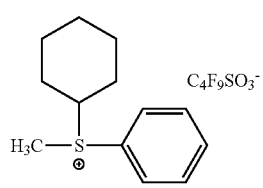
(z85) 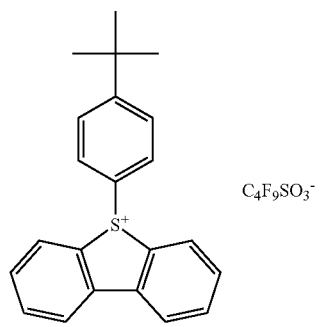
(z86) 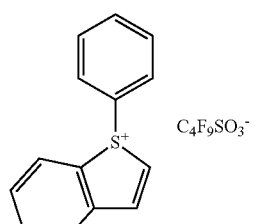
(z87) 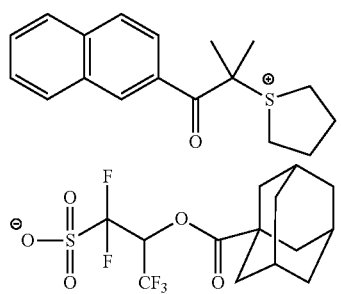
(z88) 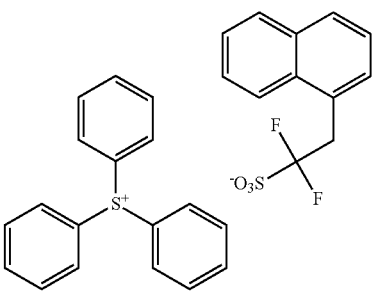
(z89) 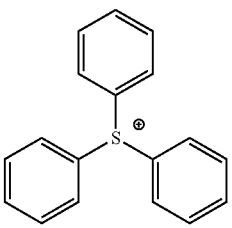
(z84) 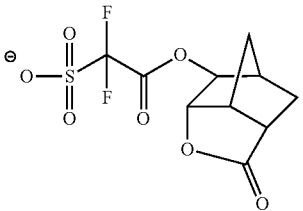
(z85) 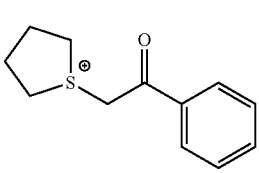
(z90) 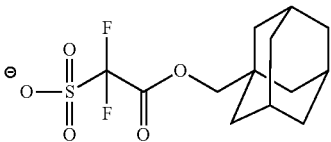
(z91) 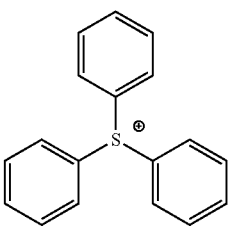
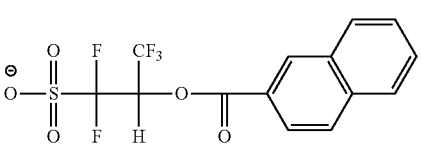

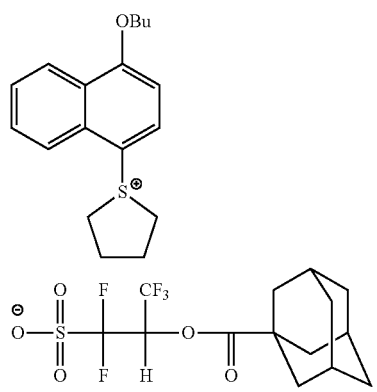
(z92)
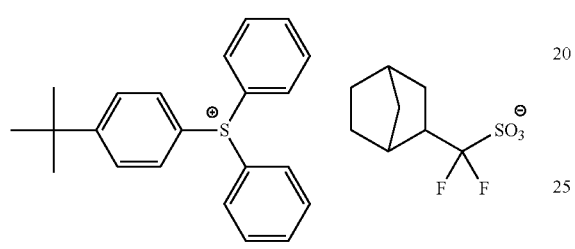
(z93)
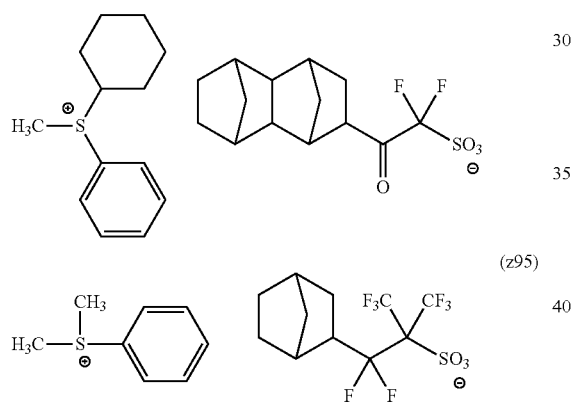
(z94)
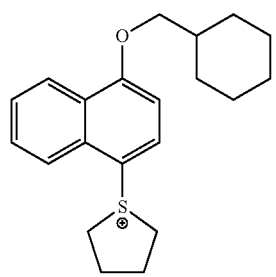
(z95)
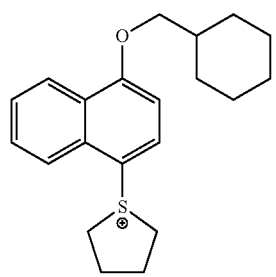
(z96)
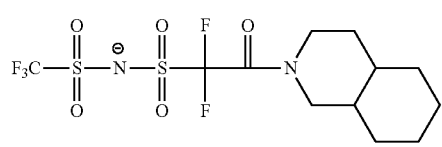
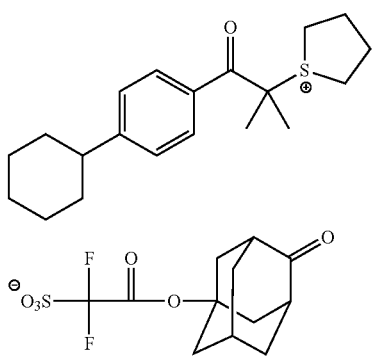
(z97)
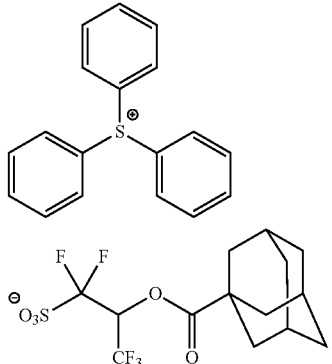
(z98)
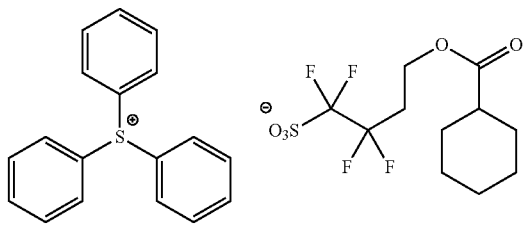
(z99)
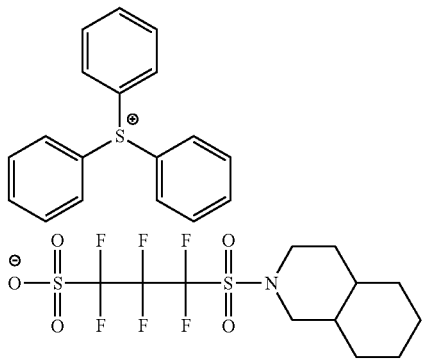
(z100)
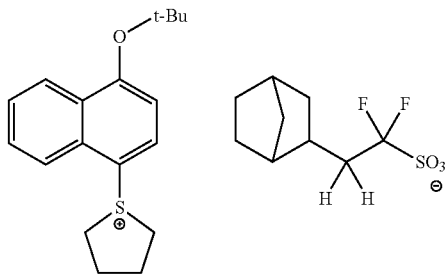
(z101)

101 -continued
(z102)
(z103)
(z104)
(z105)
(z106)

102 -continued
(z107)
(z108)

103
-continued
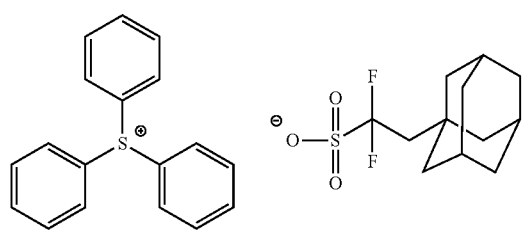
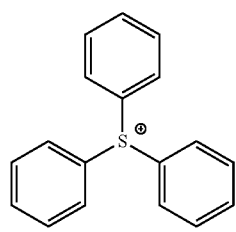
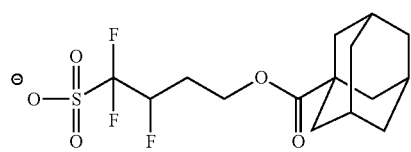
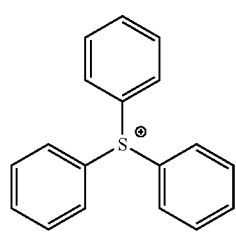
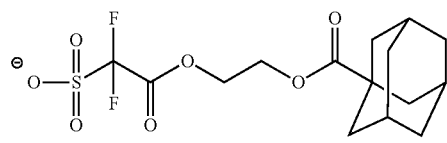
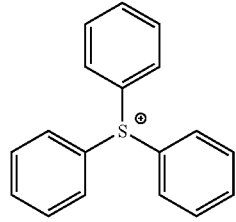
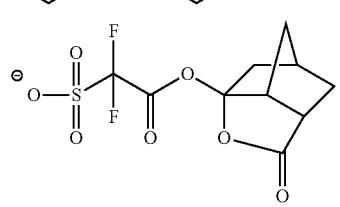
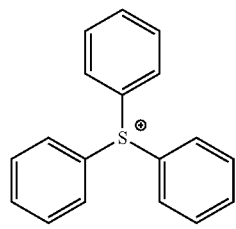
104
-continued
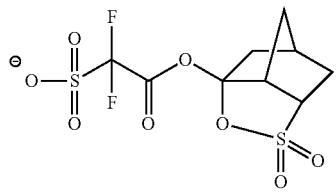
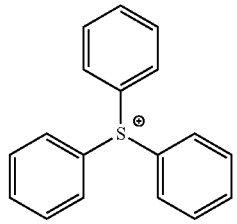
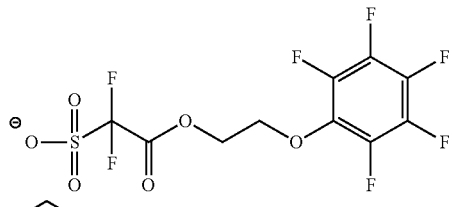
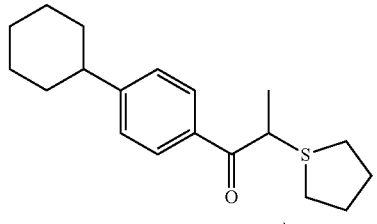
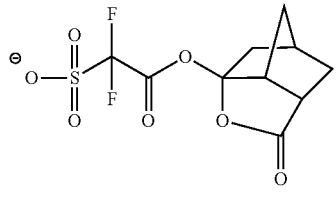
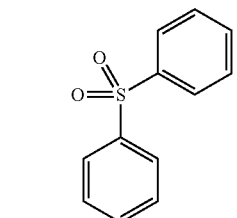
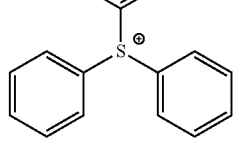
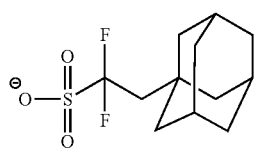

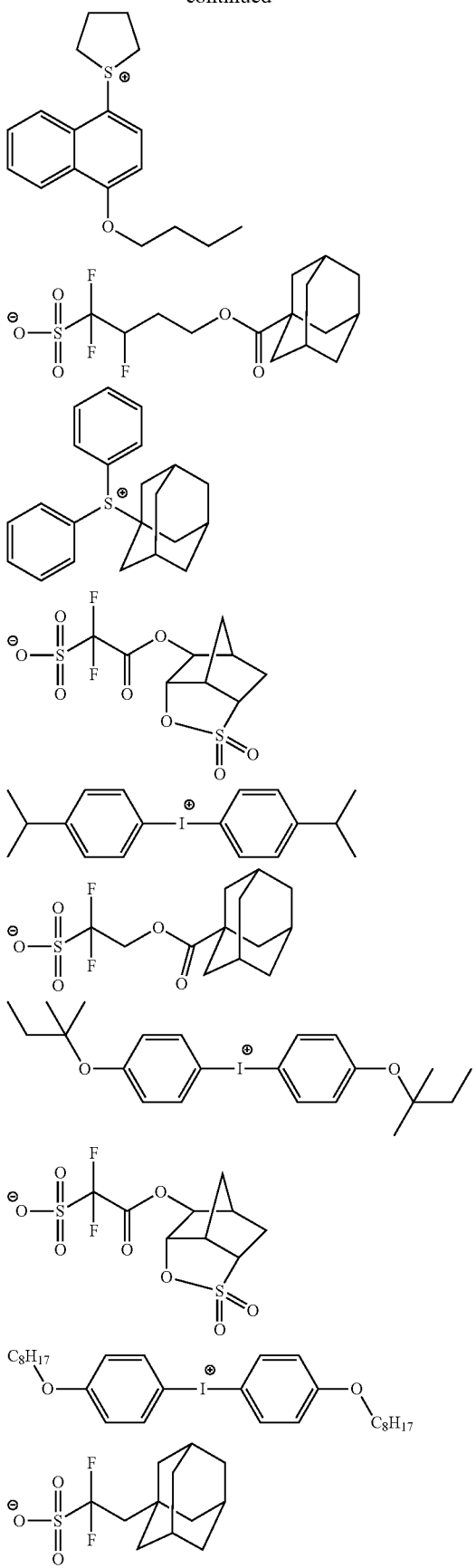
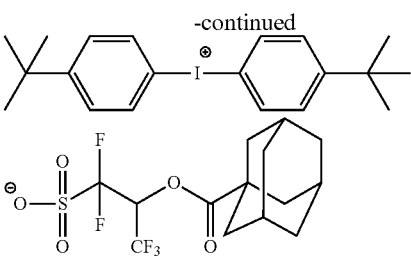

The acid generator may be synthesized by a conventionally known method, or may be synthesized in accordance with the method described in, for example, Japanese Patent Application Laid-Open No. 2007-161707, [0200] to [0210] of Japanese Patent Application Laid-Open No. 2010-100595, [0051] to [0058] of International Publication No. WO2011/093280, [0382] to [0385] of International Publication No. WO 2008/153110, and Japanese Patent Application Laid-Open No. 2007-161707.

The acid generator may be used either alone or in combination of two or more thereof.

The content of the compound capable of generating an acid upon irradiation with an actinic ray or radiation in the composition ranges preferably from 0.1% by mass to 30% by mass, more preferably from 0.5% by mass to 25% by mass, still more preferably from 3% by mass to 20% by mass, and particularly preferably from 3% by mass to 15% by mass based on the total solid of the chemical amplification resist composition.

Depending on the resist composition, there is also an aspect (B') where a structure corresponding to an acid generator is carried on the resin (A). In such an aspect, specifically, for example, the structures described in Japanese Patent Application Laid-Open No. 2011-248019 (in particular, the structure described in paragraph 0164 to 0191, and the structure contained in a resin described in Example of paragraph 0555) may be exemplified. In regard to this, even in an aspect where a structure corresponding to an acid generator is carried on the resin (A), the resist composition may additionally contain an acid generator not carried on the resin (A).

As the aspect (if), the repeating units as described below may be exemplified, but the present invention is not limited thereto.

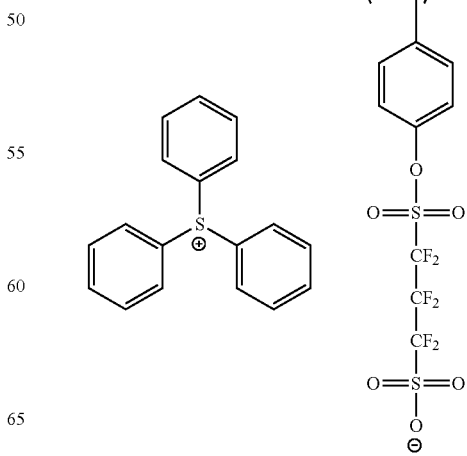

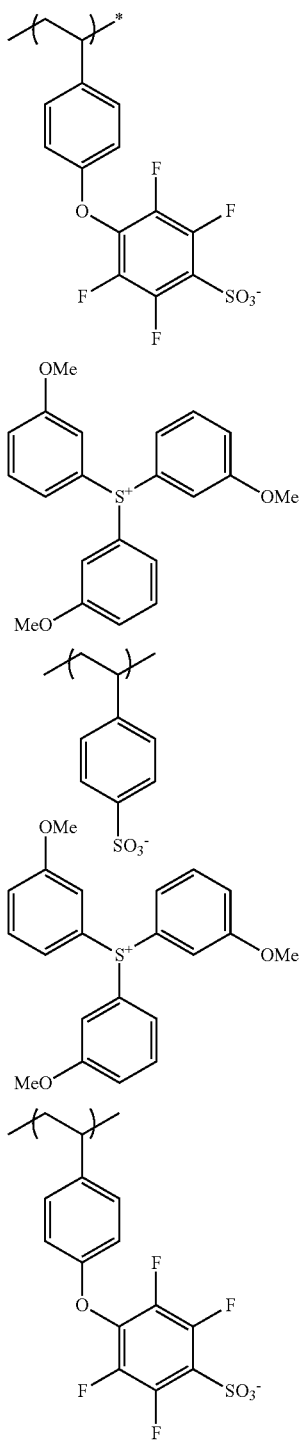

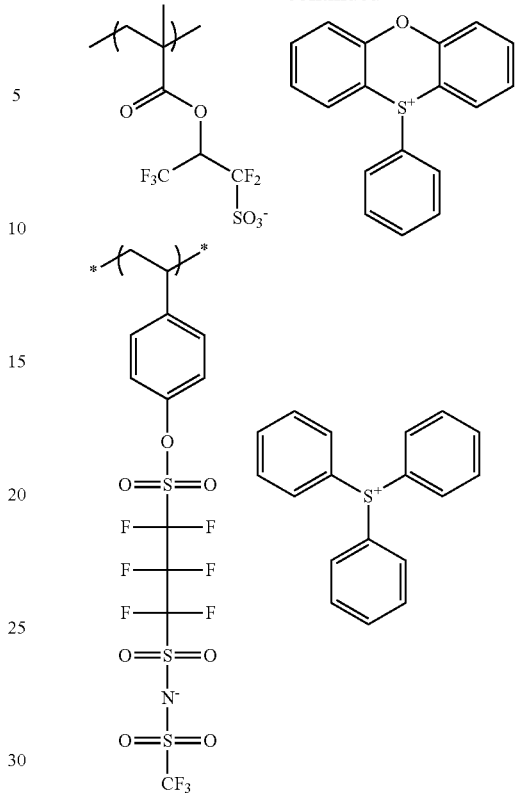

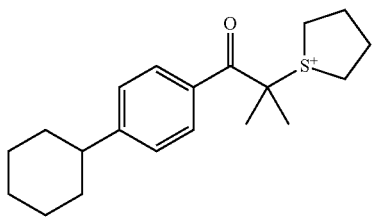

[3] (C) Solvent

The chemical amplification resist composition generally contains a solvent(C).

Examples of the solvent which may be used at the time of preparing the chemical amplification resist composition include an organic solvent such as alkylene glycol monoalkyl ether carboxylate, alkylene glycol monoalkyl ether, alkyl ester lactate, alkyl alkoxypropionate, cyclic lactone (preferably having 4 to 10 carbon atoms), a monoketone compound (preferably having 4 to 10 carbon atoms) which may have a ring, alkylene carbonate, alkyl alkoxyacetate and alkyl pyruvate.

Specific examples of these solvents may include those described in [0441] to [0455] of U.S. Patent Application Publication No. 2008/0187860.

In the present invention, a mixed solvent prepared by mixing a solvent containing a hydroxyl group in the structure and a solvent containing no hydroxyl group may be used as the organic solvent.

The solvent containing a hydroxyl group and the solvent containing no hydroxyl group may be appropriately selected from the compounds exemplified above. The solvent containing a hydroxyl group is preferably alkylene glycol monoalkyl ether, alkyl lactate or the like, and more preferably propylene glycol monomethyl ether (PGME, another name 1-methoxy-2-propanol), ethyl lactate or the like. The solvent containing no hydroxyl group is preferably alkylene glycol monoalkyl ether acetate, alkyl alkoxypropionate, a monoketone compound which may contain a ring, a cyclic lactone, alkyl acetate or the like, and among these, propylene glycol monomethyl ether acetate (PGMEA, another name 1-methoxy-2-acetoxypropane), ethyl ethoxypropionate, 2-heptanone, γ-butyrolactone, cyclohexanone, and butyl acetate are particularly preferred, and propylene glycol monomethyl ether acetate, ethylethoxypropionate, and 2-heptanone are most preferred.

The mixing ratio (by mass) of the solvent containing a hydroxyl group to the solvent containing no hydroxyl group ranges from 1/99 to 99/1, preferably from 10/90 to 90/10, and more preferably from 20/80 to 60/40. A mixed solvent in which the solvent containing no hydroxyl group is contained in an amount of 50% by mass or more is particularly preferred in view of coating uniformity.

The solvent preferably contains propylene glycol monomethyl ether acetate and is preferably a single solvent of propylene glycol monomethyl ether acetate or a mixed solvent of two or more kinds of solvents containing propylene glycol monomethyl ether acetate.

[4] Hydrophobic Resin (D)

The chemical amplification resist composition according to the present invention may contain a hydrophobic resin (hereinafter, referred to as "a hydrophobic resin (D)" or also simply referred to as "a resin (D)") particularly when applied to immersion exposure. The hydrophobic resin (D) is preferably different from the resin (A).

Accordingly, when the hydrophobic resin (D) is localized on the film top layer and the immersion medium is water, the static/dynamic contact angle of the resist film surface against water may be improved, thereby improving an immersion liquid follow-up property.

Even when the composition is not subjected to the immersion exposure, the hydrophobic resin may be contained for various purposes. For example, when the composition is subjected to EUV exposure, the hydrophobic resin may be preferably used to achieve an outgassing suppression or pattern shape adjustment.

It is preferred that the hydrophobic resin (D) is designed to be localized at the interface as described above, but unlike a surfactant, the hydrophobic resin (D) does not necessarily have a hydrophilic group in the molecule thereof, and may not contribute to the mixing of polar/non-polar materials homogeneously.

From the viewpoint of the localization on the film top layer, the hydrophobic resin (D) preferably has one or more of "a fluorine atom", "a silicon atom" and "a $CH_3$ partial structure contained in a side chain moiety of a resin", and more preferably two or more thereof.

The weight average molecular weight of the hydrophobic resin (D) in terms of the standard polystyrene ranges preferably from 1,000 to 100,000, more preferably from 1,000 to 50,000, and still more preferably from 2,000 to 15,000.

Further, the hydrophobic resin (D) may be used either alone or in combination of a plurality thereof.

The content of the hydrophobic resin (D) in the composition ranges preferably from 0.01% by mass to 10% by mass, more preferably from 0.05% by mass to 8% by mass, and still more preferably from 0.1% by mass to 7% by mass, based on the total solid in the composition of the present invention.

Similarly to the resin (A), it is natural that the hydrophobic resin (D) has a small amount of impurities such as metal, but the content of residual monomers or oligomer components ranges preferably from 0.01% by mass to 5% by mass, more preferably from 0.01% by mass to 3% by mass, and still more preferably from 0.05% by mass to 1% by mass. Accordingly, it is possible to obtain a chemical amplification resist composition free from, for example, extraneous substances in liquid and change in sensitivity over time. Further, from the viewpoint of resolution, resist shape, side wall of resist pattern, roughness and the like, the molecular weight distribution (Mw/Mn, also referred to as polydispersity) is in a range of preferably 1 to 5, more preferably 1 to 3, and still more preferably 1 to 2.

The hydrophobic resin (D) may be commercially available or synthesized by a conventional method (e.g., radical polymerization). Examples of a general synthesis method may include a batch polymerization method of dissolving monomer species and an initiator in a solvent and heating the solution, thereby performing the polymerization, a dropping polymerization method of adding dropwise a solution containing monomer species and an initiator to a heated solvent over 1 to 10 hours, and the like, and a dropping polymerization method is preferred.

The reaction solvent, polymerization initiator, reaction conditions (temperature, concentration and the like) and purification method after reaction are the same as those described in the resin (A), but in the synthesis of the hydrophobic resin (D), the reaction concentration ranges preferably from 30% by mass to 50% by mass. More specifically, see, the descriptions in paragraphs 0320 to 0329 of Japanese Patent Application Laid-Open No. 2008-292975.

Specific examples of the hydrophobic resin (D) are described below. Further, the molar ratio of the repeating unit (corresponding to each repeating unit sequentially from the left), the weight average molecular weight and the polydispersity in each resin are noted in Tables as follows.

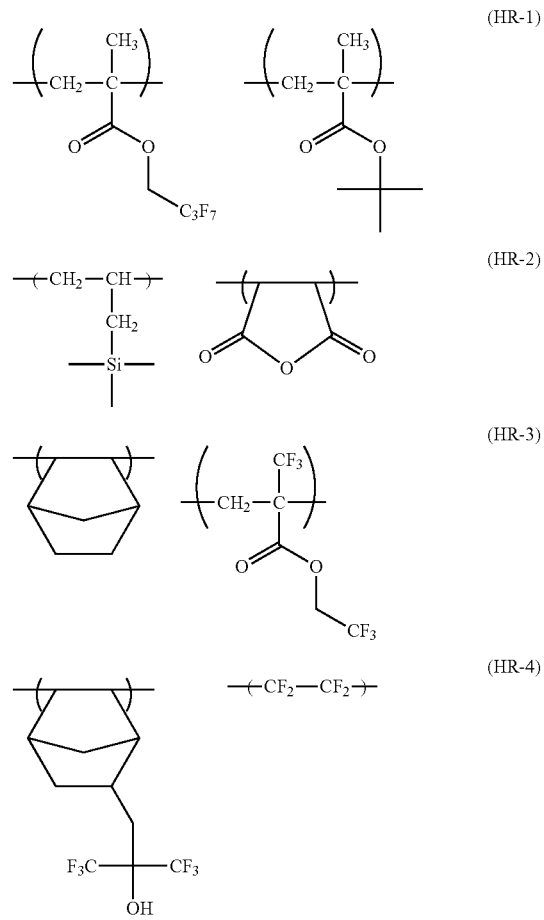

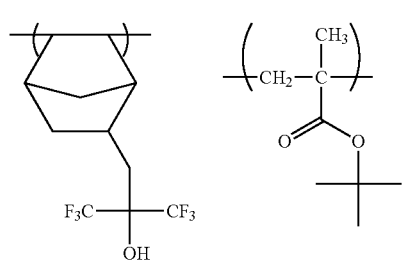
(HR-5)
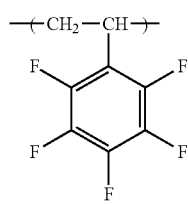
(HR-6)
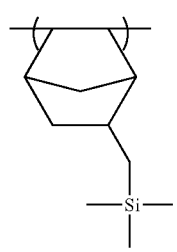
(HR-7)
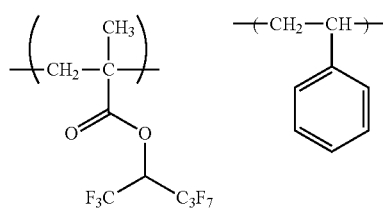
(HR-8)
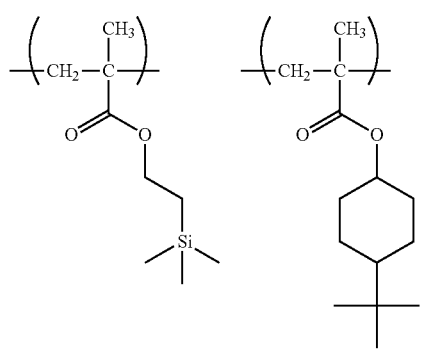
(HR-9)
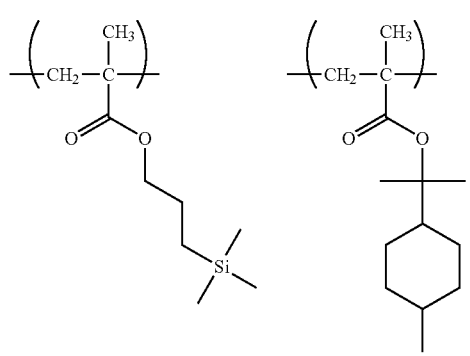
(HR-10)
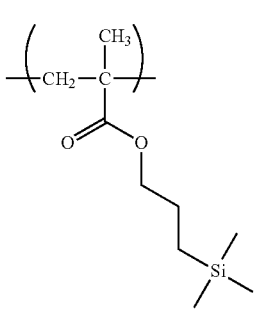
(HR-11)
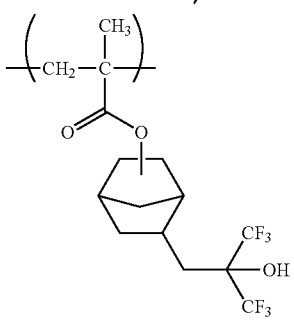
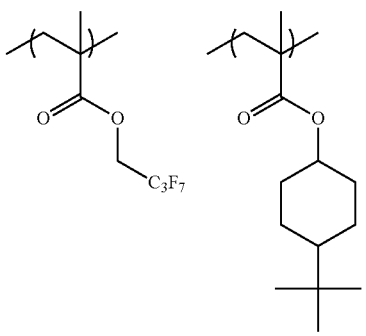
(HR-12)
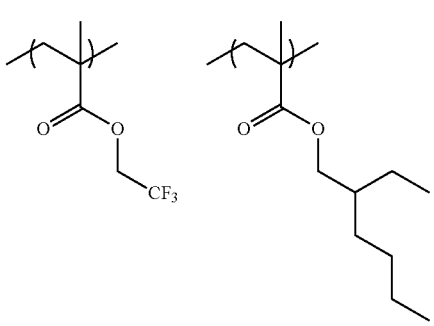
(HR-13)
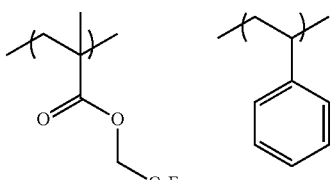
(HR-14)
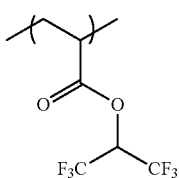
(HR-15)

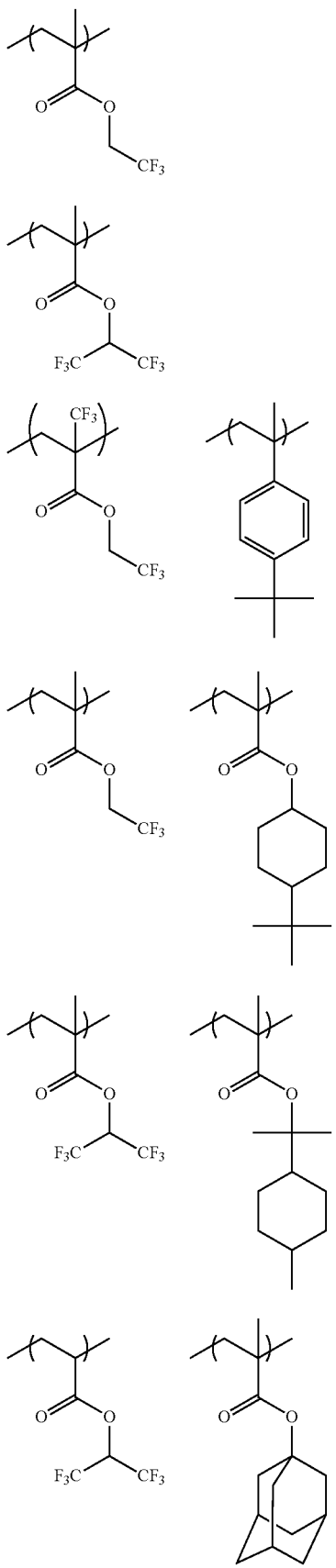
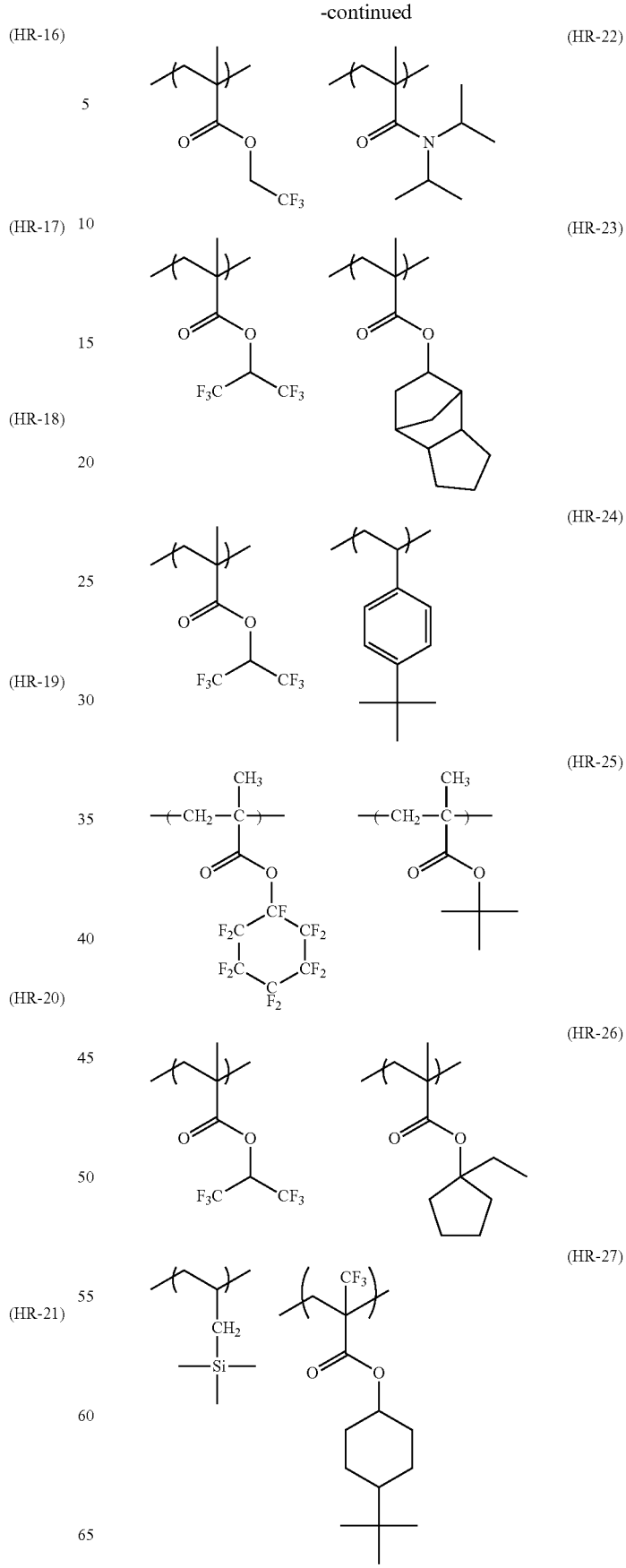

(HR-28)
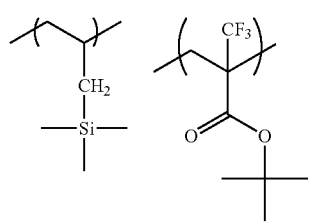
(HR-29)
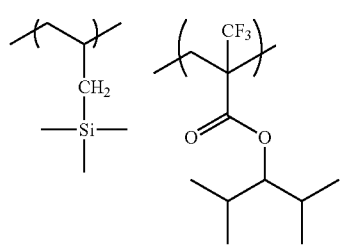
(HR-30)
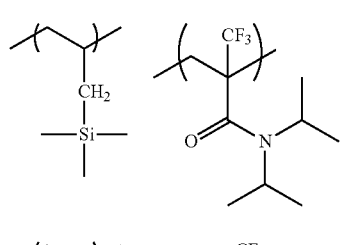
(HR-31)
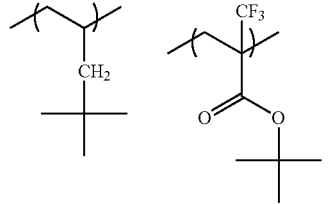
(HR-32)
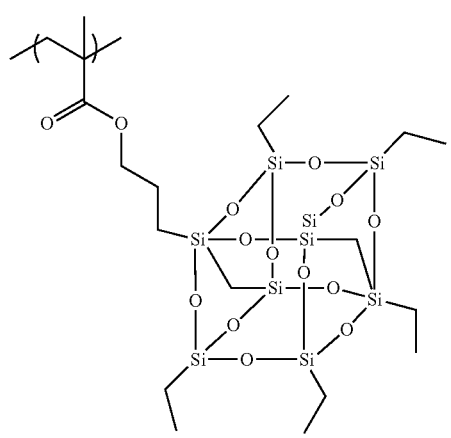
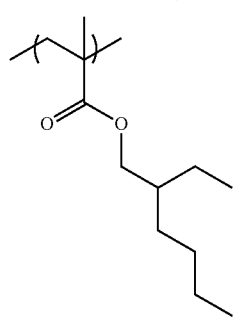
(HR-33)
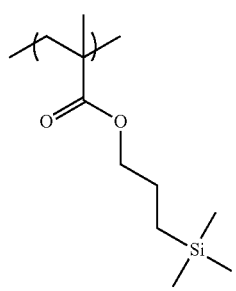 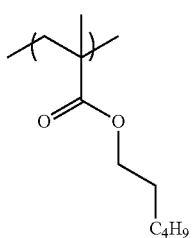
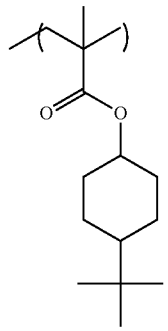
(HR-34)
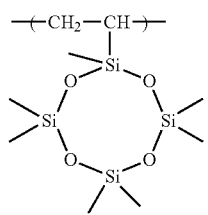 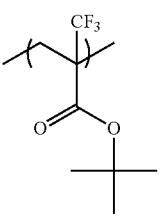
(HR-35)
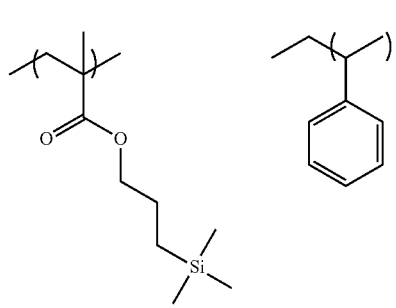
(HR-36)
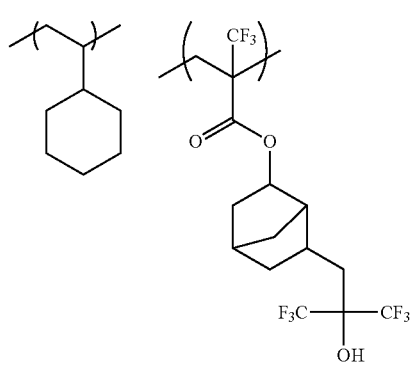

(HR-37)
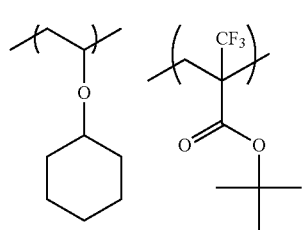
(HR-38)
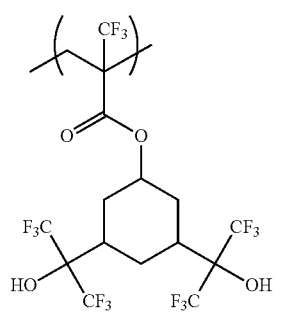
(HR-39)
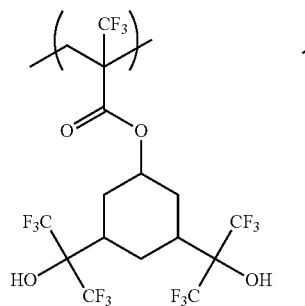
(HR-40)
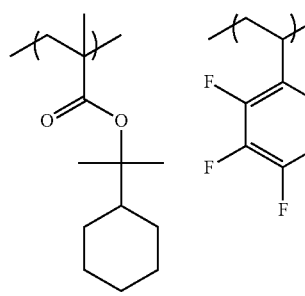
(HR-41)
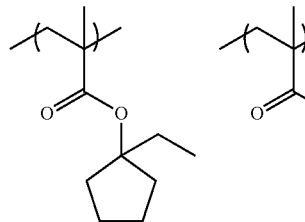
(HR-42)
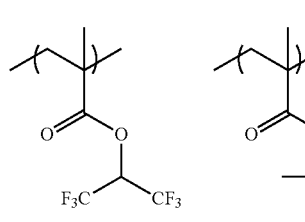
(HR-43)
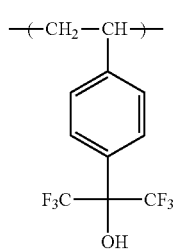 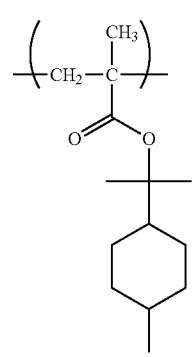
(HR-44)
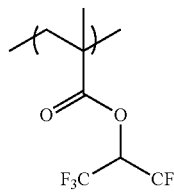 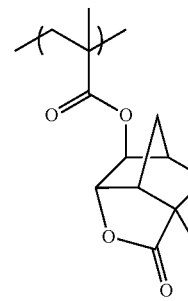
(HR-45)
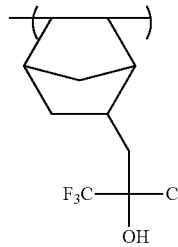 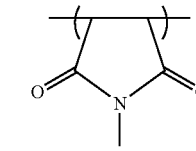
(HR-46)
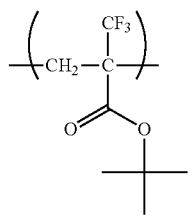 

(HR-47)
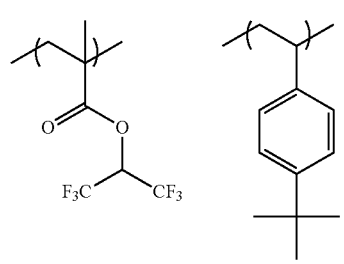
(HR-48)
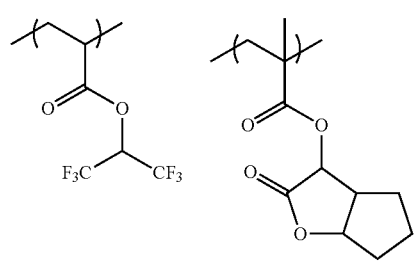
(HR-49)
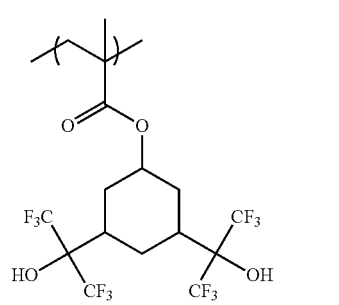
(HR-50)
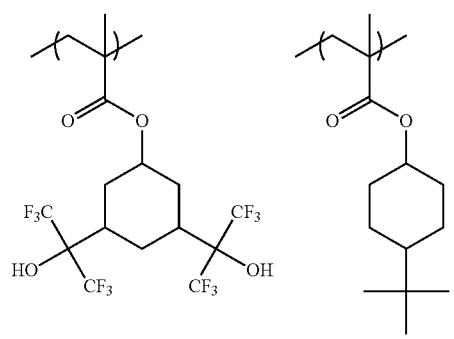
(HR-51)
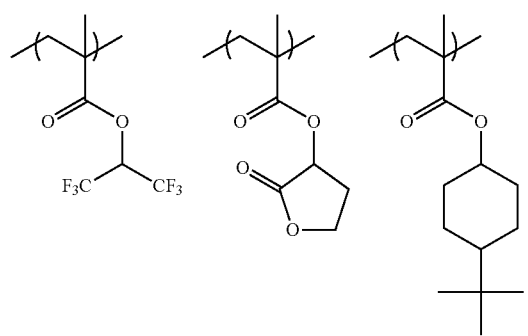
(HR-52)
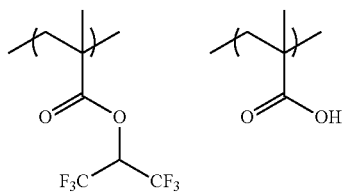
(HR-53)
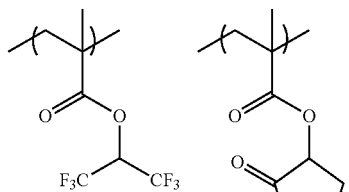
(HR-54)
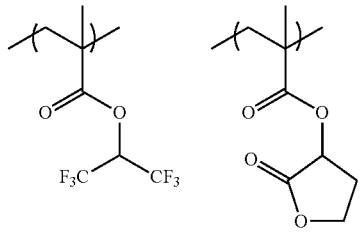
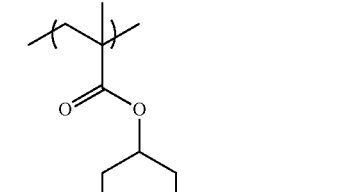
(HR-55)
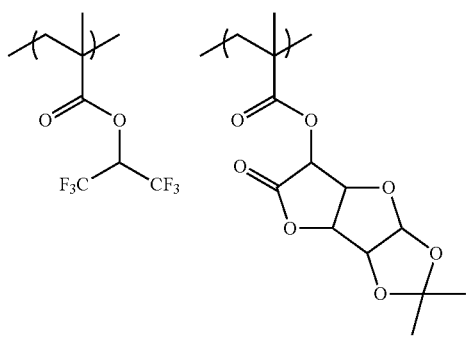

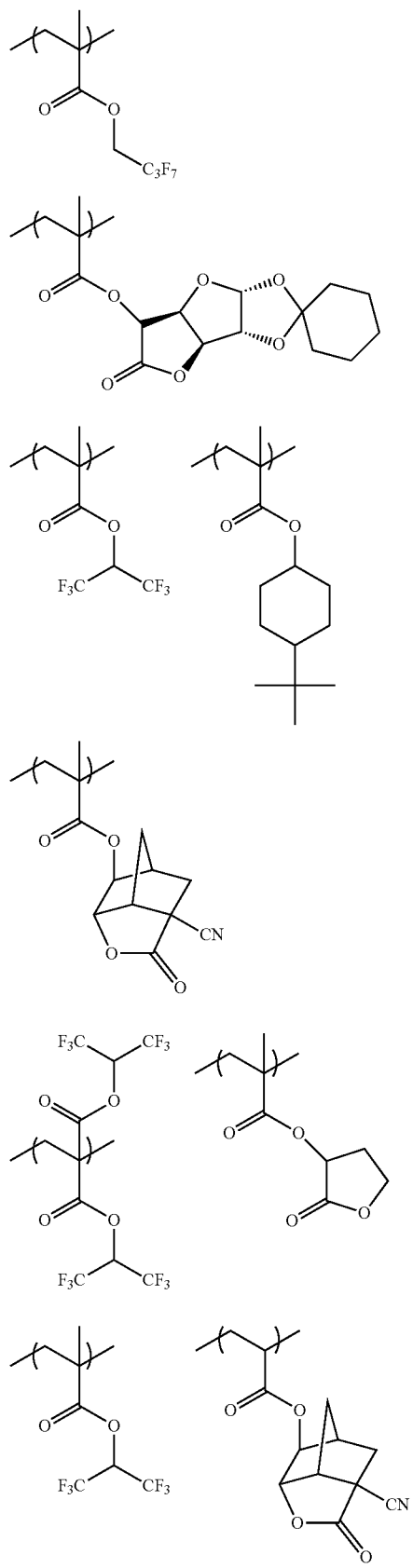
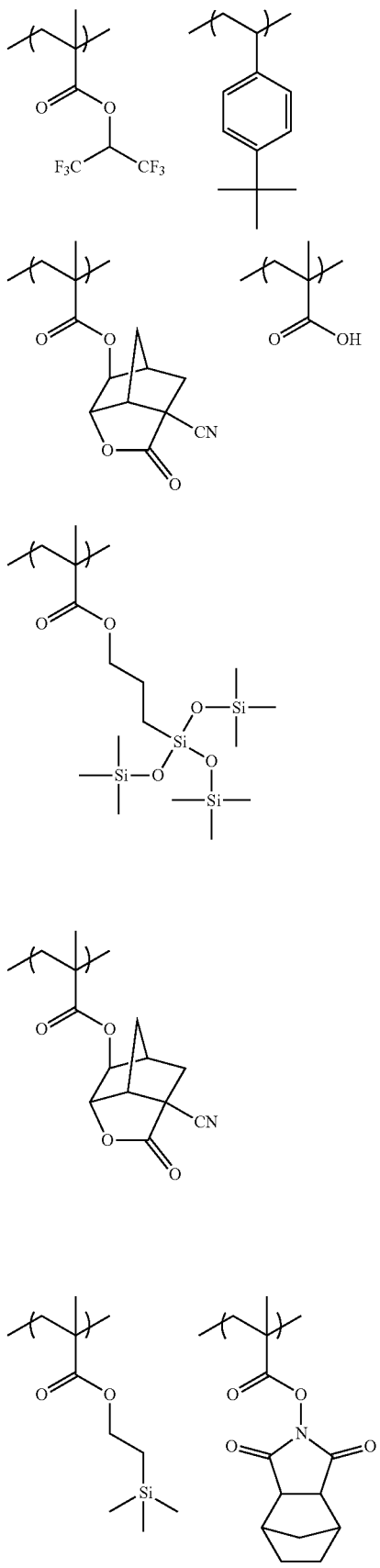

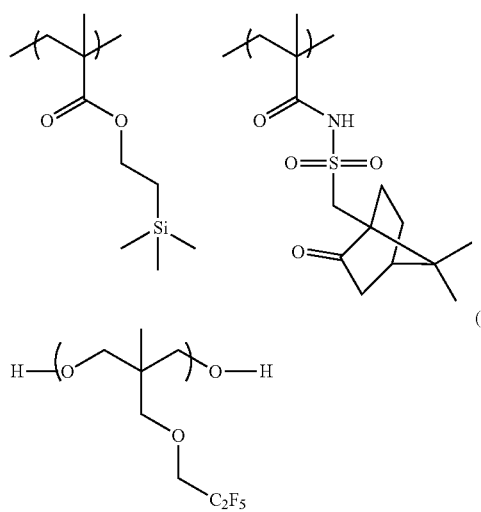
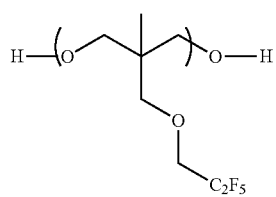
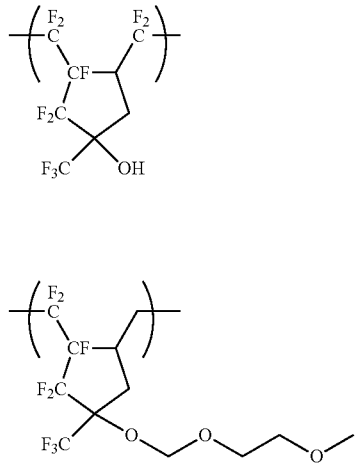
| RESIN | COMPOSITION | Mw | Mw/Mn | RESIN | COMPOSITION | Mw | Mw/Mn |
|---|---|---|---|---|---|---|---|
| HR-1 | 50/50 | 4900 | 1.4 | HR-34 | 50/50 | 4000 | 1.3 |
| HR-2 | 50/50 | 5100 | 1.6 | HR-35 | 50/50 | 6500 | 1.7 |
| HR-3 | 50/50 | 4800 | 1.5 | HR-36 | 50/50 | 6000 | 1.5 |
| HR-4 | 50/50 | 5300 | 1.6 | HR-37 | 50/50 | 5000 | 1.6 |
| HR-5 | 50/50 | 4500 | 1.4 | HR-38 | 50/50 | 4000 | 1.4 |
| HR-6 | 100 | 5500 | 1.6 | HR-39 | 20/80 | 6000 | 1.4 |
| HR-7 | 50/50 | 5800 | 1.9 | HR-40 | 50/50 | 7000 | 1.4 |
| HR-8 | 50/50 | 4200 | 1.3 | HR-41 | 50/50 | 6500 | 1.6 |
| HR-9 | 50/50 | 5500 | 1.8 | HR-42 | 50/50 | 5200 | 1.6 |
| HR-10 | 40/60 | 7500 | 1.6 | HR-43 | 50/50 | 6000 | 1.4 |
| HR-11 | 70/30 | 6600 | 1.8 | HR-44 | 70/30 | 5500 | 1.6 |
| HR-12 | 40/60 | 3900 | 1.3 | HR-45 | 50/20/30 | 4200 | 1.4 |
| HR-13 | 50/50 | 9500 | 1.8 | HR-46 | 30/70 | 7500 | 1.6 |
| HR-14 | 50/50 | 5300 | 1.6 | HR-47 | 40/58/2 | 4300 | 1.4 |
| HR-15 | 100 | 6200 | 1.2 | HR-48 | 50/50 | 6800 | 1.6 |
| HR-16 | 100 | 5600 | 1.6 | HR-49 | 100 | 6500 | 1.5 |
| HR-17 | 100 | 4400 | 1.3 | HR-50 | 50/50 | 6600 | 1.6 |
| HR-18 | 50/50 | 4300 | 1.3 | HR-51 | 30/20/50 | 6800 | 1.7 |
| HR-19 | 50/50 | 6500 | 1.6 | HR-52 | 95/5 | 5900 | 1.6 |
| HR-20 | 30/70 | 6500 | 1.5 | HR-53 | 40/30/30 | 4500 | 1.3 |
| HR-21 | 50/50 | 6000 | 1.6 | HR-54 | 50/30/20 | 6500 | 1.8 |
| HR-22 | 50/50 | 3000 | 1.2 | HR-55 | 30/40/30 | 7000 | 1.5 |
| HR-23 | 50/50 | 5000 | 1.5 | HR-56 | 60/40 | 5500 | 1.7 |
| HR-24 | 50/50 | 4500 | 1.4 | HR-57 | 40/40/20 | 4000 | 1.3 |
| HR-25 | 30/70 | 5000 | 1.4 | HR-58 | 60/40 | 3800 | 1.4 |
| HR-26 | 50/50 | 5500 | 1.6 | HR-59 | 80/20 | 7400 | 1.6 |
| HR-27 | 50/50 | 3500 | 1.3 | HR-60 | 40/40/15/5 | 4800 | 1.5 |
| HR-28 | 50/50 | 6200 | 1.4 | HR-61 | 60/40 | 5600 | 1.5 |
| HR-29 | 50/50 | 6500 | 1.6 | HR-62 | 50/50 | 5900 | 2.1 |
| HR-30 | 50/50 | 6500 | 1.6 | HR-63 | 80/20 | 7000 | 1.7 |
| HR-31 | 50/50 | 4500 | 1.4 | HR-64 | 100 | 5500 | 1.8 |
| HR-32 | 30/70 | 5000 | 1.6 | HR-65 | 50/50 | 9500 | 1.9 |
| HR-33 | 30/30/40 | 6500 | 1.8 | | | | |

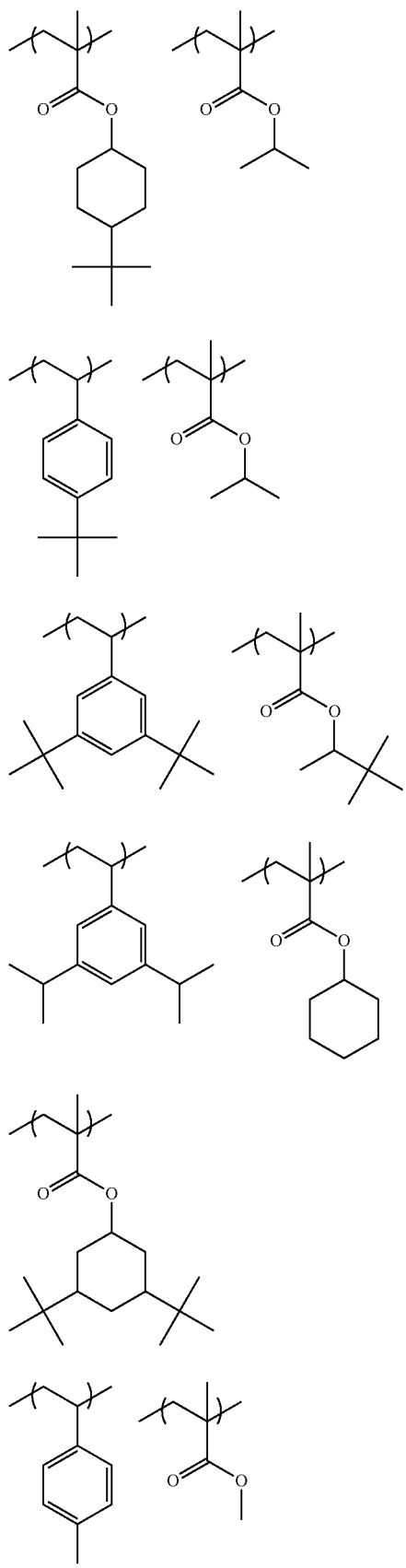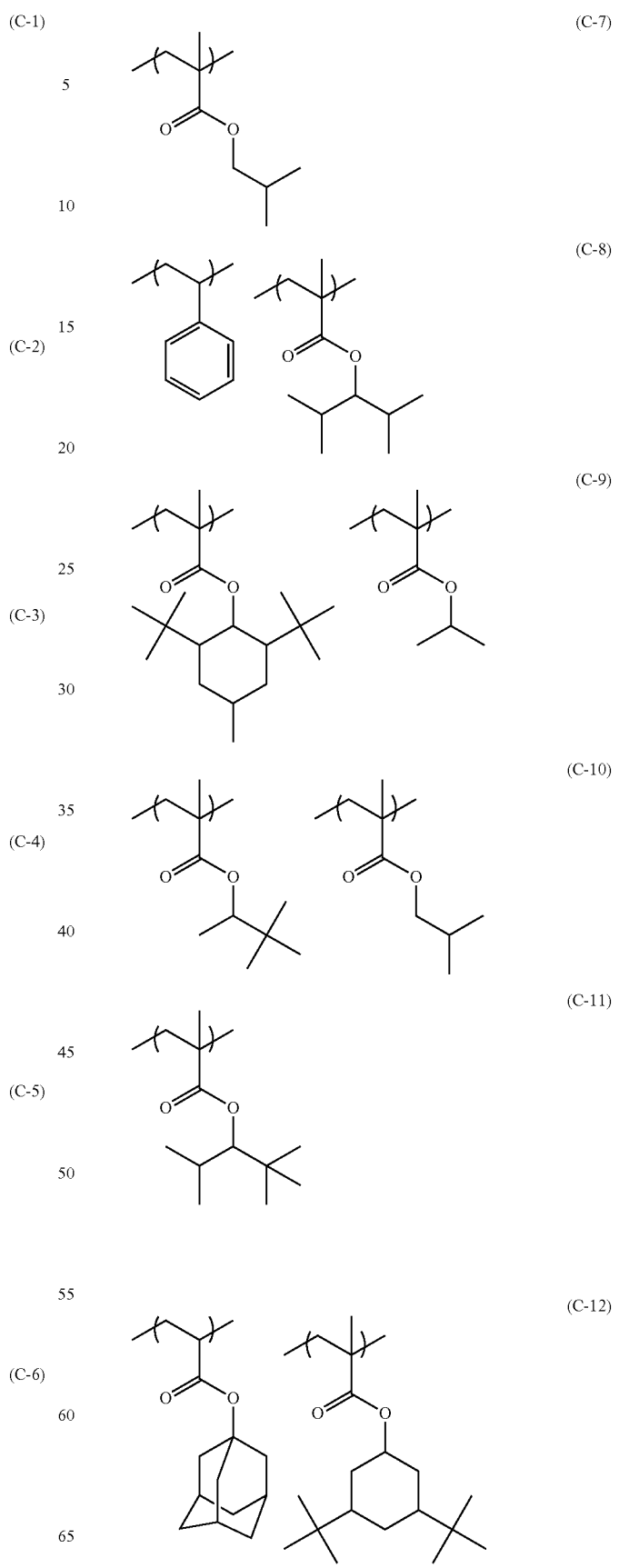

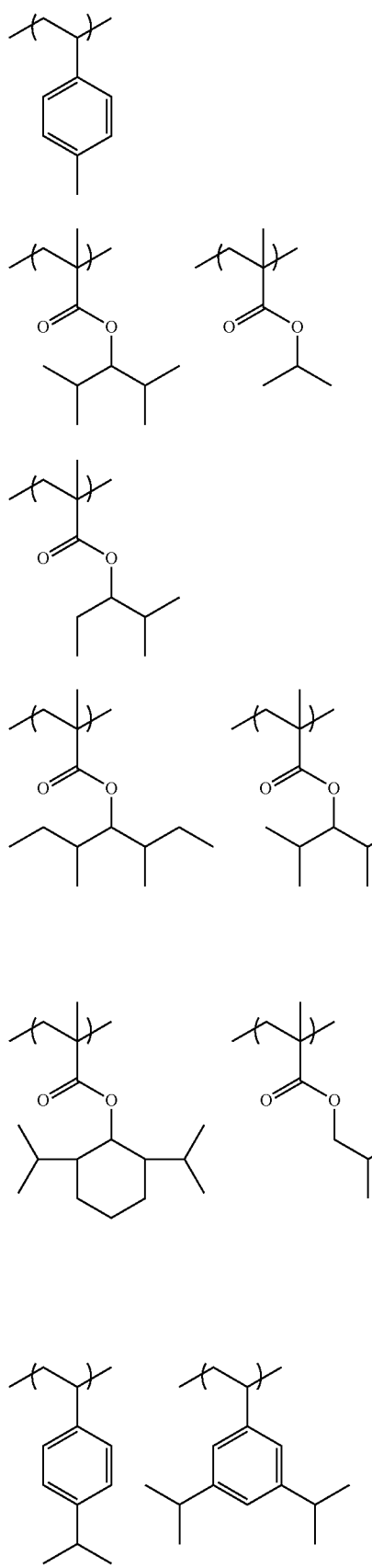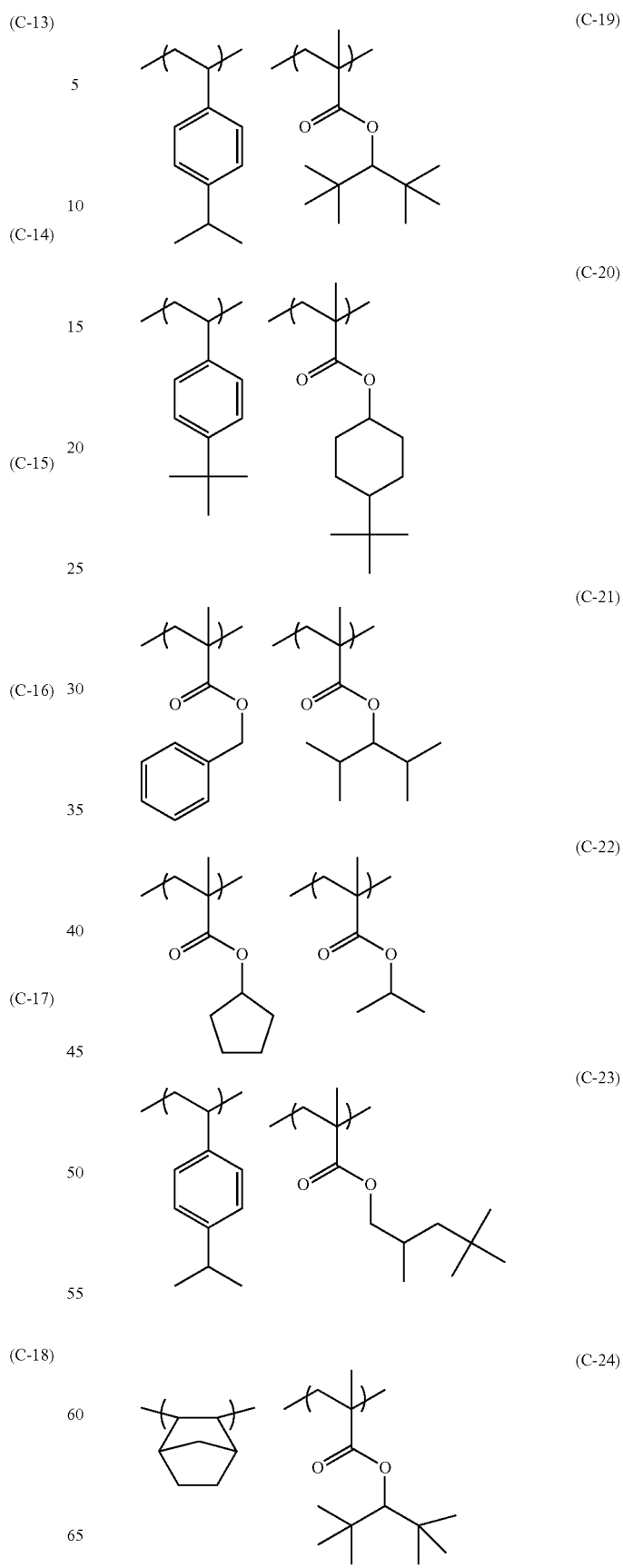

(C-25)
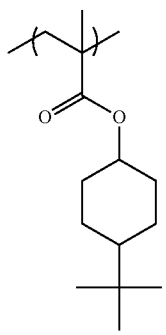 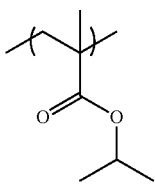 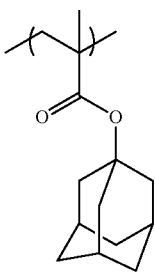
(C-26)
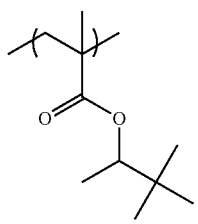 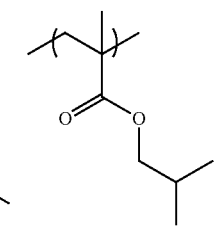 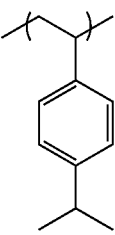
(C-27)
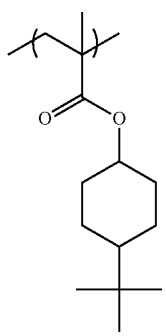 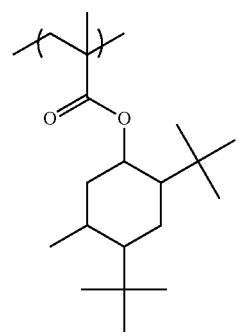
(C-28)
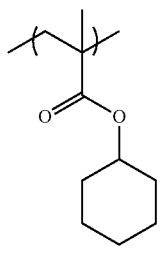 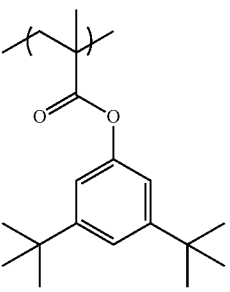
(D-1)
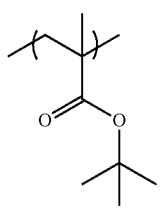 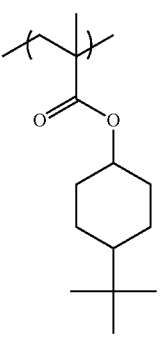
(D-2)
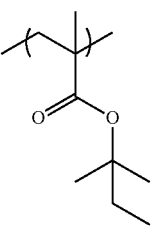 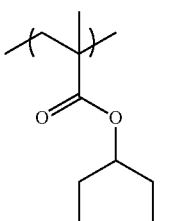 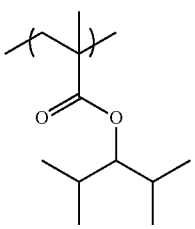
(D-3)
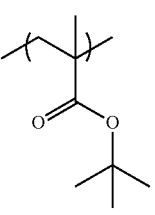 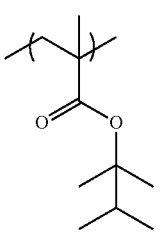 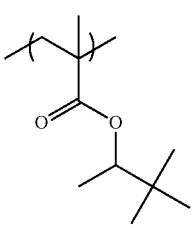
(D-4)
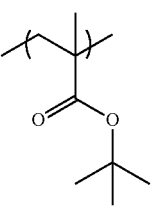 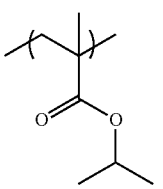
(D-5)
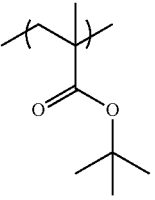 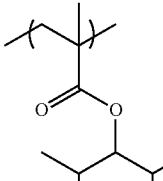
(D-6)
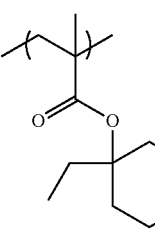 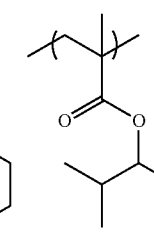
(D-7)
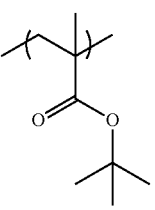 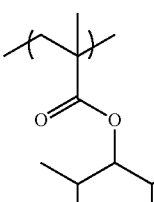 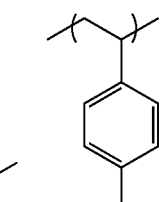

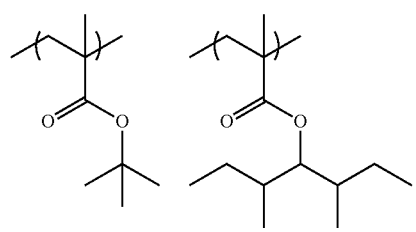
(D-8)
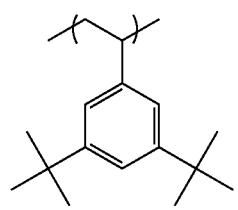
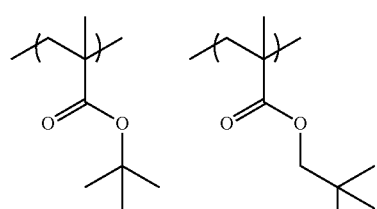
(D-9)
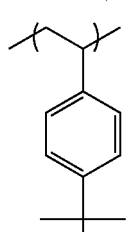
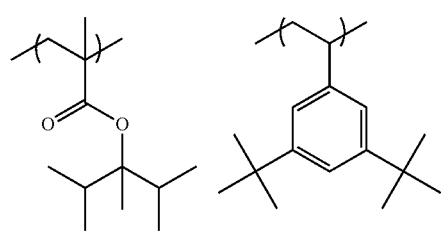
(D-10)
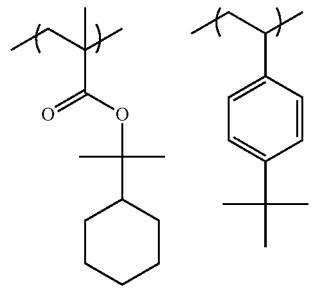
(D-11)
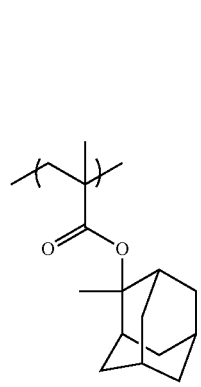
(D-12)
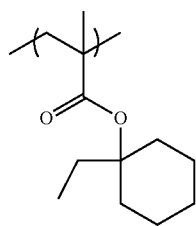
(D-13)
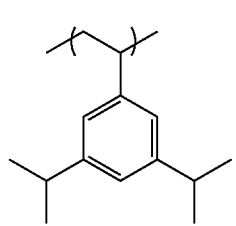
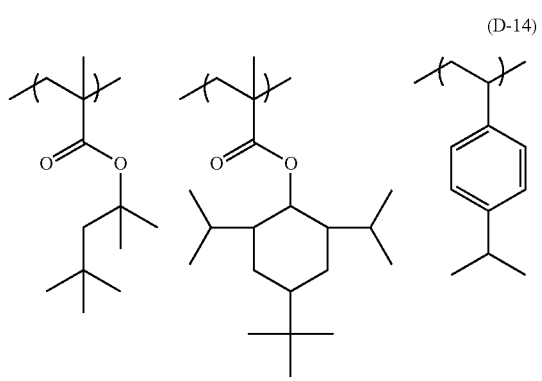
(D-14)
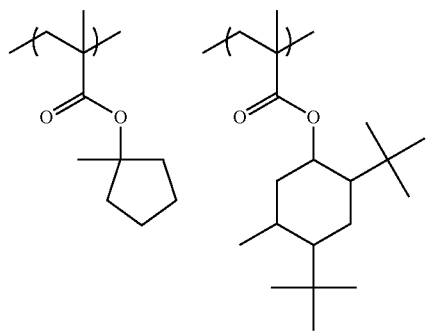
(D15)
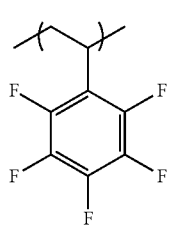

-continued

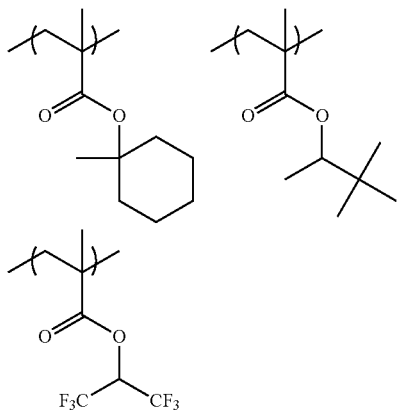

(D-16)

| RESIN | COMPOSITION | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/30 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[5] Basic Compound

The chemical amplification resist composition in the present invention preferably contains a basic compound.

The chemical amplification resist composition may preferably contain a basic compound or an ammonium salt compound (hereinafter, also referred to as a "compound (N)") whose basicity decreases upon irradiation with an actinic ray or radiation, as the basic compound.

The compound (N) is preferably a compound (N-1) having a basic functional group or an ammonium group and a group capable of generating an acidic functional group upon irradiation with an actinic ray or radiation. That is, the compound (N) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

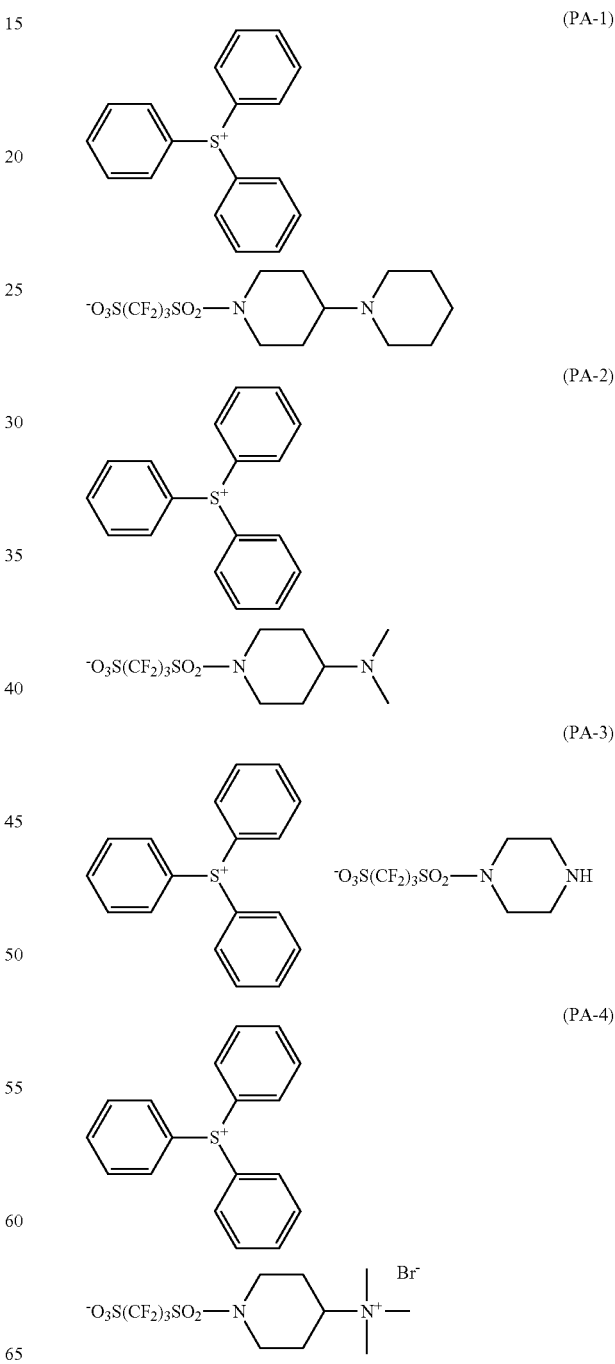

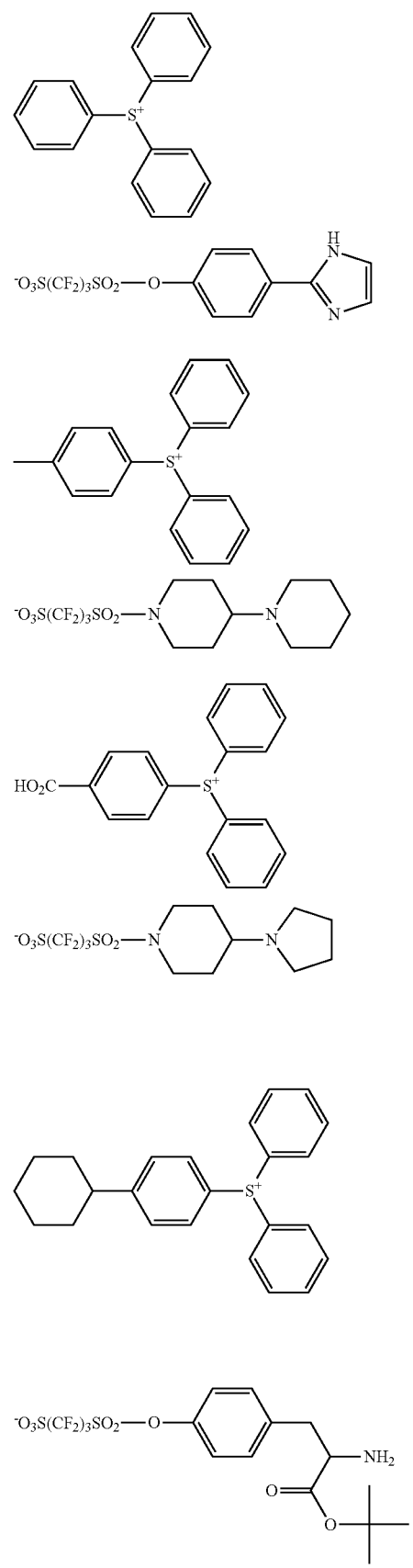
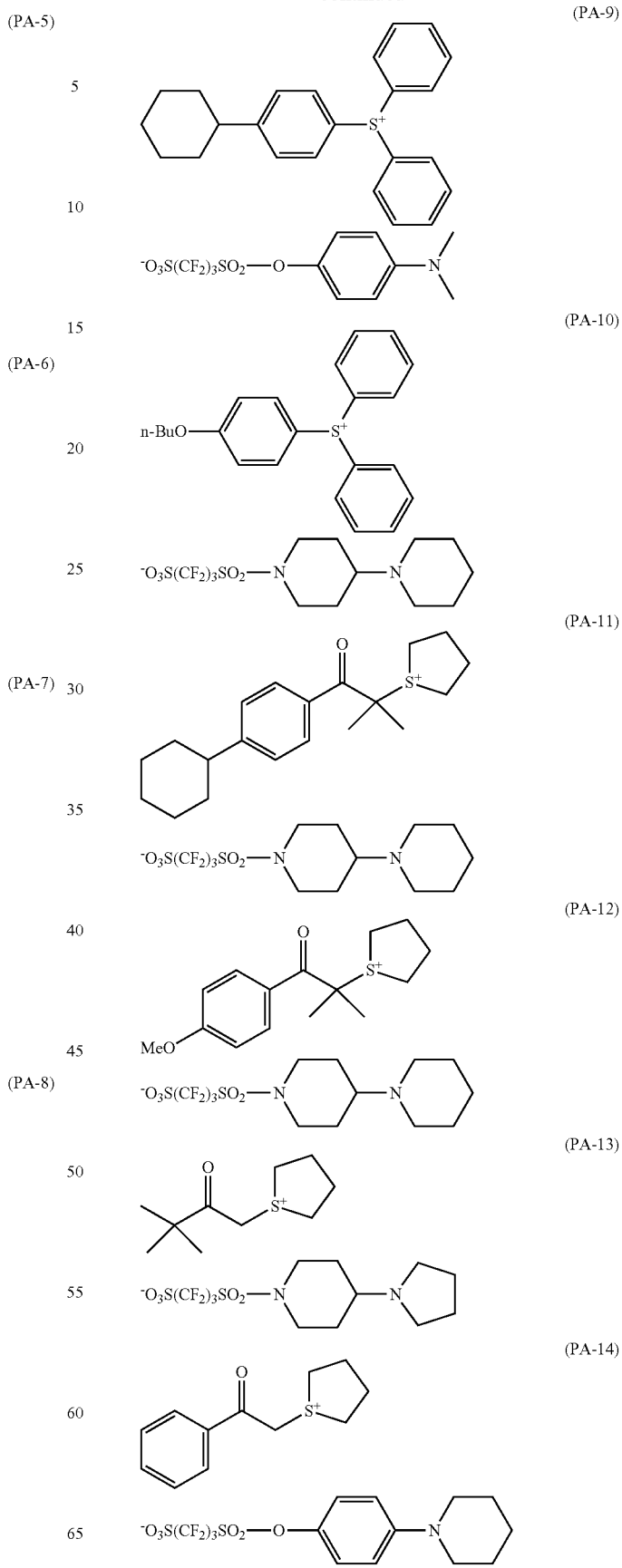

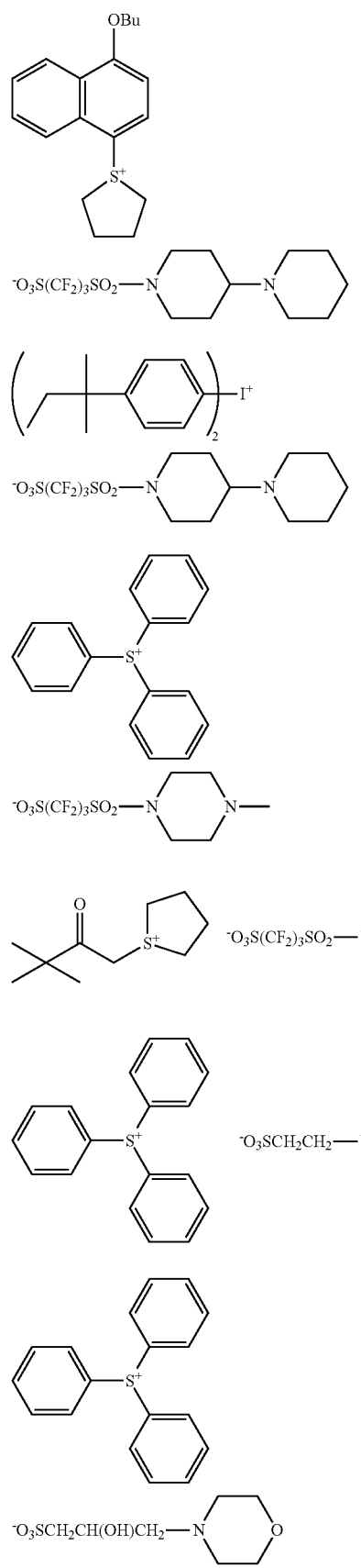
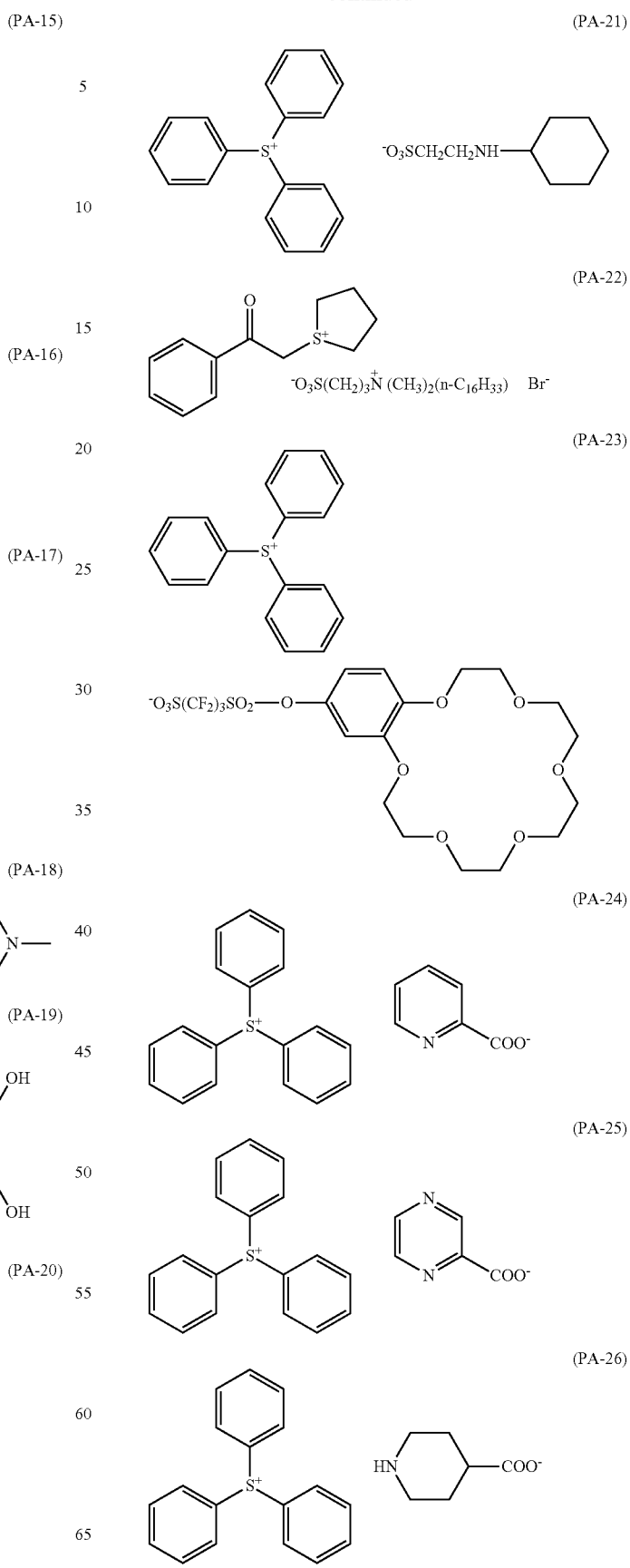

(PA-27)

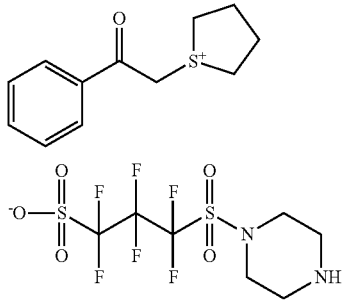

These compounds may be easily synthesized from a compound represented by Formula (PA-I) or a lithium, sodium or potassium salt thereof and a hydroxide, bromide, chloride or the like of iodonium or sulfonium, by using the salt exchange method described in Japanese Patent Application Publication No. H11-501909 or Japanese Patent Application Laid-Open No. 2003-246786. Further, the synthesis may also be performed in accordance with the synthesis method described in Japanese Patent Application Laid-Open No. H7-333851.

(PA-28)

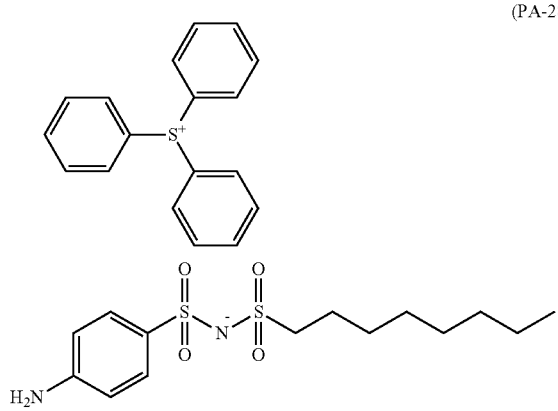

(PA-29)

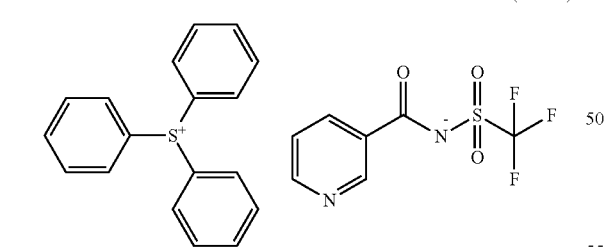

(PA30)

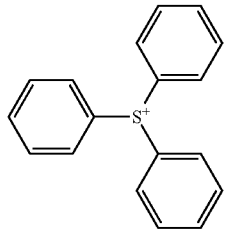

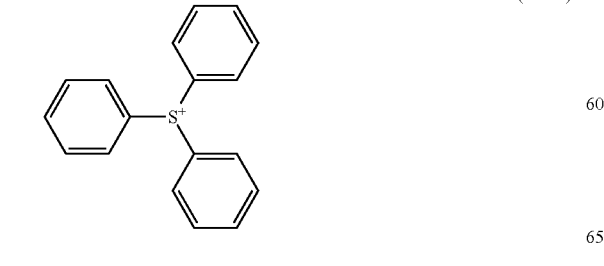

(PA-31)

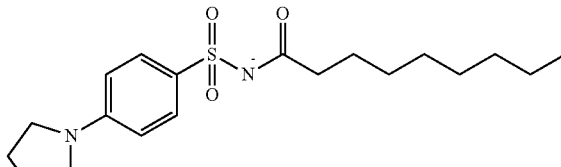

$C_4F_9SO_2NSO_2(CF_2)_3SO_2$—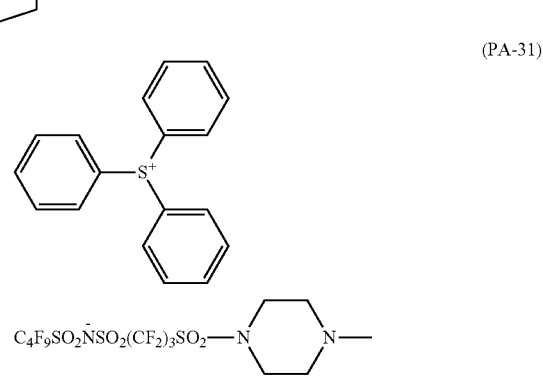

(PA-32)

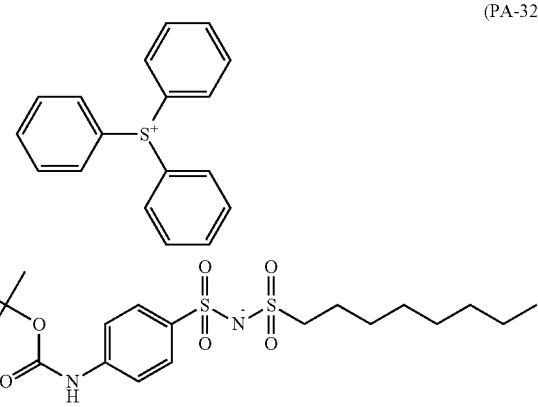

(PA-33)

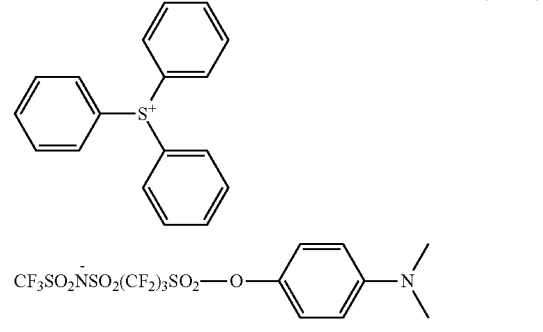

$CF_3SO_2NSO_2(CF_2)_3SO_2$—O—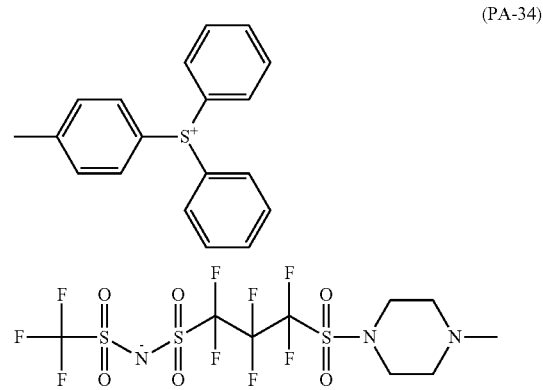

(PA-34)

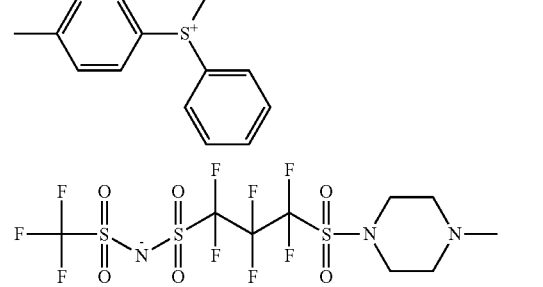

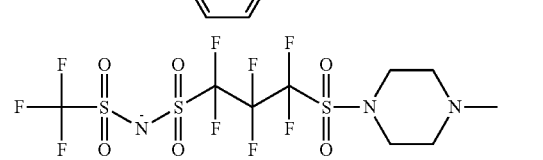

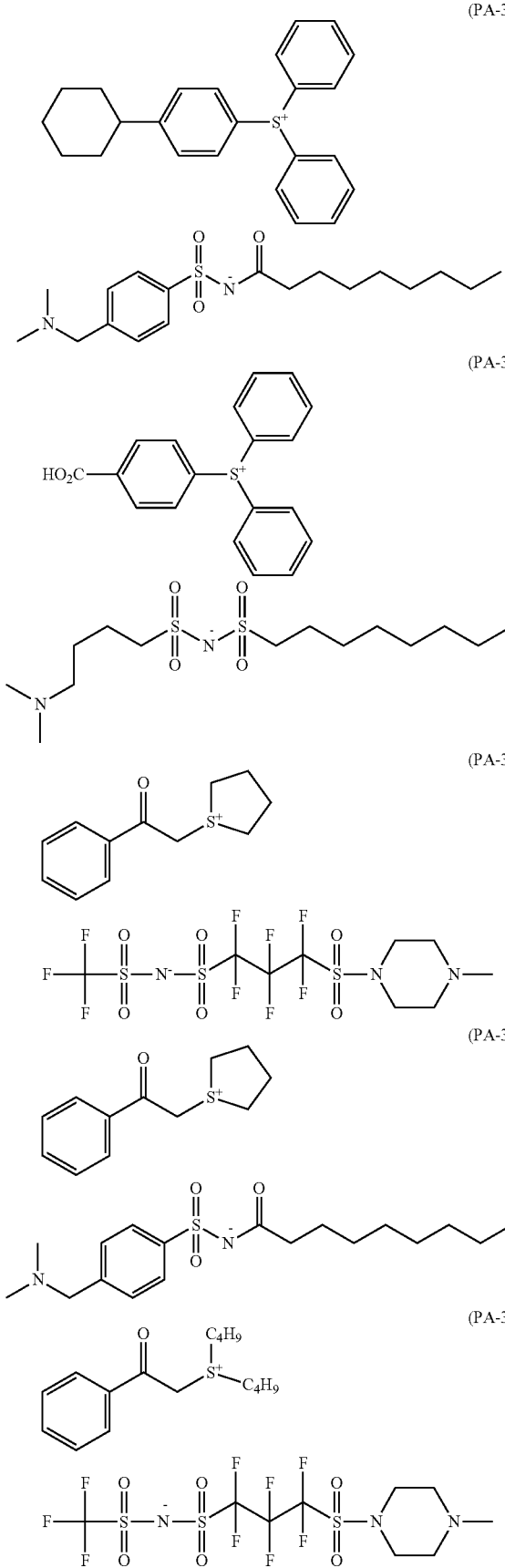

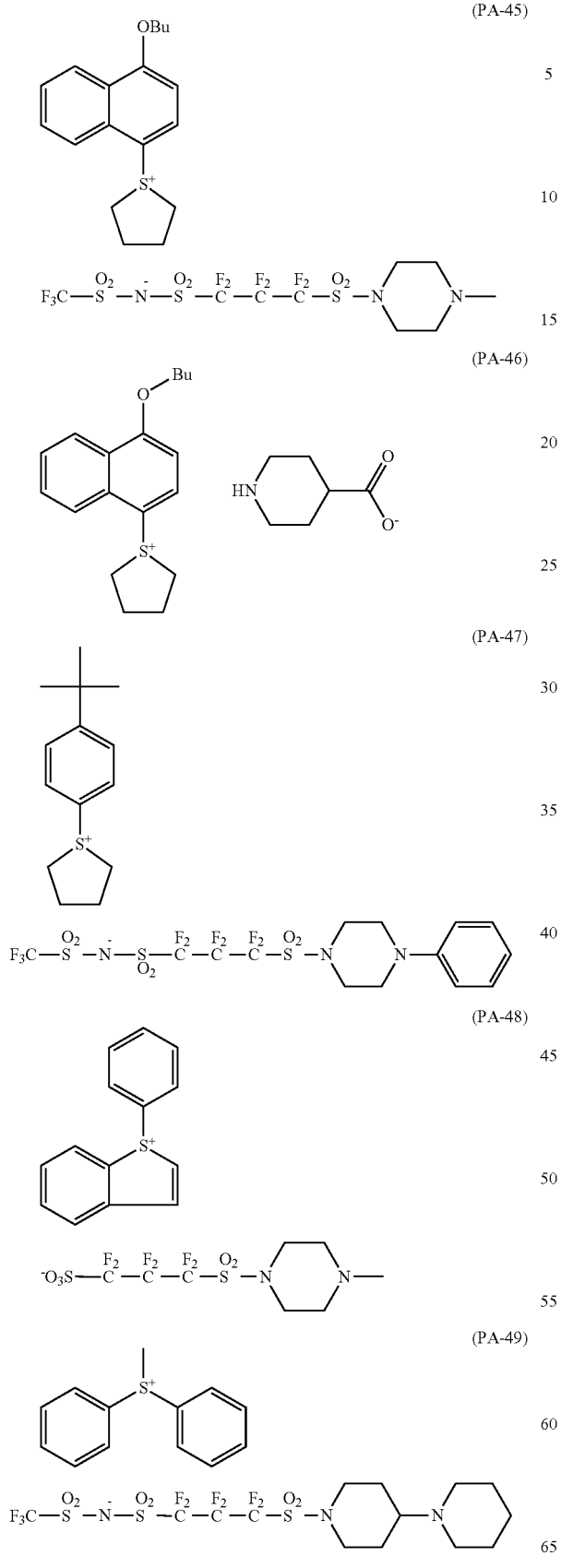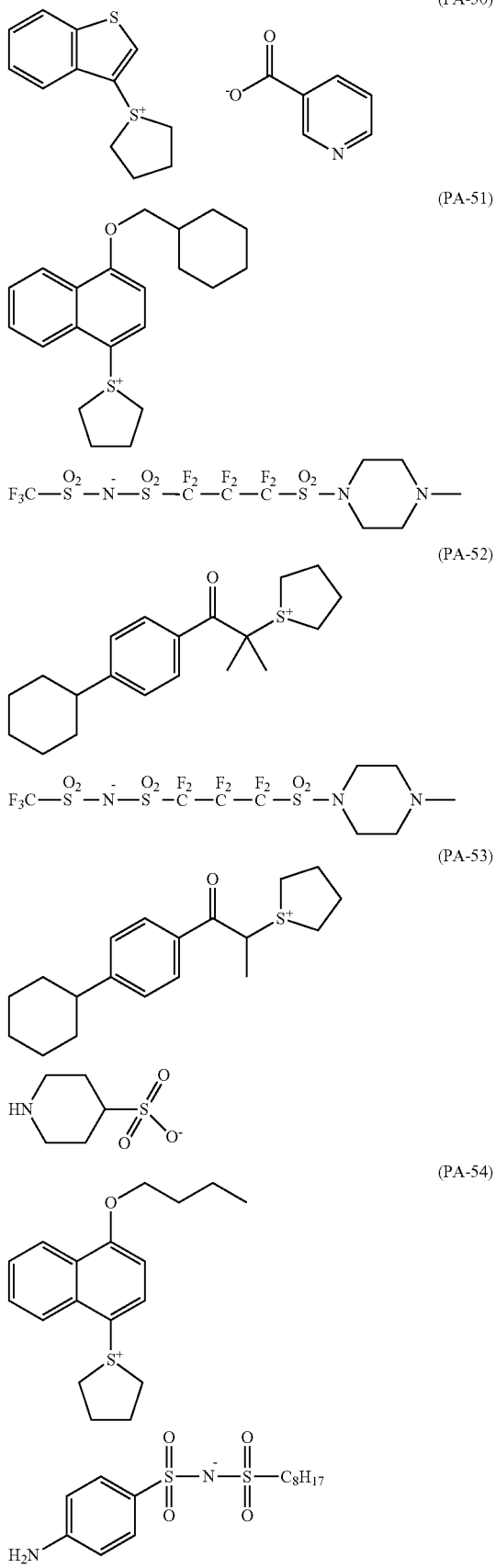

(PA-55)
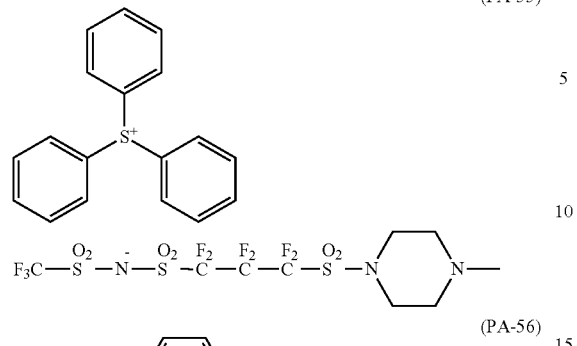
(PA-56)
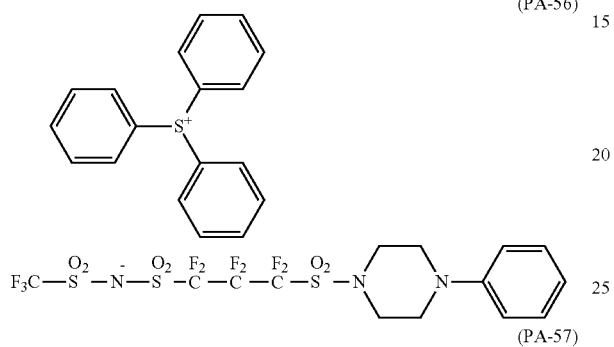
(PA-57)
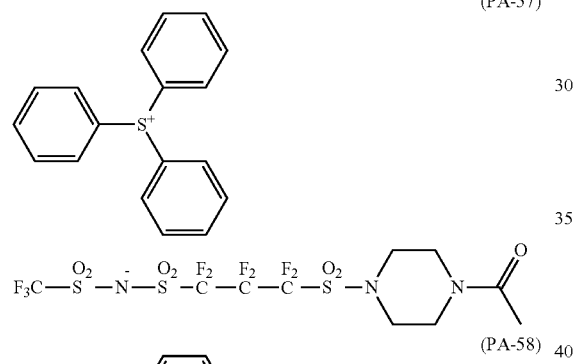
(PA-58)
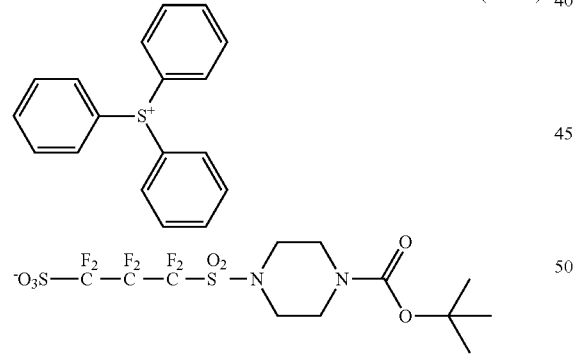
(PA-59)
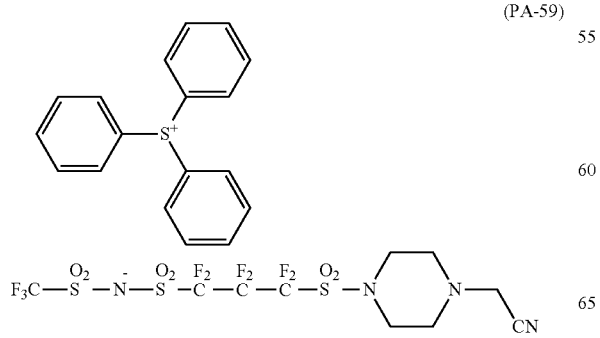
(PA-60)
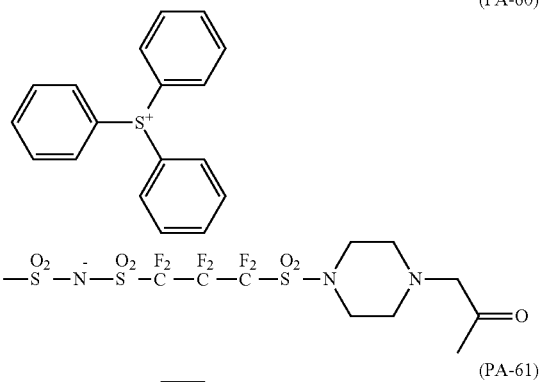
(PA-61)
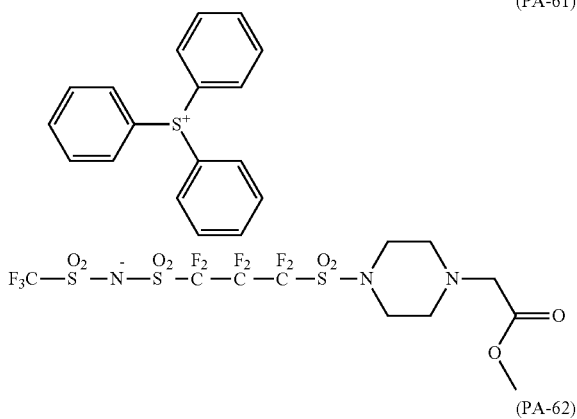
(PA-62)
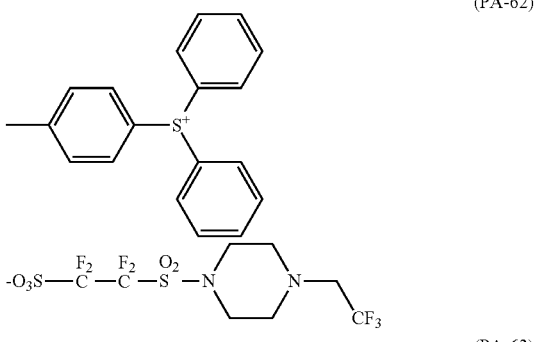
(PA-63)
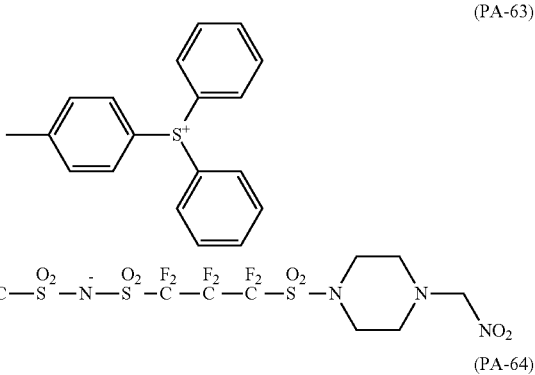
(PA-64)
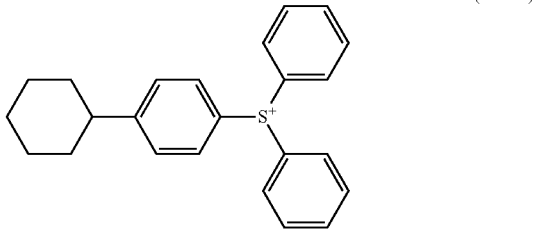

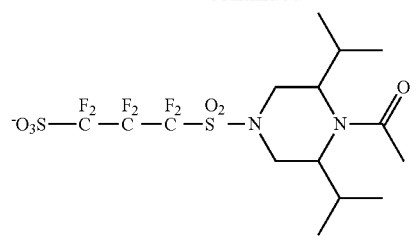

(PA-65)

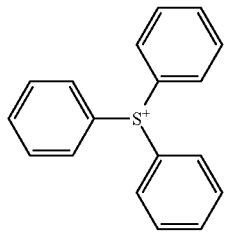

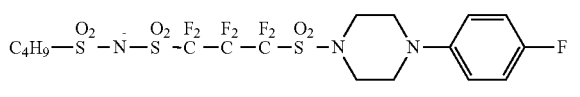

(PA-66)

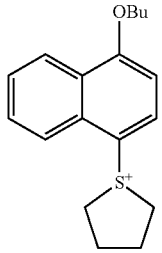

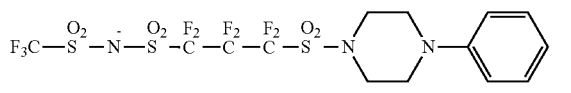

(PA-67)

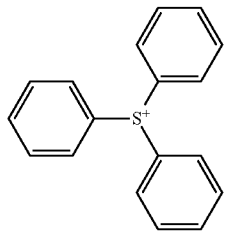

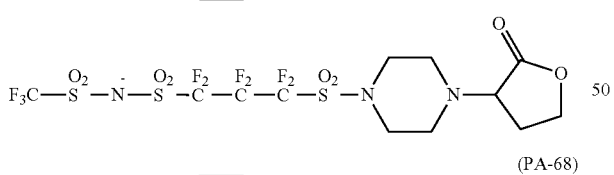

(PA-68)

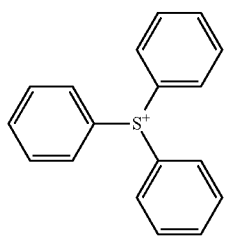

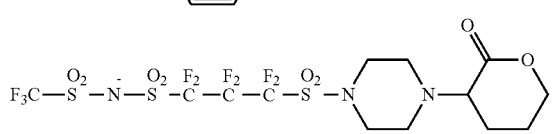

(PA-69)

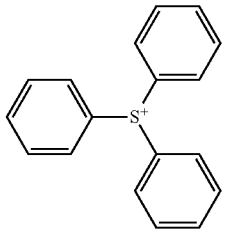

The compounds may be synthesized in accordance with, for example, a synthetic example of Japanese Patent Application Laid-Open No. 2006-330098.

The molecular weight of the compound (N) preferably ranges from 500 to 1000.

The chemical amplification resist composition in the present invention may or may not contain the compound (N), but in the case of containing the compound (N), the content of the compound (N) ranges preferably from 0.1% by mass to 20% by mass, and more preferably from 0.1% by mass to 10% by mass, based on the solid of the chemical amplification resist composition.

The chemical amplification resist composition in the present invention may contain, as a basic compound, a basic compound (N') different from the compound (N) in order to reduce the change in performance over time from exposure to heating.

Preferred examples of the basic compound (N') may include compounds having a structure represented by the following Formulas (A') to (E').

(A')

$$RA^{200}-\underset{\underset{RA^{201}}{|}}{N}-RA^{202}$$

(B')

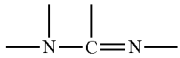

(C')

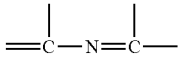

(D')

(E')

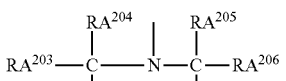

In Formulas (A') to (E'), $RA^{200}$'s, $RA^{201}$'s and $RA^{202}$'s may be the same as or different, and represent a hydrogen atom, an alkyl group (preferably having 1 to 20 carbon atoms), a cycloalkyl group (preferably having 3 to 20 carbon atoms) or an aryl group (having 6 to 20 carbon), and $RA^{201}$ and $RA^{202}$ may be bound with each other to form a ring. $RA^{203}$'s, $RA^{204}$'s, $RA^{205}$'s and $RA^{206}$'s may be the same as or different, and represent an alkyl group (preferably having 1 to 20 carbon atoms).

The alkyl group may have a substituent, and the alkyl group having a substituent is preferably an aminoalkyl group having 1 to 20 carbon atoms, a hydroxyalkyl group having 1 to 20 carbon atoms or a cyanoalkyl group having 1 to 20 carbon atoms.

The alkyl group in Formulas (A') to (E') is more preferably unsubstituted.

Preferred specific examples of the basic compound (N') may include guanidine, aminopyrrolidine, pyrazole, pyrazoline, piperazine, aminomorpholine, aminoalkylmorpholine, piperidine and the like, and more preferred specific examples thereof may include a compound having an imidazole structure, a diazabicyclo structure, an onium hydroxide structure, an onium carboxylate structure, a trialkylamine structure, an aniline structure or a pyridine structure, an alkylamine derivative having a hydroxyl group and/or an ether bond, an aniline derivative having a hydroxyl group and/or an ether bond and the like.

Examples of the compound having an imidazole structure may include imidazole, 2,4,5-triphenylimidazole, benzimidazole and the like. Examples of the compound having a diazabicyclo structure may include 1,4-diazabicyclo[2,2,2]octane, 1,5-diazabicyclo[4,3,0]non-5-ene, 1,8-diazabicyclo[5,4,0]undec-7-ene and the like. Examples of the compound having an onium hydroxide structure may include triarylsulfonium hydroxide, phenacylsulfonium hydroxide, a sulfonium hydroxide having a 2-oxoalkyl group, specifically, triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. Examples of the compound having an onium carboxylate structure may include a compound, in which the anion moiety of a compound having an onium hydroxide structure has been converted into carboxylate, such as acetate, adamantane-1-carboxylate and perfluoroalkylcarboxylate. Examples of the compound having a trialkylamine structure may include tri(n-butyl)amine, tri(n-octyl)amine and the like. Examples of the compound having an aniline structure may include 2,6-diisopropylaniline, N,N-dimethylaniline, N,N-dibutylaniline, N,N-dihexylaniline and the like. Examples of the alkylamine derivative having a hydroxyl group and/or an ether bond may include ethanolamine, diethanolamine, triethanolamine, tris(methoxyethoxyethyl)amine and the like. Examples of the aniline derivative having a hydroxyl group and/or an ether bond may include N,N-bis(hydroxyethyl)aniline and the like.

Examples of the preferred basic compound may further include an amine compound having a phenoxy group, an ammonium salt compound having a phenoxy group, an amine compound having a sulfonate ester group, and an ammonium salt compound having a sulfonate ester group. Specific examples thereof may include compounds (C1-1) to (C3-3) as exemplified in paragraph [0066] of U.S. Patent Application Laid-Open No. 2007/0224539, but are not limited thereto.

A nitrogen-containing organic compound having a group capable of leaving by the action of an acid may also be used as a kind of the basic compound. Specific examples of the compound will be described below.

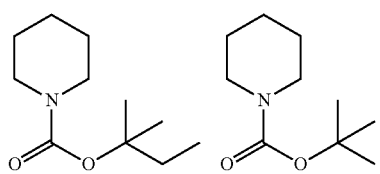

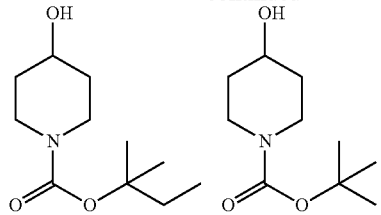

The compounds may be synthesized in accordance with the method described in, for example, Japanese Patent Application Laid-Open No. 2009-199021.

Further, a compound having an amine oxide structure may also be used as the basic compound (N'). Specific examples of the compound may include triethylamine pyridine N-oxide, tributylamine N-oxide, triethanolamine N-oxide, tris(methoxyethyl)amine N-oxide, tris(2-(methoxymethoxy)ethyl)amine=oxide, 2,2',2"-nitrilotriethylpropionate N-oxide, N-2-(2-methoxyethoxy)methoxyethylmorpholine N-oxide, and an amine oxide compound exemplified in Japanese Patent Application Laid-Open No. 2008-102383.

The molecular weight of the basic compound (N') ranges preferably from 250 to 2,000, and more preferably from 400 to 1,000. From the viewpoint of more reduction in LWR and uniformity of local pattern dimension, the molecular weight of the basic compound is preferably 400 or more, more preferably 500 or more, and still more preferably 600 or more.

These basic compounds (N') may be used in combination with the compound (N), and are used either alone or in combination of two or more thereof.

The chemical amplification resist composition in the present invention may or may not contain the basic compound (N'), but in the case of containing the basic compound (N'), the amount of the basic compound (N') to be used usually ranges from 0.001% by mass to 10% by mass, and preferably from 0.01% by mass to 5% by mass, based on the solid of the chemical amplification resist composition.

The chemical amplification resist composition in the present invention may preferably include a compound having both an onium salt structure and an acid anion structure in one molecule (hereinafter, also referred to as a betaine compound), such as, for example, a compound included in Formula (I) of Japanese Patent Application Laid-Open No. 2012-189977, a compound represented by Formula (I) of Japanese Patent Application Laid-Open No. 2013-6827, a compound represented by Formula (I) of Japanese Patent Application Laid-Open No. 2013-8020, a compound represented by Formula (I) of Japanese Patent Application Laid-Open No. 2012-252124. Examples of the onium salt structure may include sulfonium, iodonium, and ammonium structure, and a sulfonium or iodonium salt structure is preferred. As for the acid anion structure, a sulfonic acid anion or a carboxylic acid anion is preferred. Examples of the compound may be described as follows.

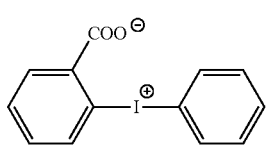

C1-1

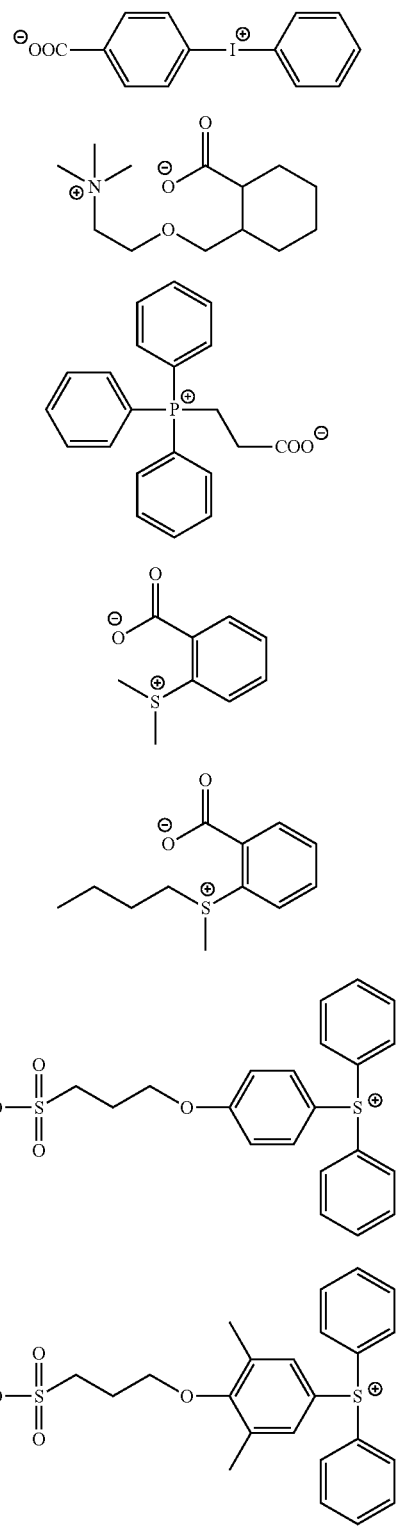

[6] Surfactant (F)

The chemical amplification resist composition in the present invention may or may not further contain a surfactant, but in the case of containing a surfactant, it is more preferred that the composition contains any one of fluorine and/or silicon-based surfactants (a fluorine-based surfactant, a silicon-based surfactant and a surfactant having both a fluorine atom and a silicon atom), or two or more thereof.

The chemical amplification resist composition in the present invention contains a surfactant, thereby imparting a resist pattern with adhesion and reduced development defects due to improved sensitivity and resolution when using an exposure light source with a wavelength of 250 nm or less, particularly 220 nm or less.

Examples of the fluorine-based and/or silicon-based surfactants may include surfactants described in paragraph [0276] of U.S. Patent Application Publication No. 2008/0248425, such as Eftop EF301 and EF303 (manufactured by Shin-Akita Chemical Co., Ltd.), Fluorad FC430, 431 and 4430 (manufactured by Sumitomo 3M Limited), Megafac F171, F173, F176, F189, F113, F110, F177, F120 and R08 (manufactured by DIC Corporation), Surflon S-382, SC101, 102, 103, 104, 105 and 106 and KH-20 (manufactured by Asahi Glass Co., Ltd.), Troysol S-366 (manufactured by Troy Chemical Industries, Inc.), GF-300 and GF-150 (manufactured by Toagosei Chemical Industry Co., Ltd.), Surflon S-393 (manufactured by Seimi Chemical Co., Ltd.), Eftop EF121, EF122A, EF122B, RF122C, EF125M, EF135M, EF351, EF352, EF801, EF802 and EF601 (manufactured by JEMCO Co., Ltd.), PF636, PF656, PF6320 and PF6520 (manufactured by OMNOVA Solutions, Inc.), and FTX-204G, 208G, 218G, 230G, 204D, 208D, 212D, 218D and 222D (manufactured by NEOS Co., Ltd.). In addition, polysiloxane polymer KP-341 (manufactured by Shin-Etsu Chemical Co., Ltd.) may also be used as the silicon-based surfactant.

Further, other than the conventionally known surfactants described above, it is possible to use a surfactant using a polymer having a fluoro-aliphatic group derived from a fluoro-aliphatic compound which is prepared by a telomerization method (also referred to as a telomer method) or an oligomerization method (also referred to as an oligomer method), as the surfactant. The fluoro-aliphatic compound may be synthesized by the method described in Japanese Patent Application Laid-Open No. 2002-90991.

Examples of a surfactant corresponding to the aforementioned surfactant may include Megafac F178, F-470, F-473, F-475, F-476 and F-472 (manufactured by DIC Corporation), a copolymer of an acrylate (or methacrylate) having a $C_6F_{13}$ group with a (poly(oxyalkylene))acrylate (or methacrylate), a copolymer of an acrylate (or methacrylate) having a $C_3F_7$ group with a (poly(oxyethylene))acrylate (or methacrylate) and a (poly(oxypropylene))acrylate (or methacrylate), and the like.

Further, in the present invention, it is also possible to use a surfactant other than the fluorine-based and/or silicon-based surfactant, described in paragraph [0280] of U.S. Patent Application Publication No. 2008/0248425.

These surfactants may be used either alone or in combination of several thereof.

When the chemical amplification resist composition contains a surfactant, the amount of the surfactant to be used ranges preferably from 0.0001% by mass to 2% by mass, and more preferably from 0.0005% by mass to 1% by mass, based on the total amount of the chemical amplification resist composition (excluding the solvent).

Meanwhile, by adjusting the amount of the surfactant to be added to 10 ppm or less based on the total amount of the chemical amplification resist composition (excluding the solvent), the surface uneven distribution of the hydrophobic resin is increased, and accordingly, the surface of the resist film may be made to be more hydrophobic, thereby improving the water follow-up property at the time of immersion exposure.

[7] (G) Other Additives

The chemical amplification resist composition in the present invention may contain a carboxylic acidonium salt. Examples of the carboxylic acidonium salt may include those described in paragraphs [0605] to [0606] of U.S. Patent Application Laid-Open No. 2008/0187860.

In the case where the chemical amplification resist composition contains a carboxylic acid onium salt, the content thereof generally ranges from 0.1% by mass to 20% by mass, preferably from 0.5% by mass to 10% by mass, and more preferably from 1% by mass to 7% by mass, based on the total solid of the composition.

The chemical amplification resist composition of the present invention may contain a so-called acid amplifier if necessary. The acid amplifier is preferably used, in particular, when the pattern forming method of the present invention is performed by EUV exposure or electron beam irradiation. Specific examples of the acid amplifier may be described as follows, but not particularly limited thereto.

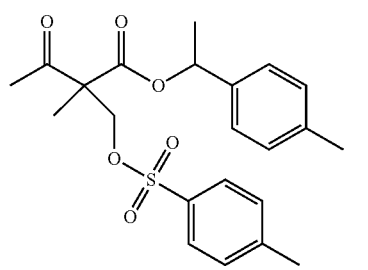

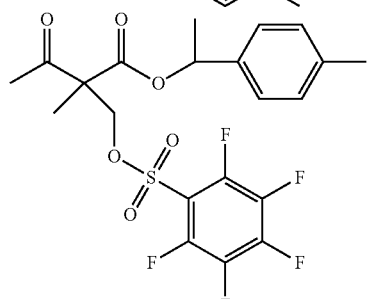

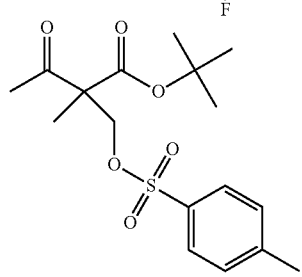

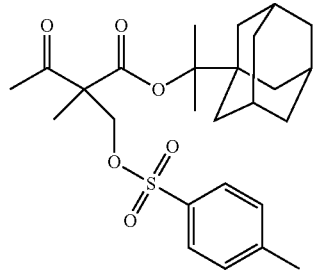

-continued

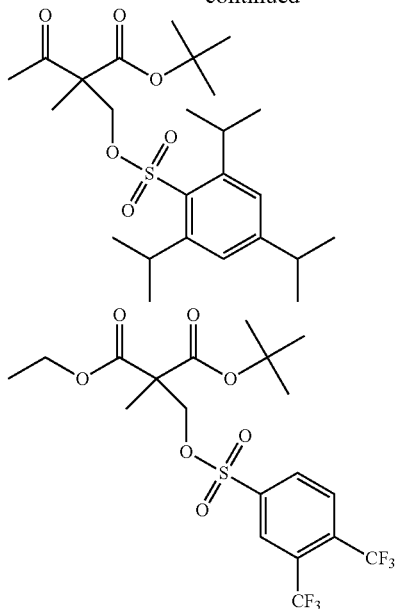

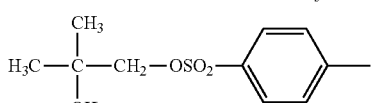

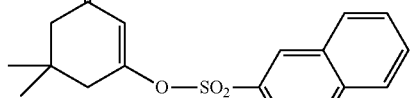

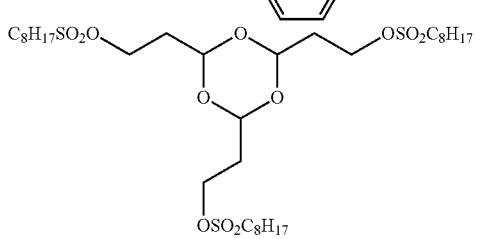

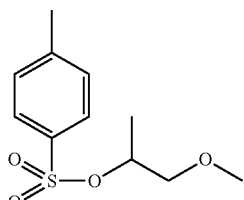

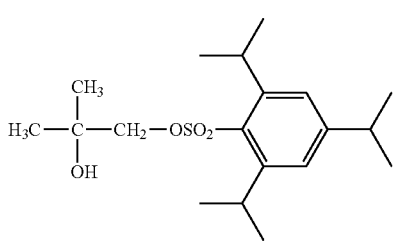

-continued

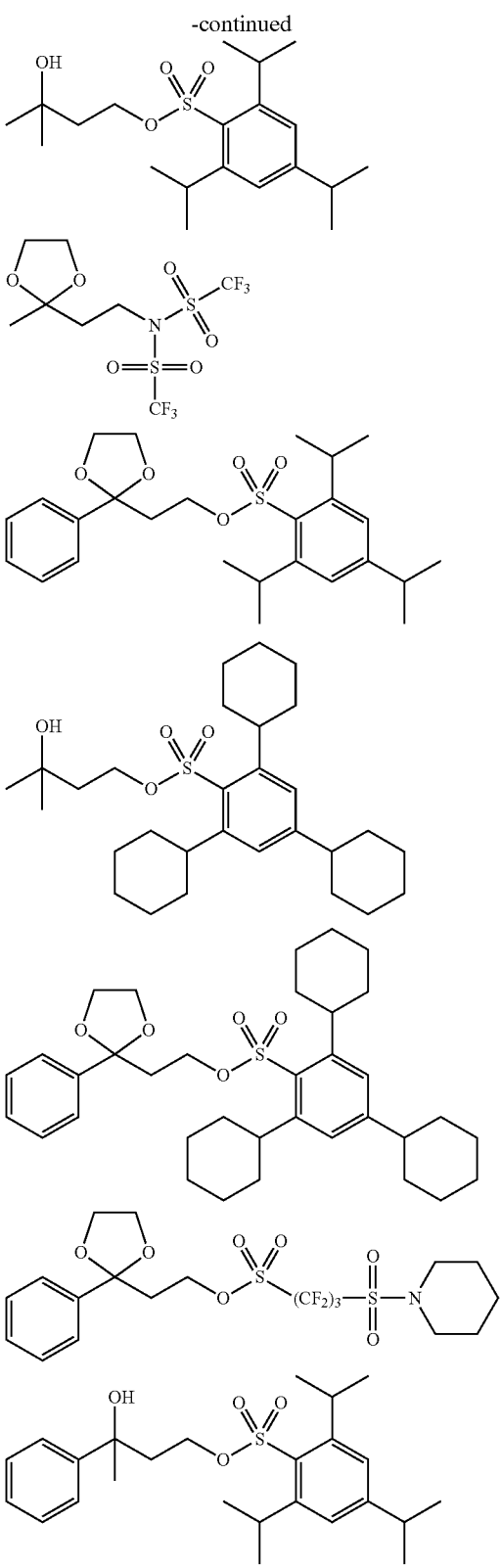

The chemical amplification resist composition of the present invention may further contain a dye, a plasticizer, a photosensitizer, a light absorber, an alkali-soluble resin, a dissolution inhibitor, a compound for accelerating solubility in a developer (for example, a phenol compound having a molecular weight of 1,000 or less, or an alicyclic or aliphatic compound having a carboxyl group) and the like, if necessary.

From the viewpoint of improving the resolution, the chemical amplification resist composition in the present invention is preferably used in a film thickness ranging from 30 nm to 250 nm, and more preferably from 30 nm to 200 nm.

The solid concentration of the chemical amplification resist composition in the present invention usually ranges from 1.0% by mass to 10% by mass, preferably from 2.0% by mass to 5.7% by mass, and more preferably from 2.0% by mass to 5.3% by mass. By setting the solid concentration to the aforementioned range, the resist solution may be uniformly applied on a substrate.

The solid concentration is a weight percentage of the weight of other resist components excluding the solvent, based on the total weight of the chemical amplification resist composition.

The chemical amplification resist composition in the present invention is used by dissolving the aforementioned components in a predetermined organic solvent, preferably in the mixed solvent, filtering the solution through a filter, and then applying the filtered solution on a predetermined support (substrate). The filter used for filtration is preferably a polytetrafluoroethylene-, polyethylene- or nylon-made filter having a pore size of 0.1 µm or less, more preferably 0.05 µm or less, and still more preferably 0.03 µm or less. In the filtration through a filter, as described in, for example, Japanese Patent Application Laid-Open No. 2002-62667, circulating filtration may be performed, or the filtration may be performed by connecting a plurality of kinds of filters in series or in parallel. In addition, the composition may be filtered a plurality of times. Further, a deaeration treatment or the like may be applied to the composition before or after filtration.

The present invention also relates to a method of manufacturing an electronic device, which includes the above described pattern forming method of the present invention, and an electronic device manufactured by the manufacturing method.

The electronic device of the present invention is properly mounted in electrical and electronic devices (e.g., home appliances, OA-media-related devices, optical devices and communication devices).

EXAMPLES

Examples 1 to 8 and Comparative Examples 1 to 4

<Container>

As a container, following containers were prepared, respectively.

Container 1: FluoroPurePFA complex drum manufactured by Entegris Inc. (liquid contact inner surface; PFA resin lining)

Container 2: steel drum can manufactured by JFE (liquid contact inner surface; zinc phosphate film)

Container 3: chemical drum PS-200-AW manufactured by Kodama Plastics Co., Ltd. (liquid contact inner surface; high density polyethylene resin)

Container 4: pure drum PL-200-CW manufactured by Kodama Plastics Co., Ltd. (liquid contact inner surface; high density polyethylene resin)

Container 5: FluoroPure three-layered HDPE drum manufactured by Entegris Inc. (liquid contact inner surface; high density polyethylene resin)

Container 6: recycled steel drum can (liquid contact inner surface; unknown)

<Preparation of Developer>

Immediately after distilled, butyl acetate was charged into each container described above, and stored at room temperature (25° C.) for X days (values of X are noted in Table 1 below).

Butyl acetate was taken out of the container, filtered through a polytetrafluoroethylene (PTFE) filter having a pore size 50 of nm, and was set as an evaluation developer.

<Wet Particle Evaluation>

The number of particles (N1) on a 8-inch silicon wafer was tested by a wafer defect evaluation apparatus ComPLUS3T (test mode 30T) manufactured by AMAT Corp., which was provided in a class 1000 clean room.

5 mL of butyl acetate as the evaluation developer was ejected to the silicon wafer, and the silicon wafer was rotated at 1000 rpm for 1.6 sec to diffuse butyl acetate on the silicon wafer. After standing still for 20 sec, the silicon wafer was spun and dried at 2000 rpm for 20 sec.

After 24 hours, the number of particles (N2) on the silicon wafer was tested by a wafer defect evaluation apparatus ComPLUS3T (test mode 30T) manufactured by AMAT Corp. so that N2-N1 was set as the number of wet particles (N).

<Organic Impurity Concentration Analysis>

10 mg of 1-docosene manufactured by Tokyo Kasei Kogyo Co., Ltd. was dissolved in 1 kg of butyl acetate immediately after distilled. The solution was taken in 50 μL to a sample container for a pyrolysis device, and naturally dried. The sample was subjected to a gas chromatograph mass spectrometry by a gas chromatograph mass spectrometer, GCMS-QP2010, manufactured by Shimadzu Co., Ltd., which was connected to a pyrolysis device, PY2020D, manufactured by Frontier Lab, and a peak area (S0) of 1-docosene was obtained from the spectrum.

Pyrolysis conditions in the gas chromatograph mass spectrometry are as follows.

Then, butyl acetate, as the evaluation developer, was concentrated to a 1/10 weight at a room temperature (25° C.) using an evaporator, and the solution taken in 50 μL to a sample container for a pyrolysis device, and naturally dried. The sample was subjected to a gas chromatograph mass spectrometry using the gas chromatograph mass spectrometer described above to obtain the sum ($S_1$) of spectral peak areas corresponding to a polyolefin compound having a carbon number of 22 or less. Then, the organic impurity concentration was calculated by the following equation.

Organic impurity concentration (ppm)=$S_1/S_0$

<Metal Impurity Concentration Analysis>

10 μL of ICP general-purpose mixture XSTC-622 (35 elements) manufactured by Spex Corp., in which each element concentration was 10 ppm in preparation, was added with 10 mL of N-methylpyrrolidone (NMP) and diluted to prepare a standard solution for 10 ppb for metal analysis.

5 ppb standard solution for metal analysis was prepared in the same manner except that the amount of NMP was changed. NMP used for dilution was 0 ppb standard solution for metal analysis.

Target metals as metal impurities include 12 elements of Na, K, Ca, Fe, Cu, Mg, Mn, Li, Al, Cr, Ni, and Zn. The prepared 0 ppb, 5 ppb, and 10 ppb standard solutions for the metal analysis were measured by an inductively coupled plasma mass spectrometer (ICP-MS equipment), Agilent7500cs, manufactured by Agilent Technologies, Inc. to create a metal concentration calibration curve.

Then, the inductively coupled plasma mass spectrometry was performed in the same manner as described above except that the standard solution for the metal analysis was changed to butyl acetate as the evaluation developer to perform analysis of the metal impurity concentration of butyl acetate.

The results of the evaluation analysis are noted in Table 1 below.

TABLE 1

| Example | Container | Storage Period within Container (X) | Number of Particles (N) | Evaluation Result Organic Impurity Concentration (ppm) | Metal Impurity Concentration (ppm) |
|---|---|---|---|---|---|
| Example 1 | Container 1 | 1 day | 7 | Undetected | 1 |
| Example 2 | Container 1 | 3 day | 7 | Undetected | 1 |
| Example 3 | Container 1 | 7 day | 10 | Undetected | 2 |
| Example 4 | Container 1 | 14 day | 8 | Undetected | 3 |
| Example 5 | Container 2 | 1 day | 5 | Undetected | 2 |
| Example 6 | Container 2 | 3 day | 3 | Undetected | 1 |
| Example 7 | Container 2 | 7 day | 6 | Undetected | 2 |
| Example 8 | Container 2 | 14 day | 5 | Undetected | 3 |
| Comp. Example 1 | Container 3 | 7 day | 42515 | 7 | 2 |
| Comp. Example 2 | Container 4 | 7 day | 56248 | 10 | 1 |
| Comp. Example 3 | Container 5 | 7 day | 65427 | 16 | 3 |
| Comp. Example 4 | Container 6 | 14 day | 1353 | Undetected | 14 |

Injection, interface temperature: 300° C.,

Column: pyrolysis device column manufactured by Frontier Lab, UA-5 (30 m×0.25 mm D film thickness 0.25 μm)

Column temperature sequence: 50° C. (2 min)→15° C./min→280° C. (15 min)

Split ratio: 1/23.5

Detector: 0.8 kV

Pyrolysis furnace temperature: 300° C.

In Table above, as the metal impurity concentration, among metal concentrations of 12 elements, the highest concentration value was noted.

As can be seen in Table above, when butyl acetate in Examples was used as the organic processing liquid for patterning the chemical amplification resist film according to the present invention, the number of particles which may be problematic in, particularly, a fine pattern (for example, 30 nm node or less) was largely reduced.

Synthesis Example (Synthesis of Resin A-1)

Under a nitrogen stream, 102.3 parts by mass of cyclohexanone was heated at 80° C. While the liquid was stirred, a mixed solution of 22.2 parts by mass of monomer represented by the following Structural Formula M-1, 22.8 parts by mass of monomer represented by the following Structural Formula M-2, 6.6 parts by mass of monomer represented by the following Structural Formula M-3, 189.9 parts by mass of cyclohexanone, and 2.40 parts by mass of 2,2'-dimethyl azobisisobutyrate [V-601, manufactured by Wako Pure Chemical Industries, Ltd.] was added dropwise thereto over 5 hours. After the completion of the dropwise addition, the solution was further stirred at 80° C. for 2 hours. The reaction solution was allowed to cool, then subjected to reprecipitation with a large amount of hexane/ethyl acetate (mass ratio 9:1), and filtered to obtain a solid, and the solid was dried under vacuum to obtain 41.1 parts by mass of Resin (A-1) of the present invention.

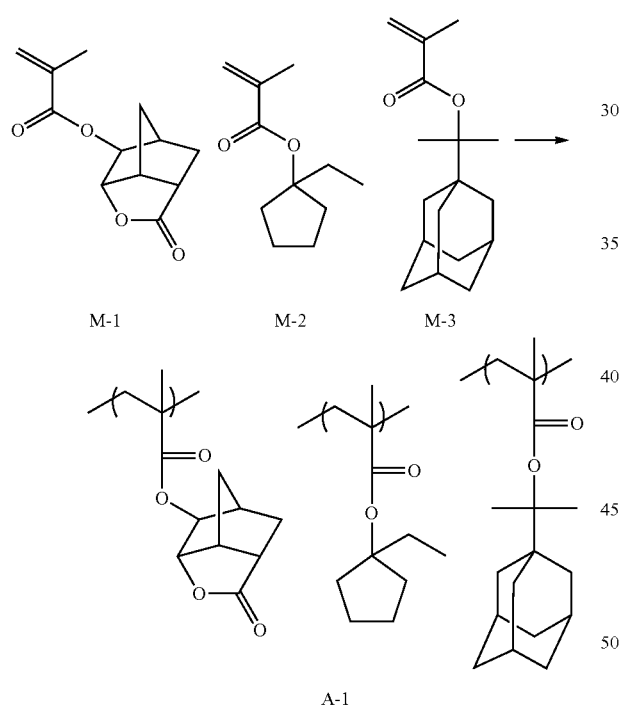

The weight average molecular weight (Mw: in terms of polystyrene) obtained from the GPC (carrier: tetrahydrofuran (THF)) of the obtained resin was Mw=9,500 with a polydispersity Mw/Mn=1.60. The composition ratio (molar ratio) measured by $^{13}$C-NMR was 40/50/10.

<Resin (A)>

Hereinafter, Resins (A-2) to (A-3) were synthesized in the same manner as above. The composition ratio of the repeating unit (molar ratio, corresponding to each repeating unit sequentially from the left), mass average molecular weight (Mw) and polydispersity (Mw/Mn) in Resins A-2 to A-3 together with Resin A-1 will be shown below.

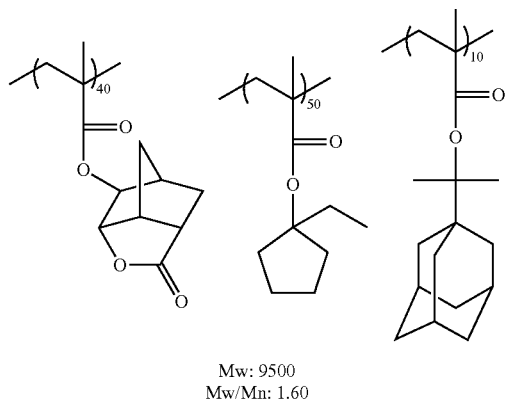

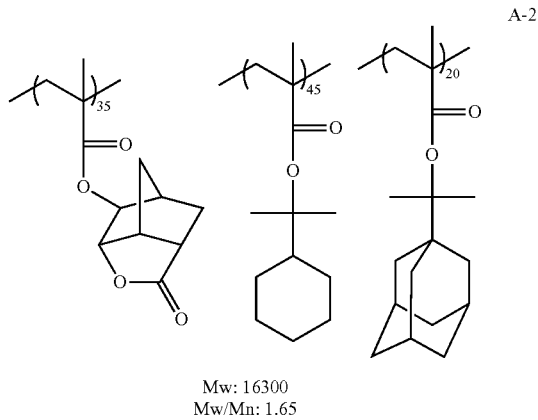

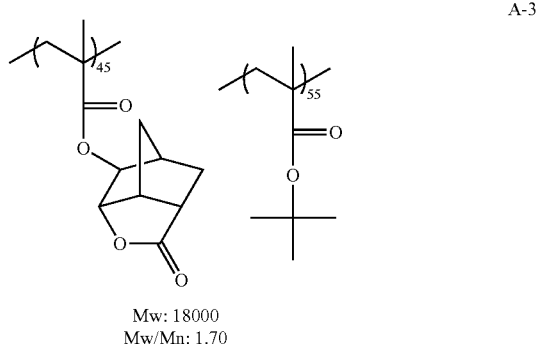

<Acid Generator>

The following compounds were used as the acid generator.

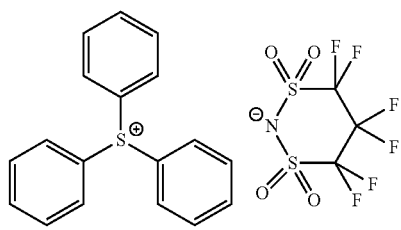

PAG-2

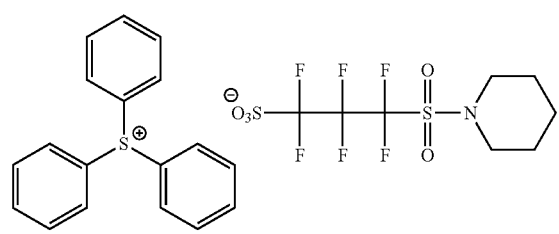

PAG-3

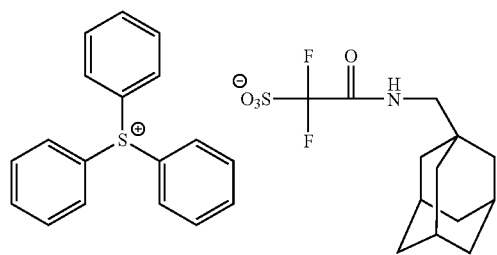

<Basic Compound>

The following compounds were used as the basic compound.

C-1

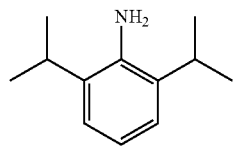

C-2

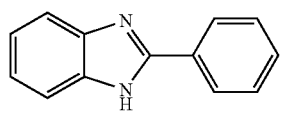

C-3

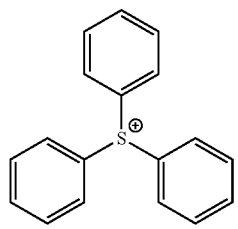

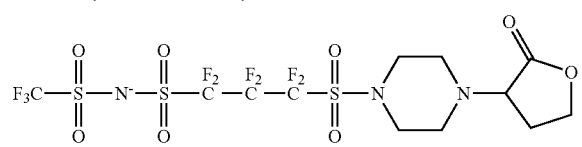

<Hydrophobic Resin>

Hereinafter, Resins D-1 to D-3 were synthesized in the same manner as in Resin A. The composition ratio of the repeating unit (molar ratio, corresponding to each repeating unit sequentially from the left), mass average molecular weight (Mw) and polydispersity (Mw/Mn) in Resins D-1 to D-3 will be shown below.

D-1

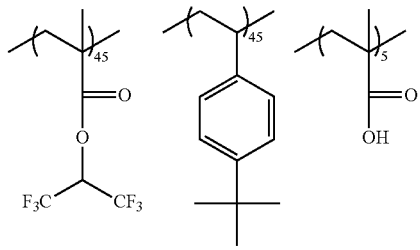

Mw: 7000
Mw/Mn: 1.66

D-2

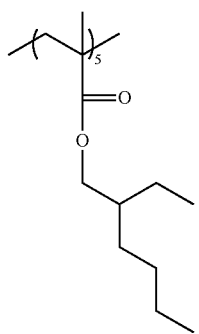

Mw: 12000
Mw/Mn: 1.71

D-3

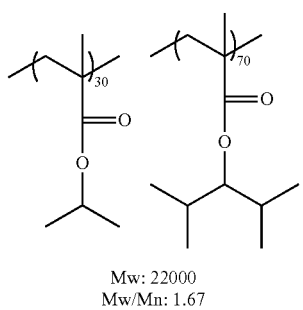

Mw: 22000
Mw/Mn: 1.67

<Surfactant>

The followings were used as the surfactant.

W-1: Megafac F176 (manufactured by DIC Corporation; fluorine-based)

W-2: Megafac R08 (manufactured by DIC Corporation; fluorine- and silicone-based)

<Solvent>

The followings were used as the solvent.

SL-1: Propylene glycol monomethyl ether acetate (PGMEA)

SL-2: Propylene glycol monomethyl ether (PGME)

<Preparation of Rinsing Liquid>

Immediately after distilled, 4-methyl-2-pentanol (MIBC) was charged into the container 2 described above and stored at room temperature (25° C.) for 30 days.

MIBC was taken out of container 2, filtered through a PTFE filter having a pore size 50 of nm, and was set as rinsing liquid 1.

<Lithography Evaluation>

The components noted in Table 2 below were dissolved in the solvent noted in the same table to have a solid content of 3.8% by mass, and each was filtered through a polyethylene filter having a pore size of 0.03 µm to prepare a chemical amplification resist composition. An organic antireflection film ARC29SR (manufactured by Nissan Chemical Industries, Ltd.) was applied on a silicon wafer and baked at 205° C. for 60 sec to form an antireflection film having a film thickness of 95 nm. The chemical amplification resist composition prepared as described above was applied thereon and baked at 100° C. over 60 sec to form a chemical amplification resist film (resist film 1) having a film thickness of 90 nm.

acetate in Example 8 as a developer for 30 sec, and then the developer was spin-dried at 2000 rpm for 20 sec to obtain a pattern (resist pattern substrate 2).

Example 11: Developing/Rinsing Process

Resist film 1 formed by chemical amplification resist composition 1-3 in Table 2 was subjected to pattern exposure by using an ArF excimer laser immersion scanner (manufactured by ASML Co., Ltd.; XT1700i, NA 1.20, Dipole (outer σ: 0.981/inner σ: 0.895), Y deflection) through a halftone mask. As the immersion liquid, ultrapure water was used. Thereafter, baking was performed at 105° C. for 60 sec. Subsequently, the resist film was developed by butyl acetate in Example 8 as a developer for 30 sec, and then

TABLE 2

| Chemical Amplification Resist Composition | Resin (A) | (g) | Acid Generator (B) | (g) | Basic Compound | (g) | Resin (D) | (g) | Solvent | Mass ratio | Surfactant | (g) |
|---|---|---|---|---|---|---|---|---|---|---|---|---|
| I-1 | A-1 | 10 | PAG-1 | 0.80 | C-1 | 0.14 | D-1 | 0.6 | SL-1/SL-2 | 80/20 | W-1 | 0.003 |
| I-2 | A-2 | 10 | PAG-2 | 0.90 | C-2 | 0.14 | D-2 | 2.0 | SL-1 | 100 | W-2 | 0.003 |
| I-3 | A-3 | 10 | PAG-3 | 0.45 | C-3 | 0.45 | D-3 | 4.0 | SL-1/SL-2 | 80/20 | None | — |

Example 9: Developing/Rinsing Process

Resist film 1 formed by chemical amplification resist composition I-1 in Table 2 was subjected to pattern exposure by using an ArF excimer laser immersion scanner (manufactured by ASML Co., Ltd.; XT1700i, NA 1.20, Dipole (outer σ: 0.981/inner σ: 0.895), Y deflection) through a halftone mask. As the immersion liquid, ultrapure water was used. Thereafter, heating was performed at 105° C. for 60 sec. Subsequently, the resist film was developed by butyl acetate in Example 4 as a developer for 30 sec, and then rinsed by rinsing liquid 1 described above for 20 sec to obtain a pattern (resist pattern substrate 1).

Example 10: Rinse-Less Process

Resist film 1 formed by chemical amplification resist composition I-2 in Table 2 was subjected to pattern exposure by using an ArF excimer laser immersion scanner (manufactured by ASML Co., Ltd.; XT1700i, NA 1.20, Dipole (outer σ: 0.981/inner σ: 0.895), Y deflection) through a halftone mask. As the immersion liquid, ultrapure water was used. Thereafter, baking was performed at 105° C. for 60 sec. Subsequently, the resist film was developed by butyl rinsed by butyl acetate in Example 8 as a rinsing liquid for 20 sec to obtain a pattern (resist pattern substrate 3).

When resist pattern substrates 1 to 3 were observed by a critical dimension scanning electron microscope (manufactured by Hitachi, Ltd., CG4100), it was found that a 45 nm pattern (line size:space size=1:1) was satisfactorily formed on each of the substrates without pattern collapse.

TABLE 3

| Example | Composition (I) | Developer | Rinsing liquid |
|---|---|---|---|
| Example 9 | I-1 | Butyl acetate of Example 4 | Rinsing liquid 1 (MIBC) |
| Example 10 | I-2 | Butyl acetate of Example 8 | — |
| Example 11 | I-3 | Butyl acetate of Example 8 | Butyl acetate of Example 8 |

<Lithography Evaluation 2>

A container which contains a resist composition having the same composition as the resist composition I-1 in Table 2 was connected to a resist line of a coating and developing apparatus (manufactured by SOKUDO Co., Ltd., RF$^{3S}$).

Butyl acetate in Example 5, as a developer, which was put in a 18 L canister can, was connected to the coating and developing apparatus.

Rinsing liquid 1 put in a 18 L canister can was connected to the coating and developing apparatus.

An optimizer ST-L manufactured by Entegris, Inc. (product model number: AWATMLKM1) was mounted in the coating and developing apparatus as a POU filter for each of the developer and the rinsing liquid, and deaeration of the filter was carried out by a conventional method in the coating and developing apparatus. Subsequently, 30 L of processing liquid (each of the developer and the rinsing liquid) passed through the POU filter.

An organic antireflection film ARC29SR (manufactured by Nissan Chemical Industries, Ltd.) was applied using the coating and developing apparatus on a silicon wafer and baked at 205° C. for 60 sec to form an antireflection film having a film thickness of 95 nm. The resist composition was applied thereon, and baked at 100° C. over 60 sec to form a chemical amplification resist film (resist film 2) having a film thickness of 90 nm.

Example 12: Developing/Rinsing Process

Resist film 2 was subjected to pattern exposure by using an ArF excimer laser immersion scanner (manufactured by ASML Co., Ltd.; XT1700i, NA 1.20, Dipole (outer σ: 0.981/inner σ: 0.895), Y deflection) through a halftone mask. As the immersion liquid, ultrapure water was used. Thereafter, baking was performed at 105° C. for 60 sec. Subsequently, the resist film was developed using the above described developer (that is, butyl acetate of Example 5) by the coating and developing apparatus for 30 sec, and then rinsed by rinsing liquid 1 for 20 sec to obtain a pattern (resist pattern substrate 4).

Example 13: Rinse-Less Process

Resist film 2 was subjected to pattern exposure by using an ArF excimer laser immersion scanner (manufactured by ASML Co., Ltd.; XT1700i, NA 1.20, Dipole (outer σ: 0.981/inner σ: 0.895), Y deflection) through a halftone mask. As the immersion liquid, ultrapure water was used. Thereafter, baking was performed at 105° C. for 60 sec. Subsequently, the resist film was developed using the above described developer (that is, butyl acetate of Example 5) by the coating and developing apparatus for 30 sec, and then the developer was spin-dried at 2000 rpm for 20 sec to obtain a pattern (resist pattern substrate 5).

When resist pattern substrates 4 and 5 were observed by a length measuring scanning electron microscope (manufactured by Hitachi, Ltd., CG4100), it was found that a 45 nm pattern (line size:space size=1:1) was satisfactorily formed on each of the substrates without pattern collapse.

Example 14

When the lithography evaluation as described above was performed by properly using the above described resins exemplified as "resins which may be properly used, in particular, at EUV exposure or electron beam exposure" through exposure of EUV light or electron beam instead of the ArF excimer laser immersion exposure, the pattern formation was satisfactorily performed.

Example 15

Eight exemplary compositions were prepared in the same manner as in chemical amplification resist composition 1-3 except that the above described betaine compounds C1-1 to C1-8 were used instead of basic compound C-3. Then, when the evaluation was performed in the same manner as in Example 11, the pattern formation was carried out.

Example 16

The evaluation was performed in the same manner as in Example 9 except that tri-n-octylamine was added to butyl acetate just before butyl acetate was connected to the coating and developing apparatus, and then the pattern formation was carried out.

According to the present invention, in a negative pattern forming method for forming a fine pattern (for example, 30 nm node or less) particularly using an organic developer, there may be provided an organic processing liquid for patterning the chemical amplification resist film which may reduce occurrence of particles, a container for the organic processing liquid for patterning the chemical amplification resist film, and a pattern forming method, a method of manufacturing an electronic device, and the electronic device using the same.

Although the present invention has been described with reference to detailed and specific aspects, it is obvious to those skilled in the art that various changes or modifications can be made without departing from the spirit and scope of the present invention.

The present application is based on Japanese Patent Applications (Patent Application Nos. 2012-240752 and 2013-031277) filed on Oct. 31, 2012 and Feb. 20, 2013, the content of which is incorporated herein by reference.

What is claimed is:

1. A pattern forming method comprising:
   (A) forming a film from a chemical amplification resist composition by applying the chemical amplification resist composition on a substrate;
   (B) pattern exposing the film; and
   (C) developing the exposed film using an organic developer, the organic developer being butyl acetate,
   wherein the organic developer contains 1 ppm or less of alkylolefin having a carbon number of 22 or less, and 5 ppm or less of metal element concentration of each of Na, K, Ca, Fe, Cu, Mg, Mn, Li, Al, Cr, Ni and Zn;
   the organic developer is stored in a container before developing, the container having an inner wall contacting with the organic developer, the inner wall being made from a perfluoro resin; and
   the organic developer is filtered through a polytetrafluoroethylene filter before the developing step (C).

2. The pattern forming method according to claim 1, further comprising:
   performing a washing by using an organic rinsing liquid after the developing of the exposed film using the organic developer,
   wherein the organic rinsing liquid is the organic processing liquid containing 1 ppm or less of alkylolefin having, a carbon number of 22 or less, and 5 ppm or less of a metal element concentration of each of Na, K, Ca, Fe, Cu, Mg, Mn, Li, Al, Cr, Ni, and Zn.

3. The pattern forming method according to claim 2,
   wherein the organic developer and the organic rinsing liquid is an organic processing liquid for patterning a chemical amplification resist film, containing 1 ppm or less of alkylolefin having a carbon number of 22 or less, and 5 ppm or less of a metal element concentration of each of Na, K, Ca, Fe, Cu, Mg, Mn, Li, Al, Cr, Ni, and Zn, and
   the organic rinsing liquid is 4-methyl-2-pentanol or butyl acetate.

4. The pattern forming method according to claim 2, wherein the organic rinsing liquid is stored in a second container before performing a washing, the second container having an inner wall contacting with the organic rinsing liquid, the inner wall being made from a perfluoro resin; and the rinsing liquid is filtered through a polytetrafluoroethylene tetrafluoroethylene filter before performing the washing.

5. The pattern forming method according to claim 2, wherein the organic rinsing liquid contains at least one selected from the group consisting of a ketone-based solvent, an ester-based solvent, an alcohol-based solvent, an amide-based solvent and an ether based solvent.

6. The pattern forming method according to claim 2, wherein the organic rinsing liquid is 4-methyl-2-pentanol or butyl acetate.

7. The pattern forming method according to claim 1,
wherein the developing of the exposed film using the organic developer is performed by using a developing apparatus mounted with a filter for a processing liquid, and the organic developer passes through the filter for the processing liquid.

8. A method of manufacturing an electronic device, the method comprising the pattern forming method according to claim 1.

9. An electronic device manufactured by the method according to claim 8.

10. The pattern forming method according to claim 1,
wherein the polytetrafluoroethylene filter has a pore size of 0.1 µm or less.

11. The pattern forming method according to claim 1,
wherein the polytetrafluoroethylene filter has a pore size of 0.05 µm or less.

12. The pattern forming method according to claim 1,
wherein the organic developer is stored in a container for one or more days before developing.

\* \* \* \* \*